(12) United States Patent
Baek

(10) Patent No.: US 11,706,919 B2
(45) Date of Patent: Jul. 18, 2023

(54) VERTICAL MEMORY DEVICES

(71) Applicant: SAMSUNG ELECTRONICS CO., LTD., Suwon-si (KR)

(72) Inventor: Seokcheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 17/038,945

(22) Filed: Sep. 30, 2020

(65) Prior Publication Data

US 2021/0265390 A1 Aug. 26, 2021

(30) Foreign Application Priority Data

Feb. 21, 2020 (KR) .................. 10-2020-0021414

(51) Int. Cl.
*H10B 43/27* (2023.01)
*H01L 23/522* (2006.01)
*H10B 41/10* (2023.01)
*H10B 41/27* (2023.01)
*H10B 43/10* (2023.01)

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02)

(58) Field of Classification Search
CPC ........... H01L 23/5226; H01L 27/11519; H01L 27/11524; H01L 27/11529; H01L 27/11556; H01L 27/11565; H01L 27/1157; H01L 27/11573; H01L 27/11575; H01L 27/11582; H01L 29/66833; H01L 29/792; G11C 16/0483; H10B 41/10; H10B 41/20; H10B 41/23; H10B 41/27; H10B 41/35; H10B 41/41
See application file for complete search history.

(56) References Cited

U.S. PATENT DOCUMENTS

| | | | |
|---|---|---|---|
| 8,811,082 | B2 | 8/2014 | Kwon et al. |
| 9,165,938 | B1 | 10/2015 | Kim et al. |
| 9,865,540 | B2 | 1/2018 | Kim et al. |
| 10,062,765 | B2 | 8/2018 | Oh et al. |

(Continued)

FOREIGN PATENT DOCUMENTS

KR 10-2017-0046892 5/2017

*Primary Examiner* — Calvin Y Choi
(74) *Attorney, Agent, or Firm* — F. Chau & Associates, LLC

(57) ABSTRACT

A vertical memory device includes first horizontal gate electrodes disposed on a substrate and spaced apart from each other in a first direction that is substantially perpendicular to an upper surface of the substrate. Each of the first horizontal gate electrodes extends in a second direction that is substantially parallel to the upper surface of the substrate. A vertical channel extends through the first horizontal gate electrodes in the first direction. A charge storage structure is disposed between the vertical channel and each of the first horizontal gate electrodes. A first vertical gate electrode extends through the first horizontal gate electrodes in the first direction. The first vertical gate electrode is electrically insulated from the first horizontal gate electrodes. A first horizontal channel is disposed at a portion of each of the first horizontal gate electrodes adjacent to the first vertical gate electrode.

15 Claims, 65 Drawing Sheets

(56) References Cited

U.S. PATENT DOCUMENTS

| | | | |
|---|---|---|---|
| 10,269,620 B2* | 4/2019 | Yu | H01L 27/11556 |
| 2014/0103417 A1* | 4/2014 | Lee | H01L 27/11568 |
| | | | 257/329 |
| 2016/0141299 A1* | 5/2016 | Hong | H01L 27/11524 |
| | | | 438/157 |
| 2016/0268304 A1 | 9/2016 | Ikeda et al. | |
| 2018/0308860 A1 | 10/2018 | Lee et al. | |
| 2019/0019558 A1 | 1/2019 | Lee | |
| 2019/0027489 A1* | 1/2019 | Orimoto | H01L 21/31144 |
| 2021/0050372 A1* | 2/2021 | Sharangpani | H01L 27/11597 |

* cited by examiner

FIG. 8
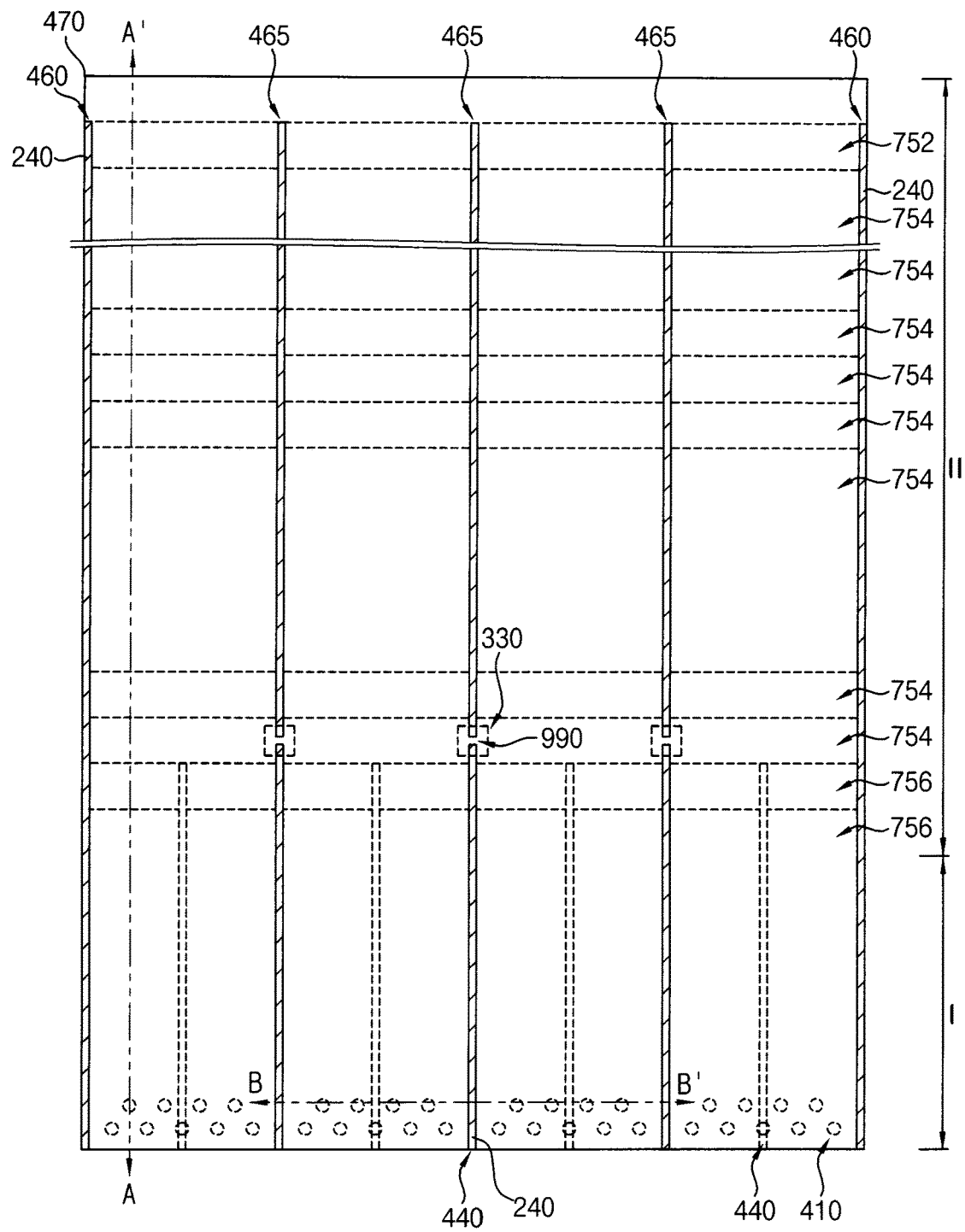
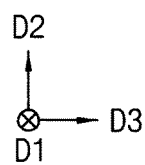

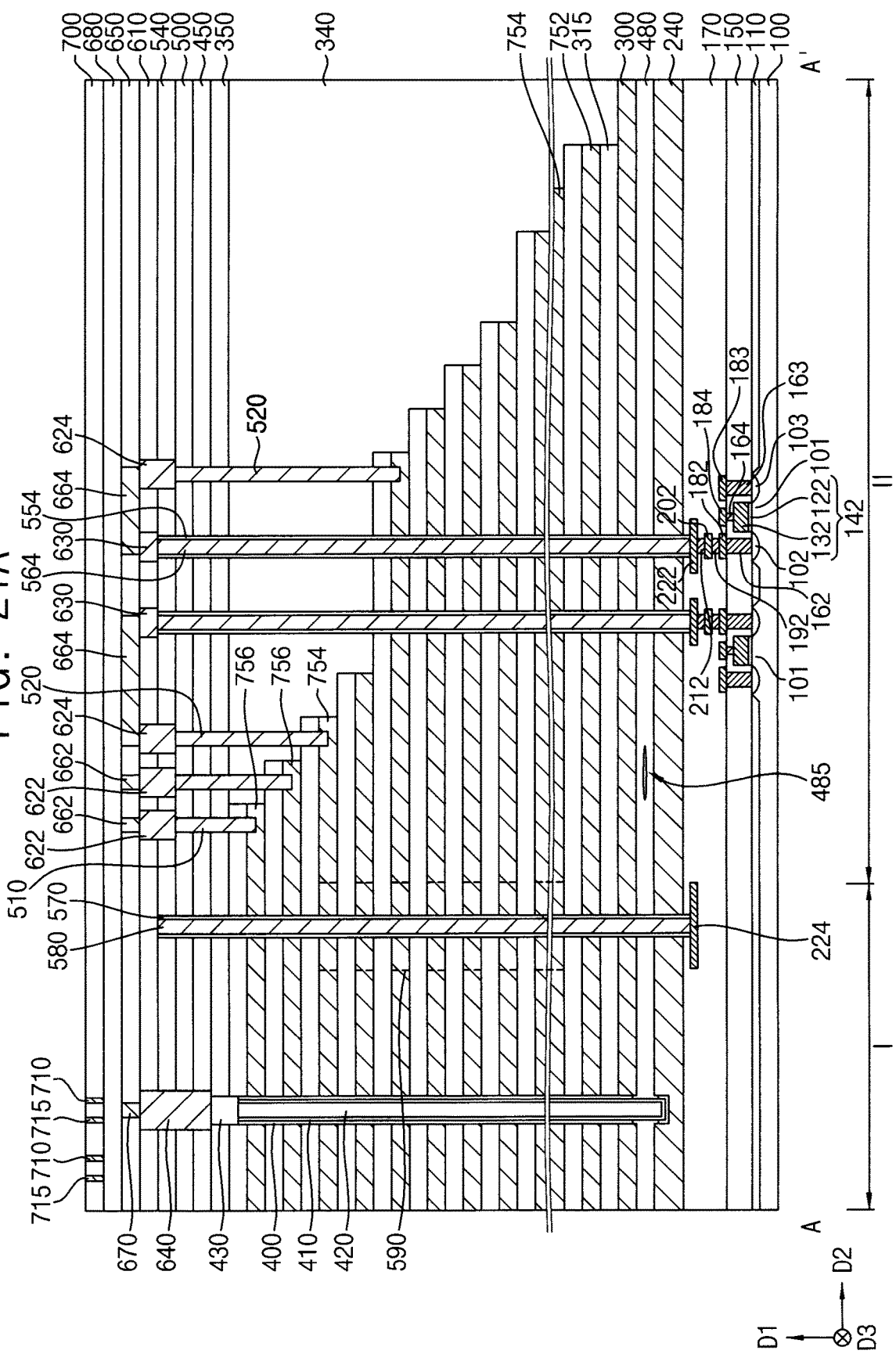

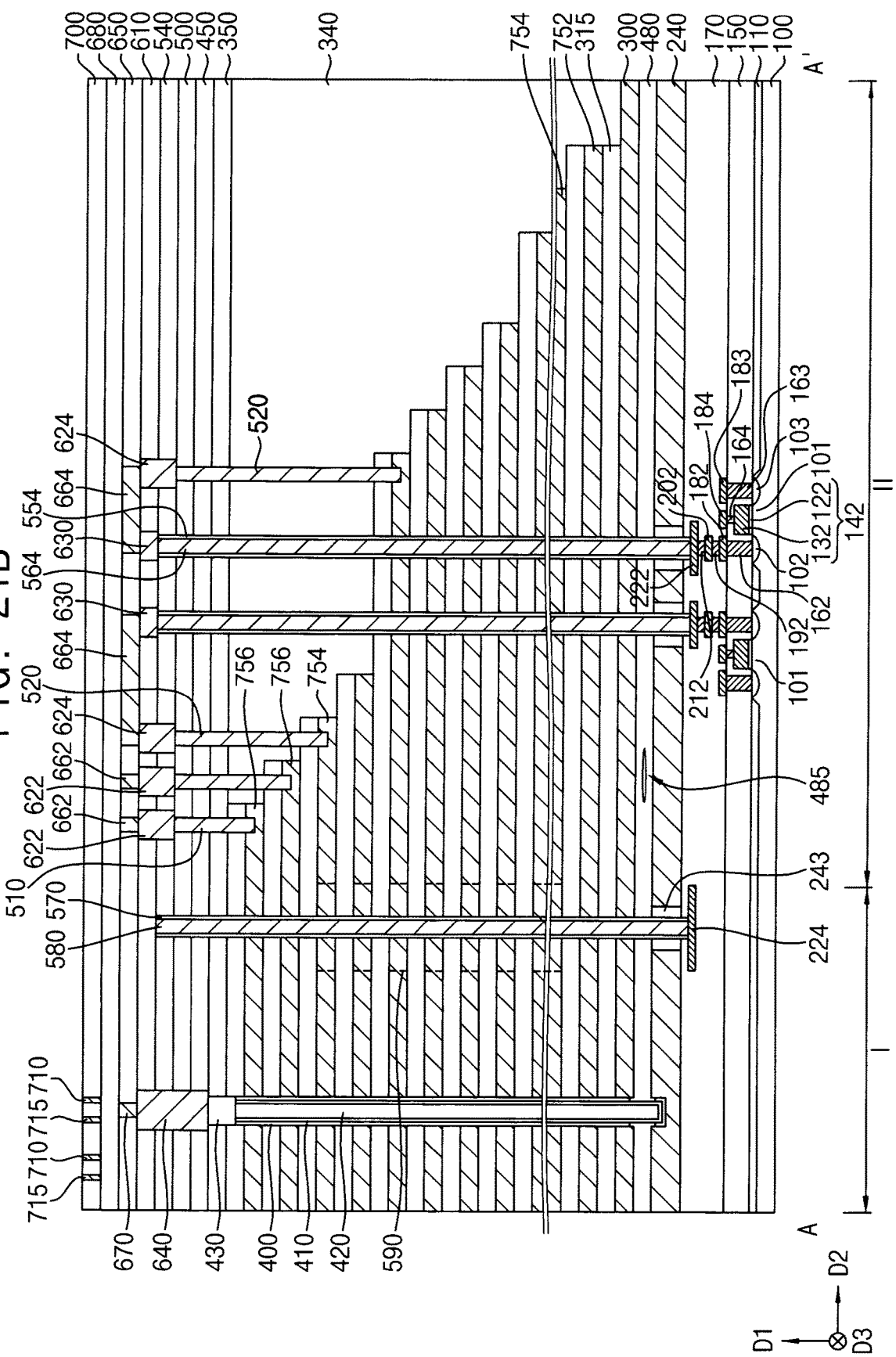

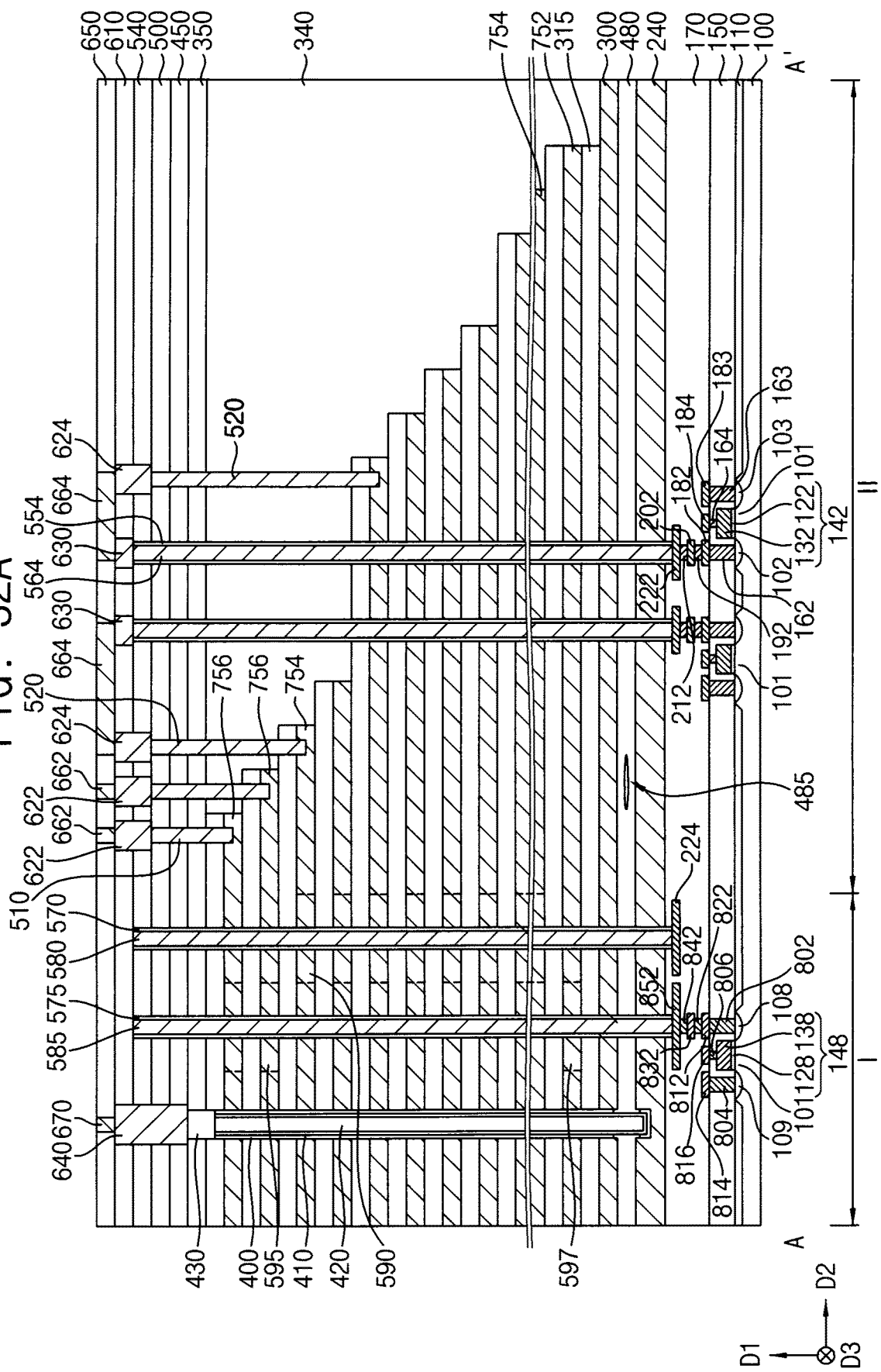

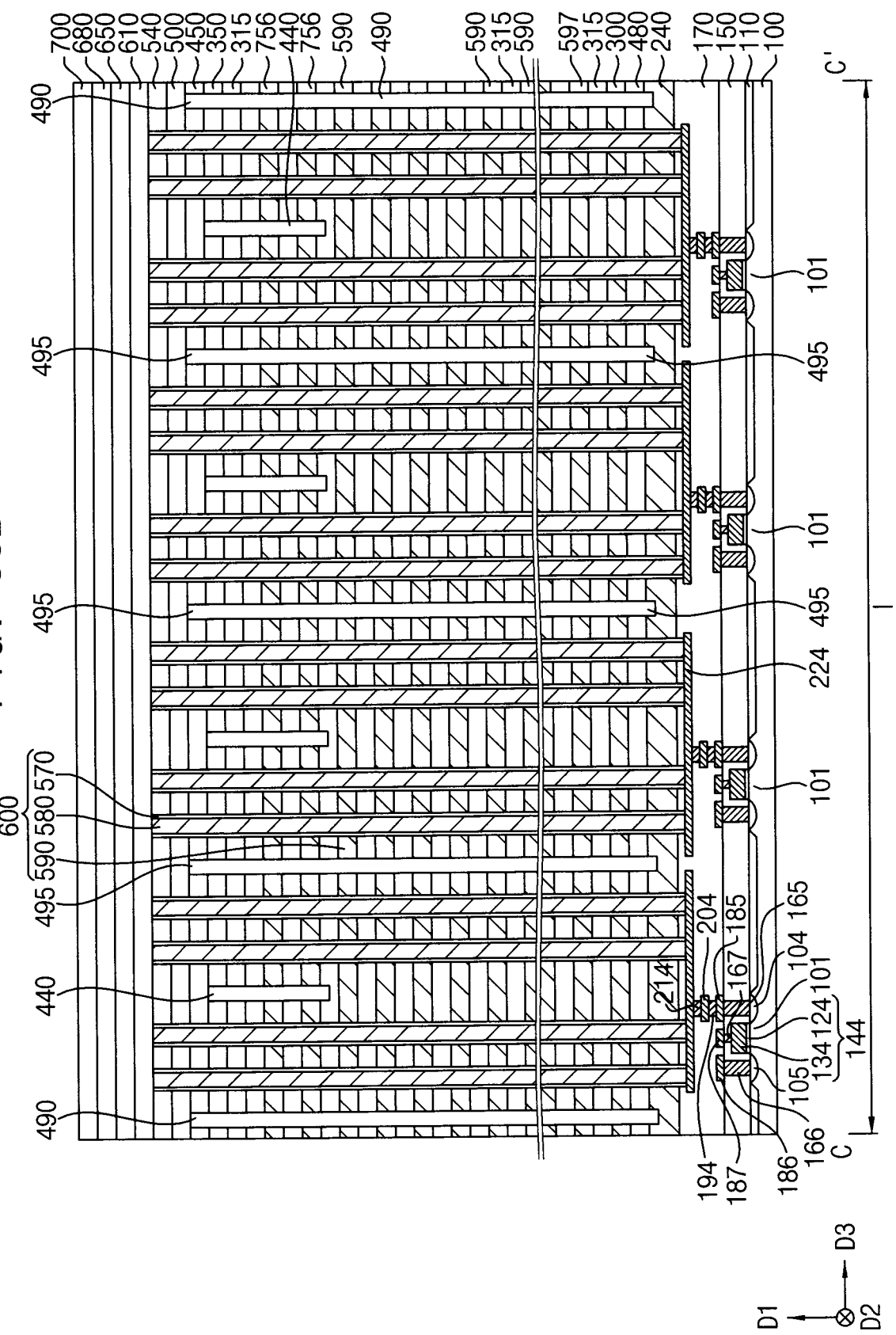

FIG. 34
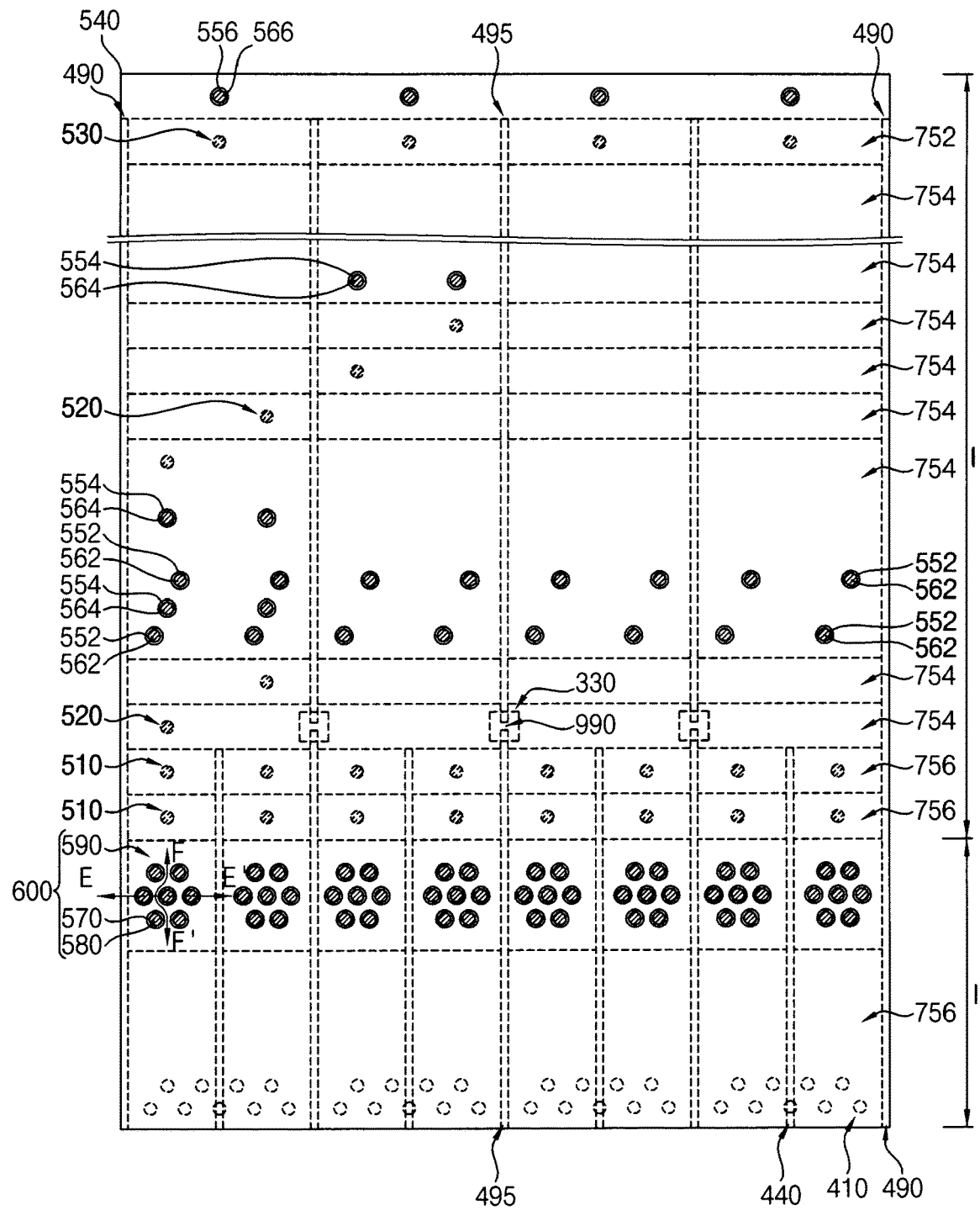
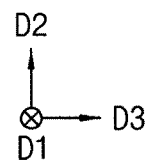

FIG. 51
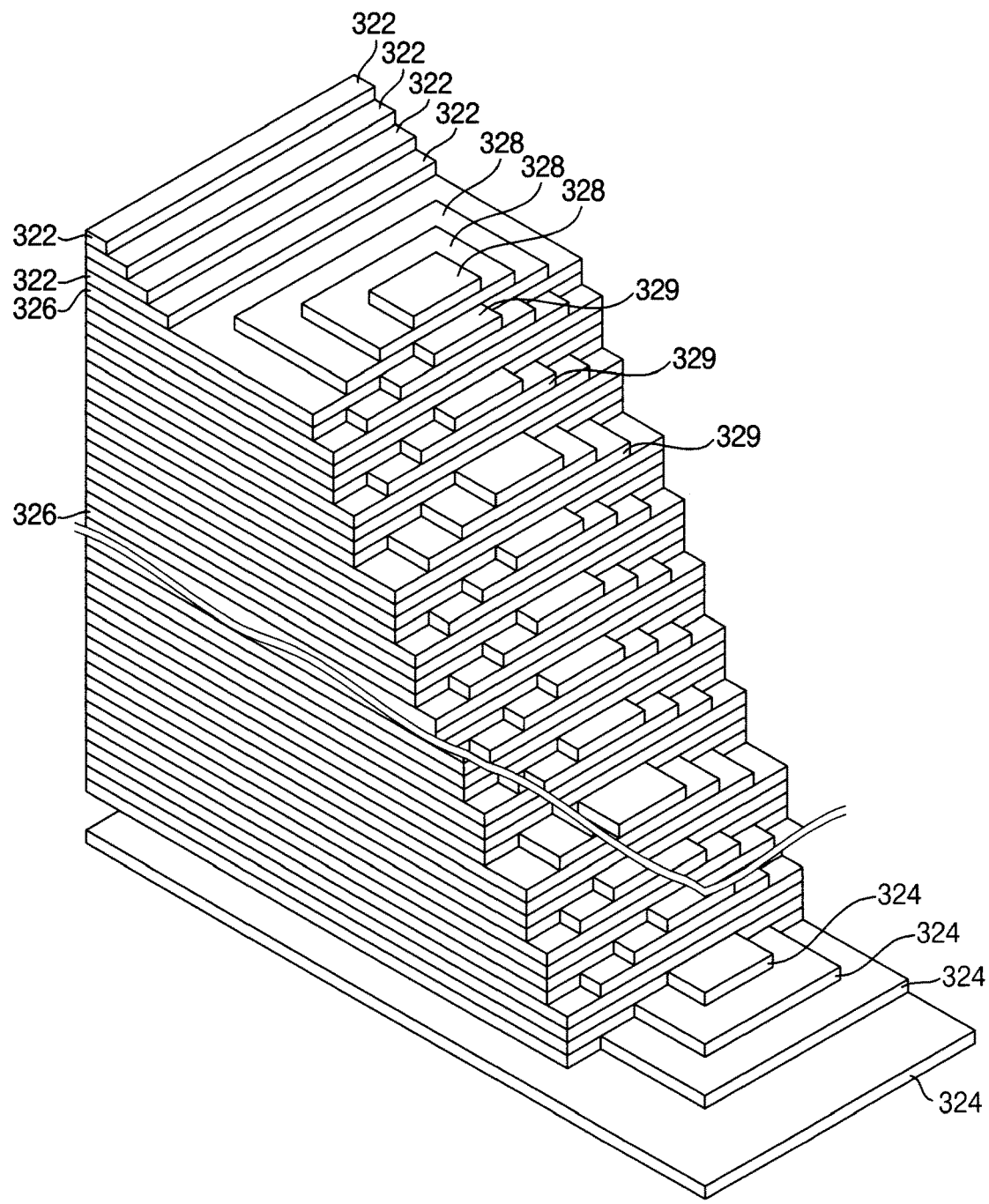
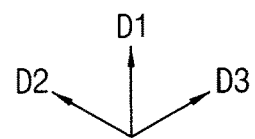

VERTICAL MEMORY DEVICES

CROSS-REFERENCE TO RELATED APPLICATION

This application claims priority under 35 U.S.C. § 119 to Korean Patent Application No. 10-2020-0021414, filed on Feb. 21, 2020 in the Korean Intellectual Property Office, the disclosure of which is incorporated by reference in its entirety herein.

1. TECHNICAL FIELD

The present inventive concepts relate to a vertical memory device, and more particularly, a vertical NAND flash memory device.

2. DISCUSSION OF RELATED ART

In a VNAND flash memory device having a cell-over-periphery (COP) structure, an upper circuit pattern, such as upper contact plugs or upper wirings, are formed on pads of the word lines to apply electrical signal to the pads of word lines on a pad region of a substrate. The word lines may be connected to the upper circuit pattern through vias extending through the word lines. An electrical signal may be transferred from pass transistors on the substrate through a lower circuit pattern to the through vias. As the number of stacks of the word lines increases, the number of pass transistors, lower and upper circuit patterns, and through vias for applying electrical signal to the word lines may also increase. Therefore, the area of the substrate may increase which may result in a deterioration of the integration degree of the VNAND flash memory device.

SUMMARY

Exemplary embodiments of the present inventive concepts provide a vertical memory device having improved electrical characteristics.

According to an exemplary embodiment of the present inventive concepts, a vertical memory device includes first horizontal gate electrodes disposed on a substrate and spaced apart from each other in a first direction that is substantially perpendicular to an upper surface of the substrate. Each of the first horizontal gate electrodes extends in a second direction that is substantially parallel to the upper surface of the substrate. A vertical channel extends through the first horizontal gate electrodes in the first direction. A charge storage structure is disposed between the vertical channel and each of the first horizontal gate electrodes. A first vertical gate electrode extends through the first horizontal gate electrodes in the first direction. The first vertical gate electrode is electrically insulated from the first horizontal gate electrodes. A first horizontal channel is disposed at a portion of each of the first horizontal gate electrodes adjacent to the first vertical gate electrode.

According to an exemplary embodiment of the present inventive concepts, a vertical memory device includes horizontal gate electrodes disposed on a substrate and spaced apart from each other in a first direction that is substantially perpendicular to an upper surface of the substrate. Each of the horizontal gate electrodes extends in a second direction that is substantially parallel to the upper surface of the substrate. Each of the horizontal gate electrodes includes a first portion containing a metal and a second portion containing polysilicon doped with impurities. A vertical channel extends through the first portions of the respective horizontal gate electrodes in the first direction. A charge storage structure is disposed between the vertical channel and each of the horizontal gate electrodes. A vertical gate electrode extends through the second portions of the respective horizontal gate electrodes in the first direction. A gate insulation pattern is disposed on a sidewall of the vertical gate electrode. A horizontal channel is disposed at the second portion of each of the horizontal gate electrodes.

According to an exemplary embodiment of the present inventive concepts, horizontal gate electrodes are disposed on a substrate and are spaced apart from each other in a first direction that is substantially perpendicular to an upper surface of the substrate. Each of the horizontal gate electrodes extends in a second direction that is substantially parallel to the upper surface of the substrate. A vertical channel extends through the horizontal gate electrodes in the first direction. A tunnel insulation pattern, a floating gate and a gate insulation structure are sequentially stacked between the vertical channel and each of the horizontal gate electrodes. A vertical gate electrode extends through the horizontal gate electrodes in the first direction. The vertical gate electrode is electrically insulated from the horizontal gate electrodes. A horizontal channel is disposed at a portion of each of the horizontal gate electrodes adjacent to the vertical gate electrode.

According to an exemplary embodiment of the present inventive concepts, a vertical memory device includes word lines disposed on a substrate and spaced apart from each other in a first direction that is substantially perpendicular to an upper surface of the substrate. Each of the word lines extends in a second direction that is substantially parallel to the upper surface of the substrate. A selection line is disposed on the word lines and extends in the second direction. A vertical channel extends through the selection line and the word lines in the first direction. A charge storage structure is disposed on a sidewall of the vertical channel. A first switching transistor is configured to control electrical signals applied to the word lines. The first switching transistor includes a first vertical gate electrode extending through the word lines in the first direction. The first vertical gate electrode is electrically insulated from the word lines. A first horizontal channel is disposed at a portion of each of the word lines adjacent to the first vertical gate electrode. A second switching transistor is configured to control electrical signals applied to the selection line. The second switching transistor includes a second vertical gate electrode extending through the selection line in the first direction. The second vertical gate electrode is spaced apart from the first vertical gate electrode in the second direction and is electrically insulated from the selection line. A second horizontal channel is disposed at a portion of the selection line adjacent to the second vertical gate electrode.

According to an exemplary embodiment of the present inventive concepts, a vertical memory device includes vertical channels disposed on a substrate. Each of the vertical channels extends in a first direction that is substantially perpendicular to an upper surface of the substrate. Charge storage structures are disposed on sidewalls of the vertical channels, respectively. Word lines are disposed on the substrate and are spaced apart from each other in the first direction. Each of the word lines extends in a second direction that is substantially parallel to the upper surface of the substrate to surround the charge storage structures. First switching transistors are configured to control electrical signals applied to the word lines. Each of the first switching transistors includes a first vertical gate electrode extending through the word lines in the first direction. The first vertical gate electrode is electrically insulated from the word lines. A first horizontal channel is disposed at a portion of each of the word lines adjacent to the first vertical gate electrode. First pass transistors are electrically connected to the word lines, respectively, and are configured to apply electrical signal to the word lines. Second pass transistors are electrically connected to at least one of the first switching transistors. A plurality of the vertical channels, a plurality of the charge storage structures corresponding thereto, and a plurality of the word lines surrounding the plurality of the vertical channels define a memory block that is configured to perform an erase operation of the vertical memory device. The memory block is one of a plurality of memory blocks arranged in a third direction that is substantially parallel to the upper surface of the substrate and substantially perpendicular to the second direction. Word lines at the same level included in each of the plurality of memory blocks are shared to define a shared memory block including one word line at each level. One of the first pass transistors is electrically connected to the one word line at each level in the shared memory block. One of the second pass transistors is electrically connected to each of the plurality of memory block in the shared memory block.

According to an exemplary embodiment, a vertical memory device includes a substrate including a first region and a second region. First pass transistors are disposed on the second region of a substrate. Second and third pass transistors are disposed on the first region of the substrate. First, second and third lower circuit patterns are disposed on the substrate. The first to third lower circuit patterns are electrically connected to the first to third pass transistors, respectively. A common source plate (CSP) is disposed on the first to third lower circuit patterns. First, second and third horizontal gate electrodes are disposed on the CSP. The first to third horizontal gate electrodes are spaced apart from each other in a first direction that is substantially perpendicular to an upper surface of the substrate. Each of the first to third horizontal gate electrodes extends in a second direction that is substantially parallel to the upper surface of the substrate. Vertical channels each extend in the first direction through the first to third horizontal gate electrodes disposed on the first region of the substrate. Charge storage structures are disposed on sidewalls of the vertical channels, respectively. First switching transistors are disposed on the first region of the substrate. The first switching transistors are configured to control electrical signals applied to the second horizontal gate electrodes. Each of the first switching transistors includes a first vertical gate electrode extending through the first to third horizontal gate electrodes in the first direction. The first vertical gate electrode is electrically insulated from the first to third horizontal gate electrodes. A first horizontal channel is disposed at a portion of each of the second horizontal gate electrodes adjacent to the first vertical gate electrode. Second switching transistors are disposed on the first region of the substrate. The second switching transistors are configured to control electrical signal applied to the third horizontal gate electrodes. Each of the second switching transistors includes a second vertical gate electrode extending through the first to third horizontal gate electrodes in the first direction. The second vertical gate electrode is spaced apart from the first vertical gate electrode in the second direction. The second vertical gate electrode is electrically insulated from the first to third horizontal gate electrodes. A second horizontal channel is disposed at a portion of each of the third horizontal gate electrodes adjacent to the second vertical gate electrode. First, second and third contact plugs are disposed on the first, second and third horizontal gate electrodes, respectively, on the second region of the substrate. First, second and third through vias extend through first to third horizontal gate electrodes and are electrically insulated therefrom. The first to third through vias are formed at positions corresponding to the first to third contact plugs, respectively, and are electrically connected thereto on the second region of the substrate. The first to third through vias are electrically connected to corresponding first pass transistors, respectively. The first switching transistors are electrically connected to corresponding second pass transistors, respectively. The second switching transistors are electrically connected to corresponding third pass transistors, respectively.

In the vertical memory device in accordance with exemplary embodiments of the present inventive concepts, the pad region in which the pads of the word lines are formed may be reduced, and the freedom of layout of the upper circuit patterns on the pad region may be increased.

BRIEF DESCRIPTION OF THE DRAWINGS

FIGS. 1 to 23 are plan views and cross-sectional views illustrating a method of manufacturing a vertical memory device in accordance with exemplary embodiments of the present inventive concepts.

FIGS. 31, 32A, 32B, 33A and 33B are a plan view and cross-sectional views illustrating a vertical memory device in accordance with exemplary embodiments of the present inventive concepts.

FIGS. 34, 35A, 35B, 36A, 36B and 37 are a plan view and cross-sectional views illustrating a vertical memory device in accordance with exemplary embodiments of the present inventive concepts.

FIG. 51 is a perspective view illustrating a mold in accordance with exemplary embodiments of the present inventive concepts.

DETAILED DESCRIPTION OF EXEMPLARY EMBODIMENTS

Vertical memory devices and methods of manufacturing the same in accordance with exemplary embodiments of the present inventive concepts will be described more fully hereinafter with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section.

Hereinafter in the detailed description of exemplary embodiments, a direction substantially perpendicular to an upper surface of a substrate may be defined as a first direction D1, and two directions substantially parallel to the upper surface of the substrate and crossing each other may be defined as second and third directions D2 and D3, respectively. In an exemplary embodiment, the second and third directions D2 and D3 may be substantially perpendicular to each other. However, exemplary embodiments of the present inventive concepts are not limited thereto.

FIGS. 1 to 23 are plan views and cross-sectional views illustrating a method of manufacturing a vertical memory device in accordance with exemplary embodiments of the present inventive concepts. FIGS. 1-2, 6, 8, 13, 15, 18 and 20 are the plan views, and FIGS. 3-5, 7, 9-12, 14, 16-17, 19 and 21-23 are the cross-sectional views.

Figure 6:
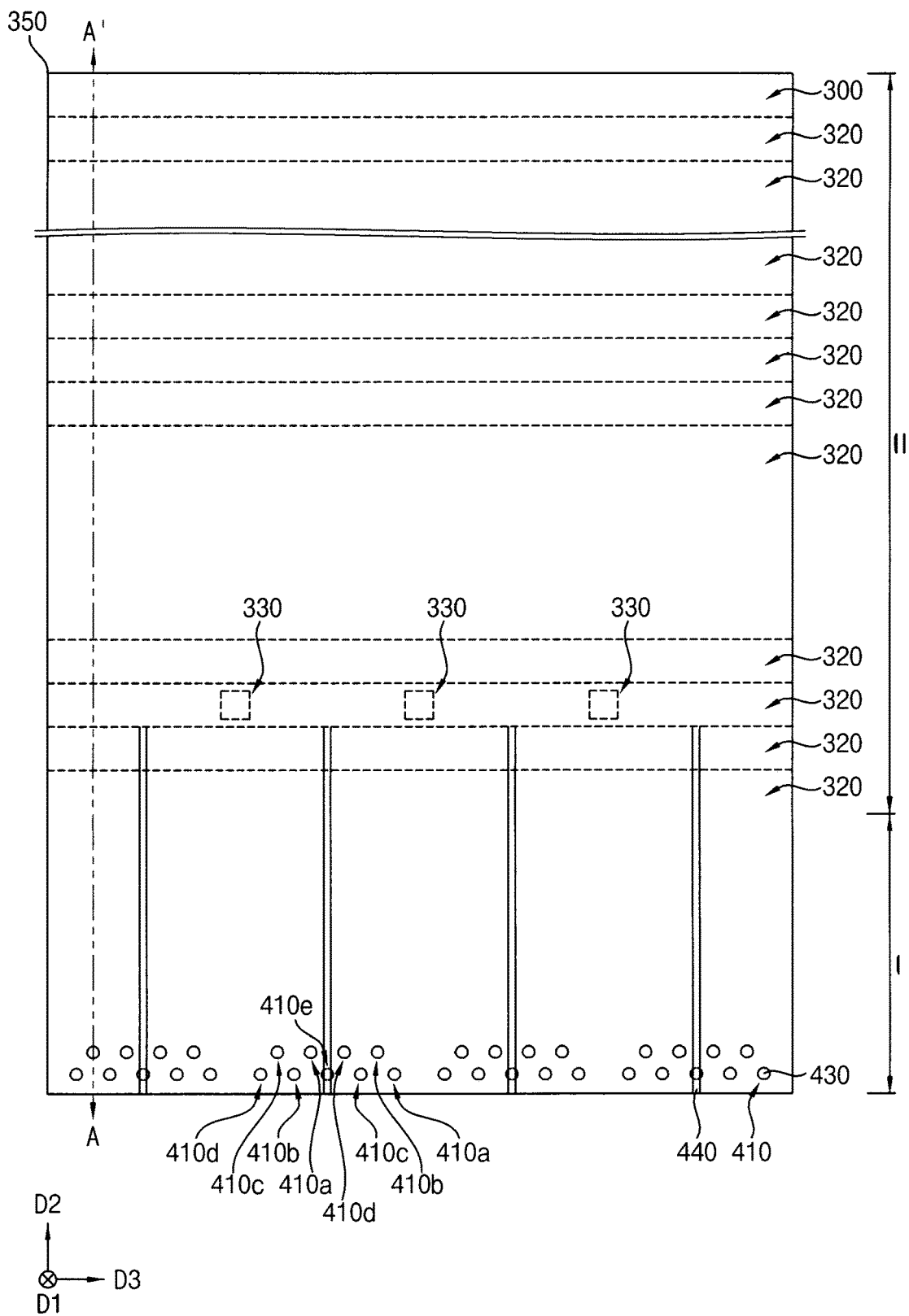
Figure 7A:
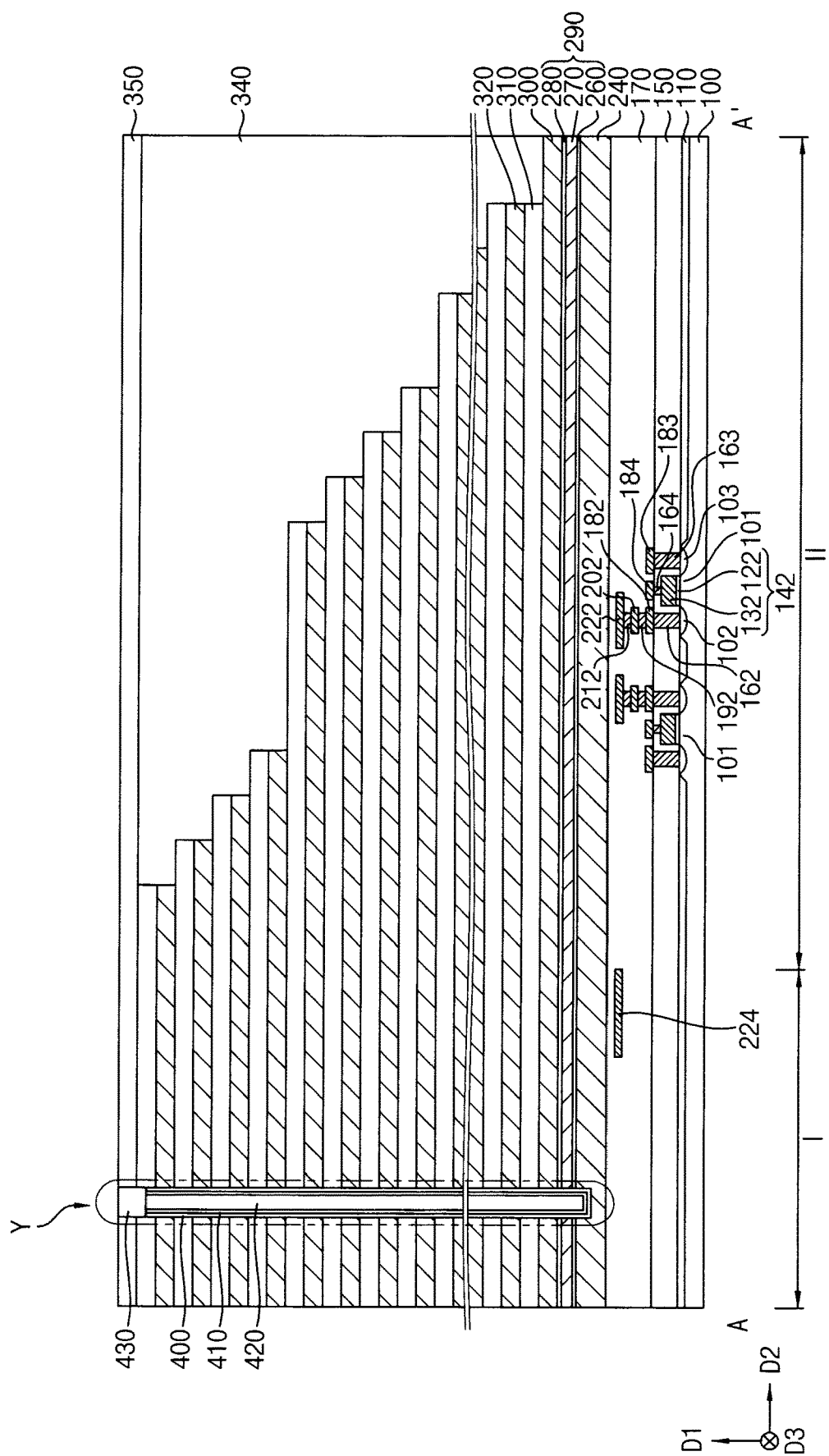
Figure 7B:
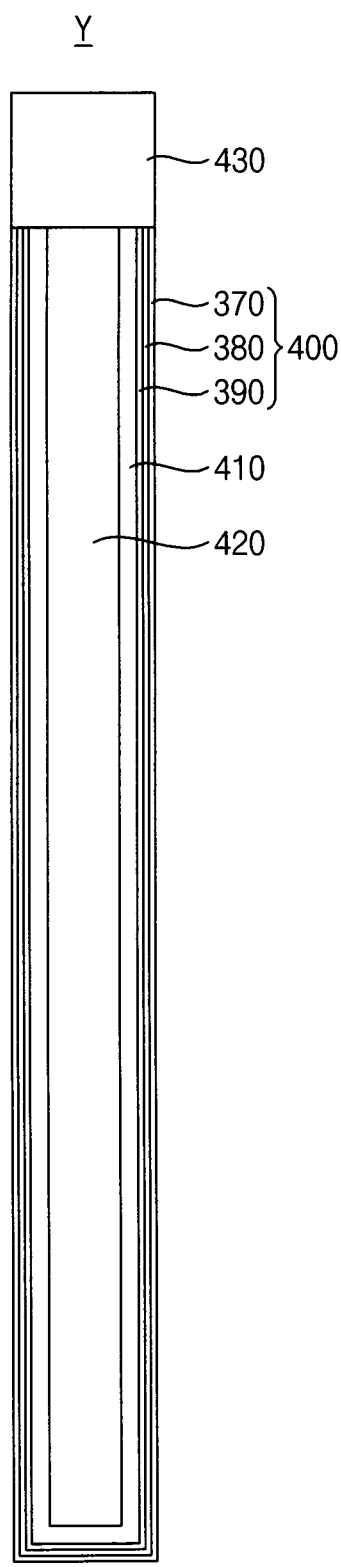
Figure 15:
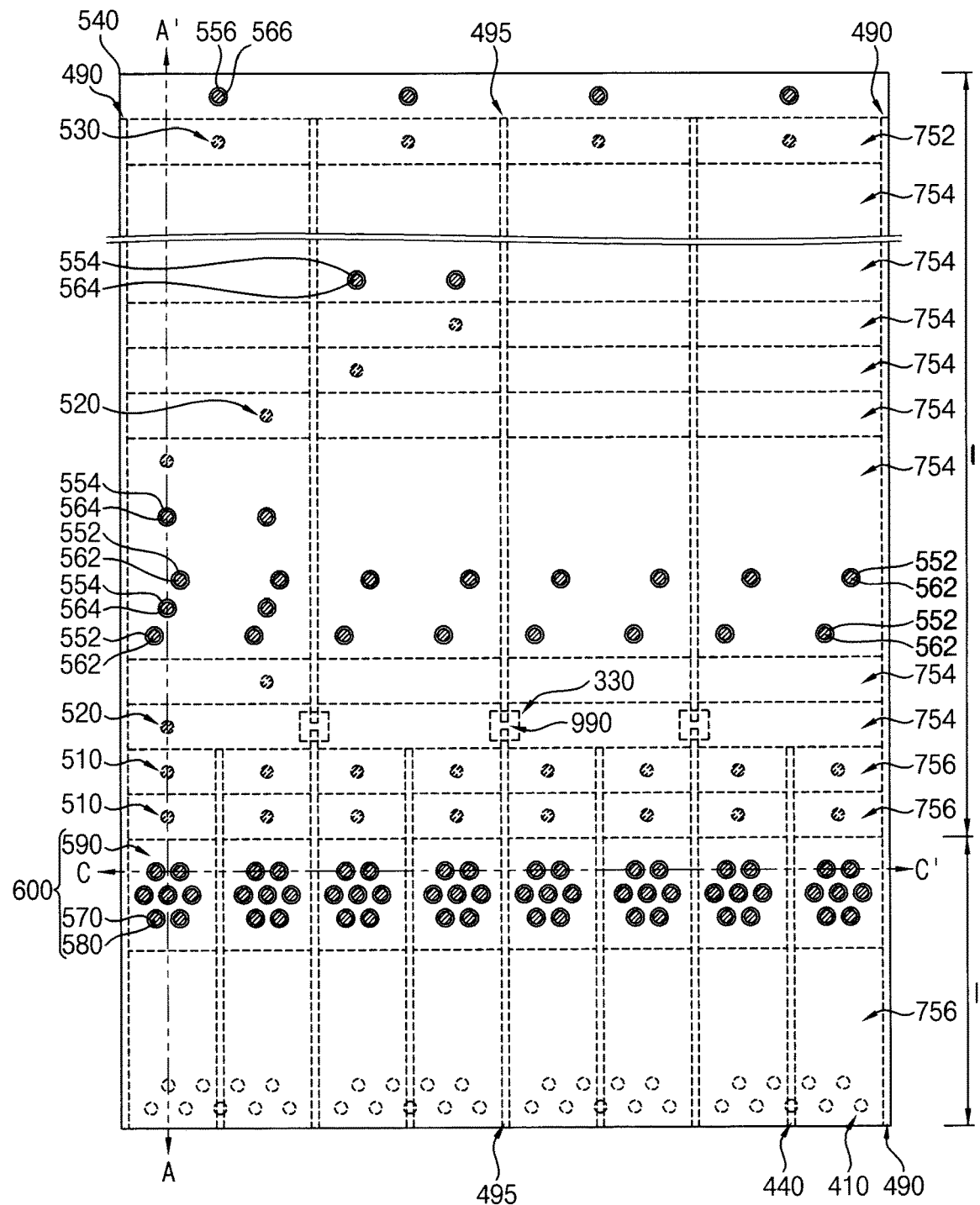
Figure 16A:
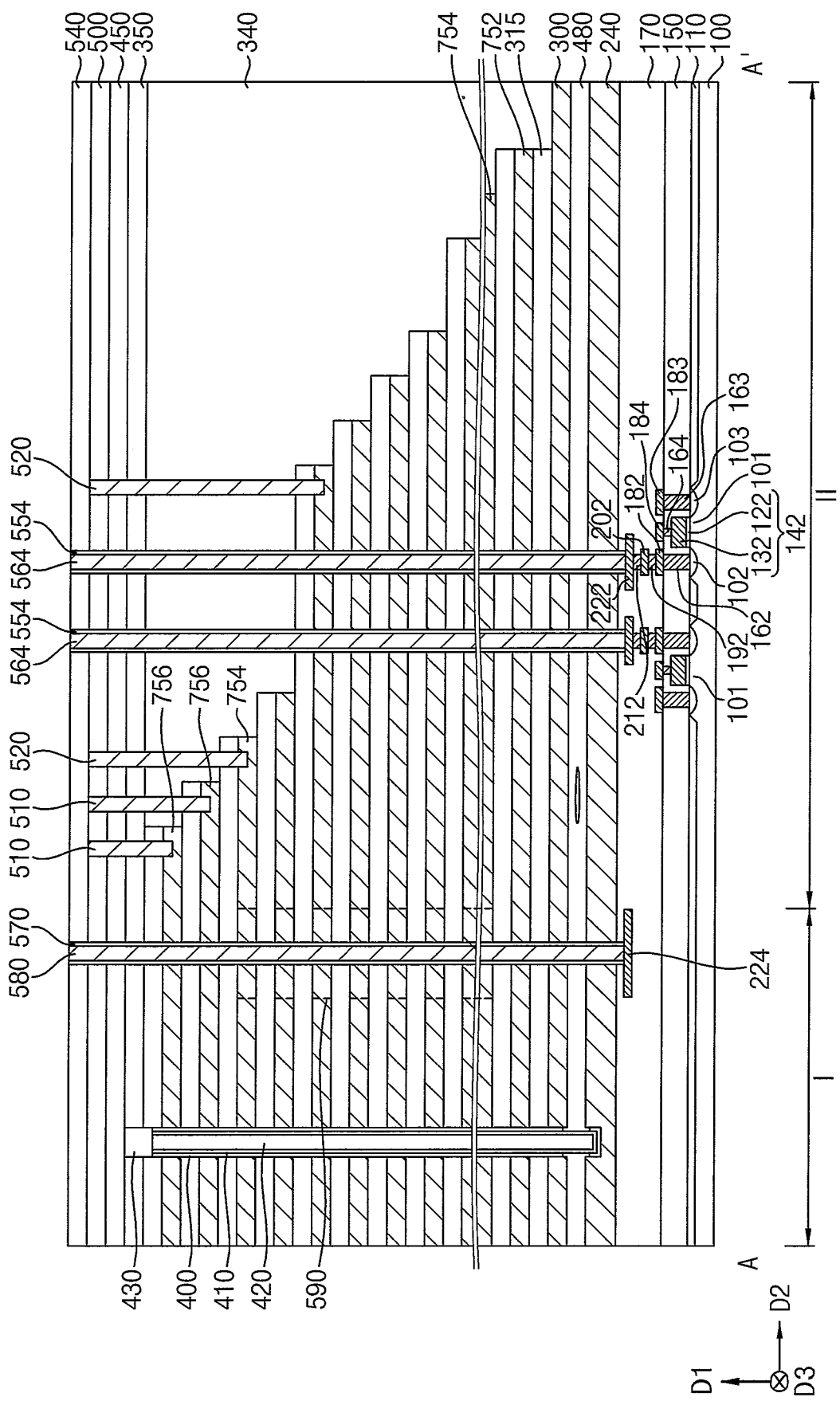
Figure 16B:
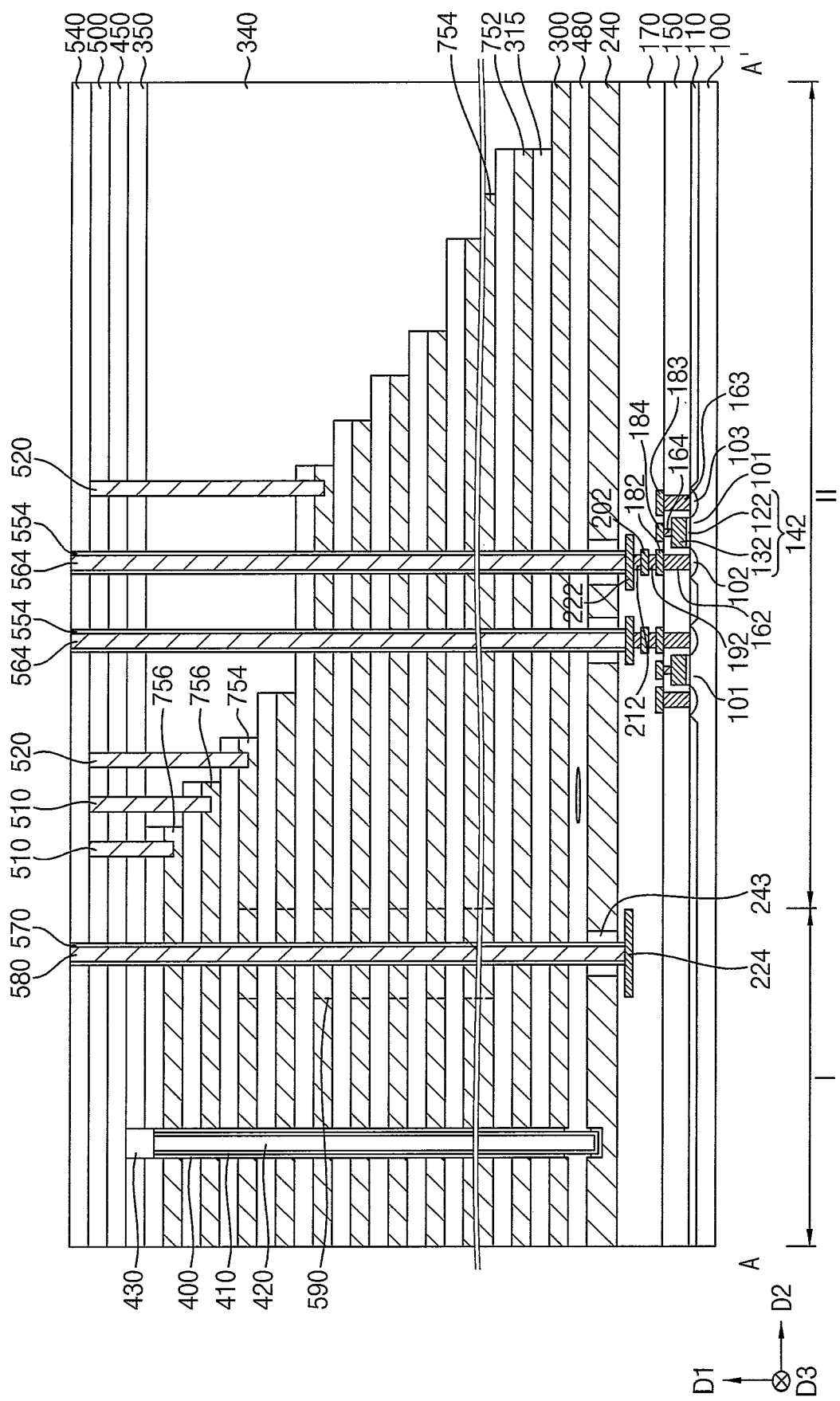
Figure 17:
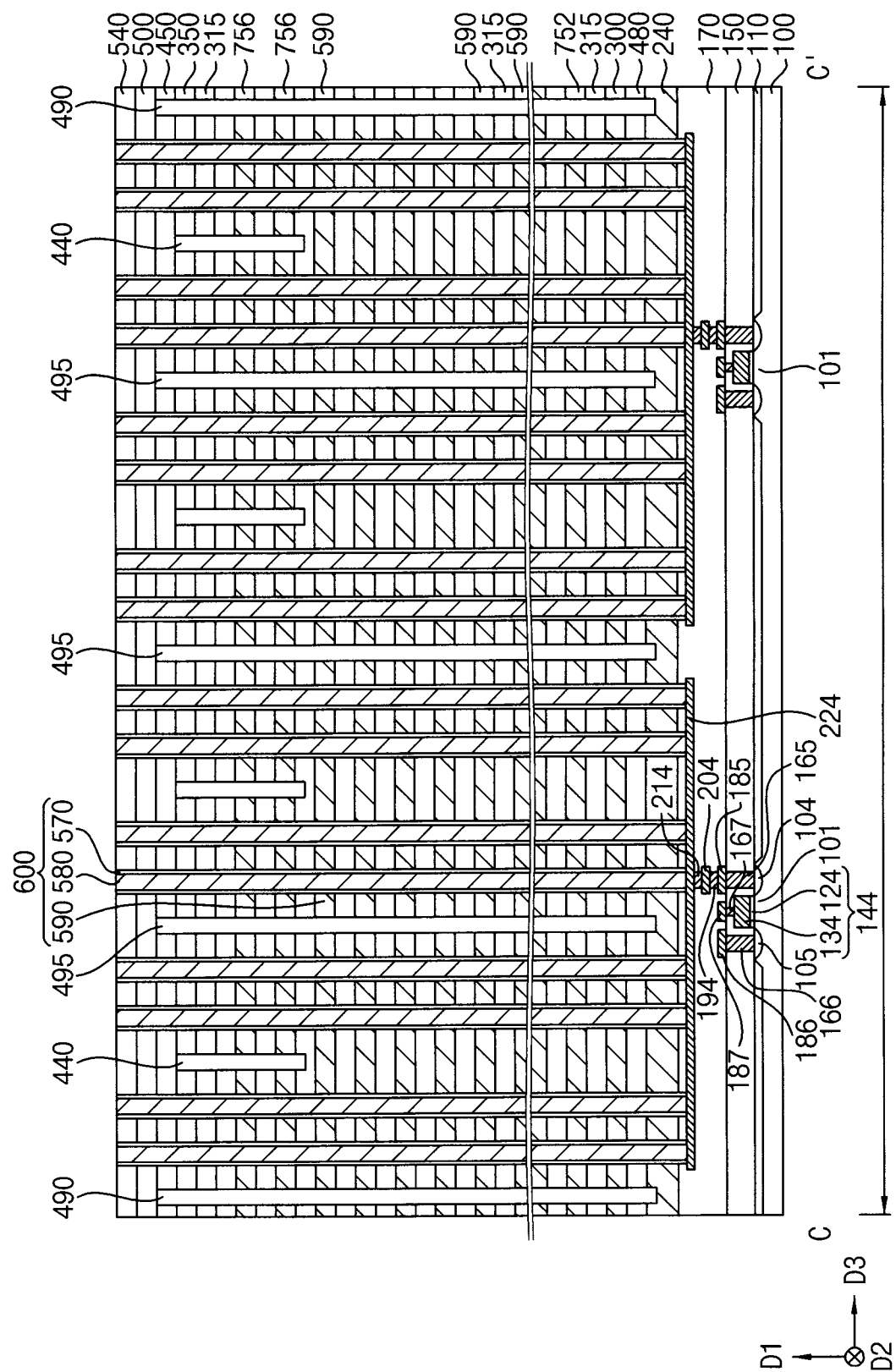
Figure 22:
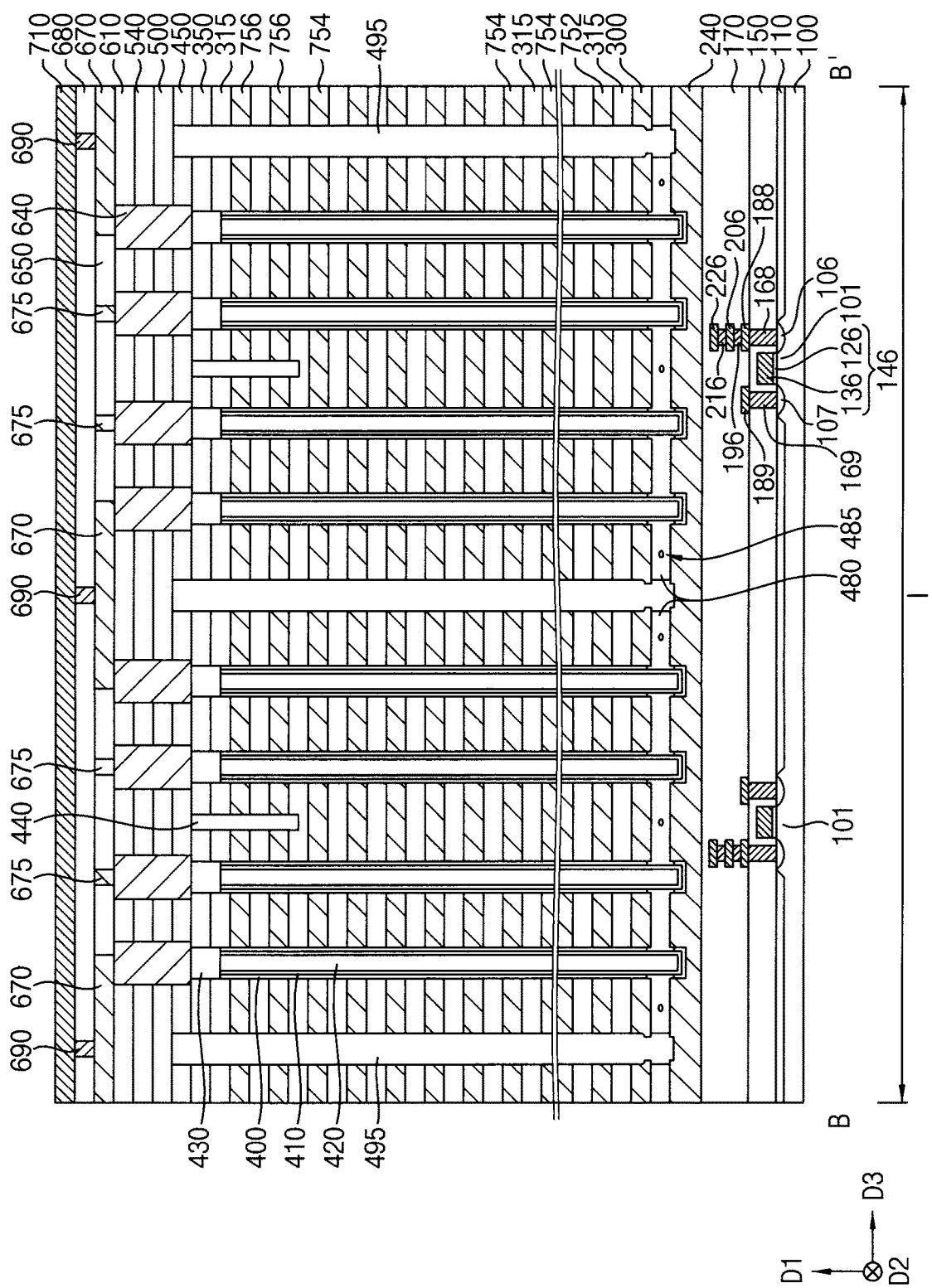
Figure 23:
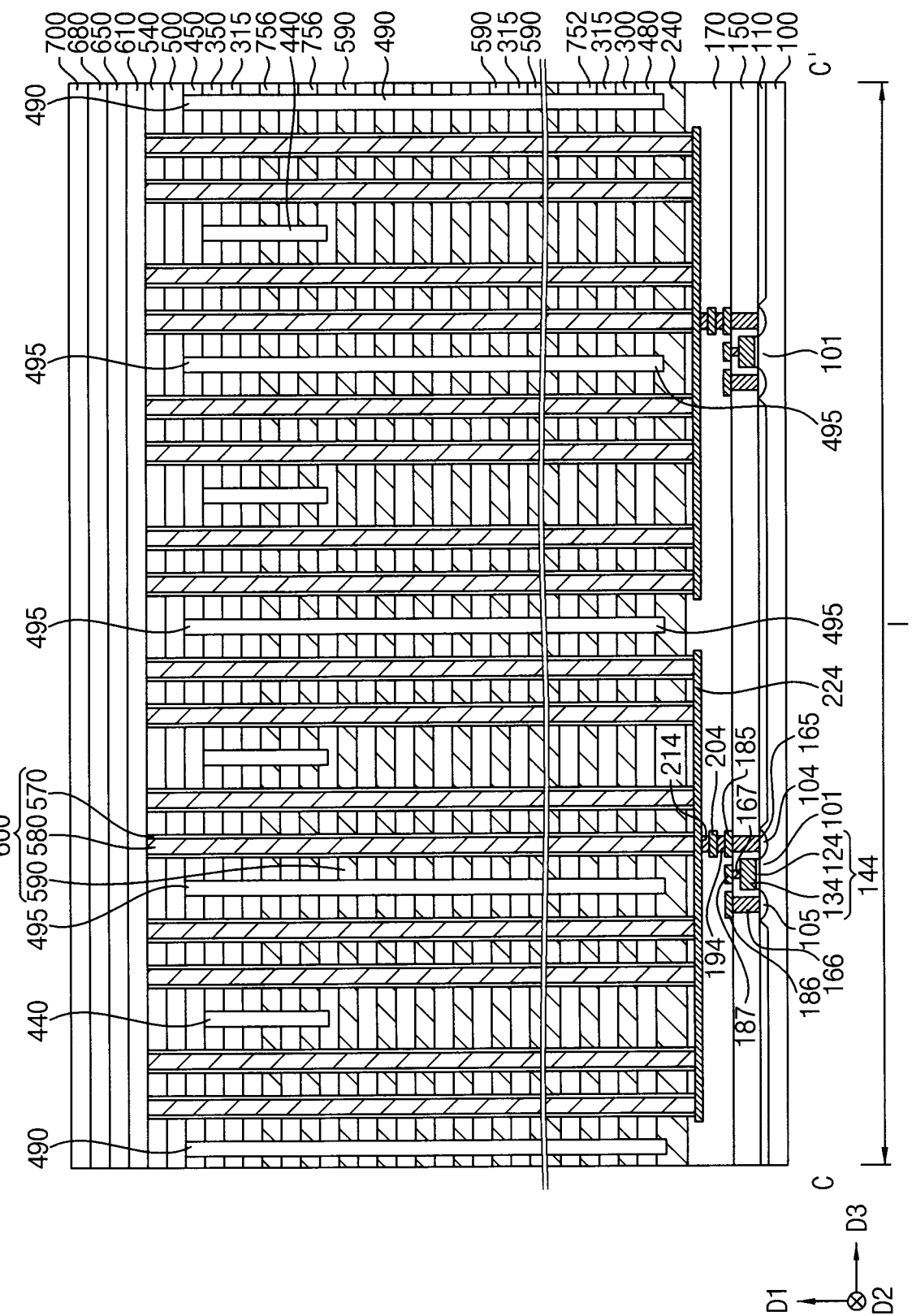

FIGS. 3-5, 7A, 7B, 14, 16A, 16B, 19 and 21A and 21B are cross-sectional views taken along lines A-A' of corresponding plan views, respectively, FIGS. 9-12 are cross-sectional views taken along lines B-B' of corresponding plan views, respectively, and FIGS. 17 and 23 are cross-sectional views taken along lines C-C' of corresponding plan views, respectively. FIGS. 2 to 23 are drawings of a region X of FIG. 1, and FIG. 7B are an enlarged cross-sectional view of a region Y of FIG. 7A.

Figure 1:
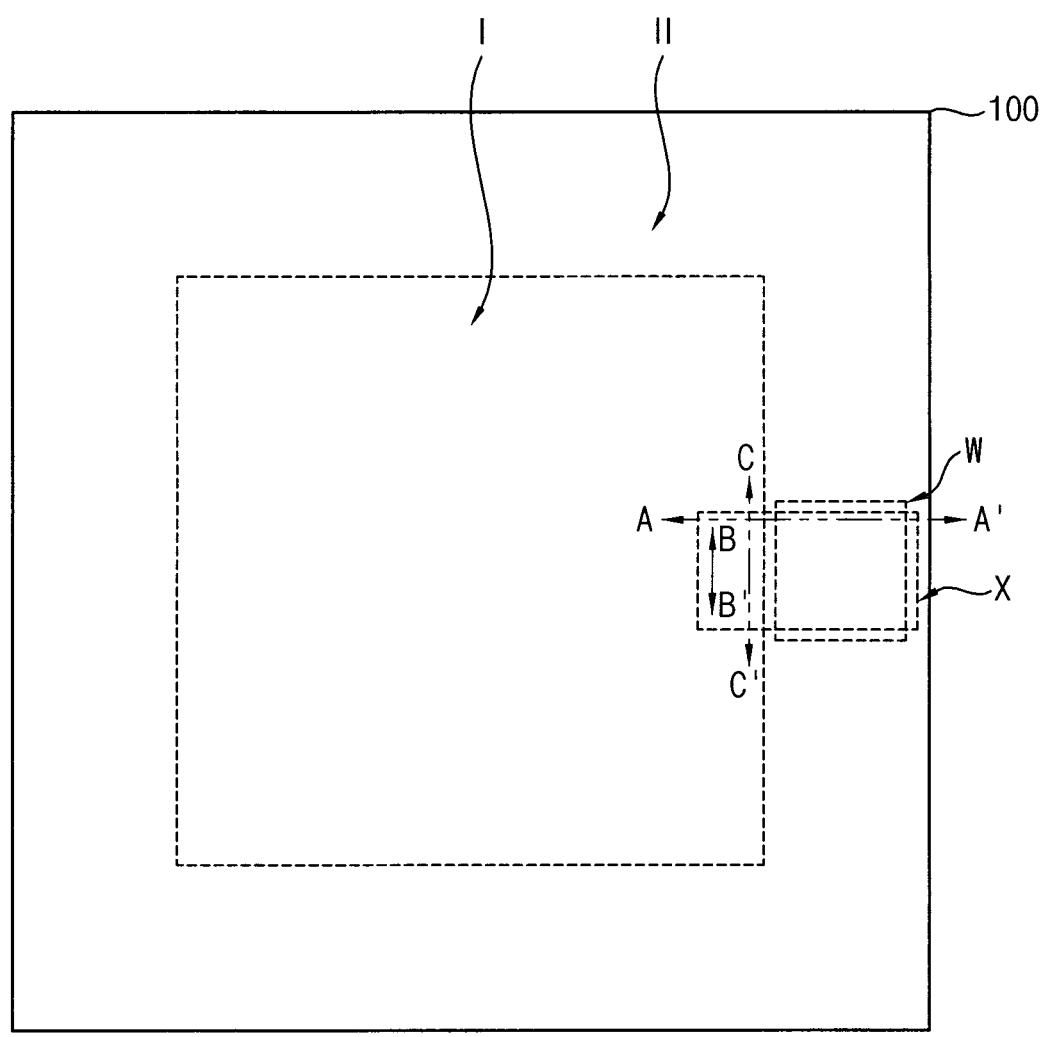

Referring to the exemplary embodiment of FIG. 1, a substrate 100 may include a first region I and a second region II at least partially surrounding the first region I.

In an exemplary embodiment, the substrate 100 may include semiconductor materials, such as at least one compound selected from silicon, germanium, silicon-germanium, etc., or Ill-V compounds, such as at least one compound selected from GaP, GaAs, GaSb, etc. In an exemplary embodiment, the substrate 100 may be a silicon-on-insulator (SOI) substrate or a germanium-on-insulator (GOI) substrate. In an exemplary embodiment, the substrate 100 may include p-type impurities, such as boron, etc.

In an exemplary embodiments, the first and second regions I and II may be a cell array region and a pad region (or extension region), respectively, which may together form a cell region. The pad region may be disposed at each of the opposite lateral sides of the cell array region (e.g., in the second direction D2). For example, memory cells each including a gate electrode, a channel, and a charge storage structure may be formed on the first region I of the substrate 100, and upper contact plugs for transferring electrical signal to the memory cells and pads of the gate electrodes contacting the upper contact plugs may be formed on the second region II of the substrate 100. In an exemplary embodiment, a third region may be further formed in the substrate 100 to surround the second region II of the substrate 100, and an upper circuit pattern for applying electrical signal to the memory cells through the upper contact plugs may be formed on the third region of the substrate 100.

Hereinafter, the region X including portions of the first and second regions I and II of the substrate 100 will be described.

Figure 2:
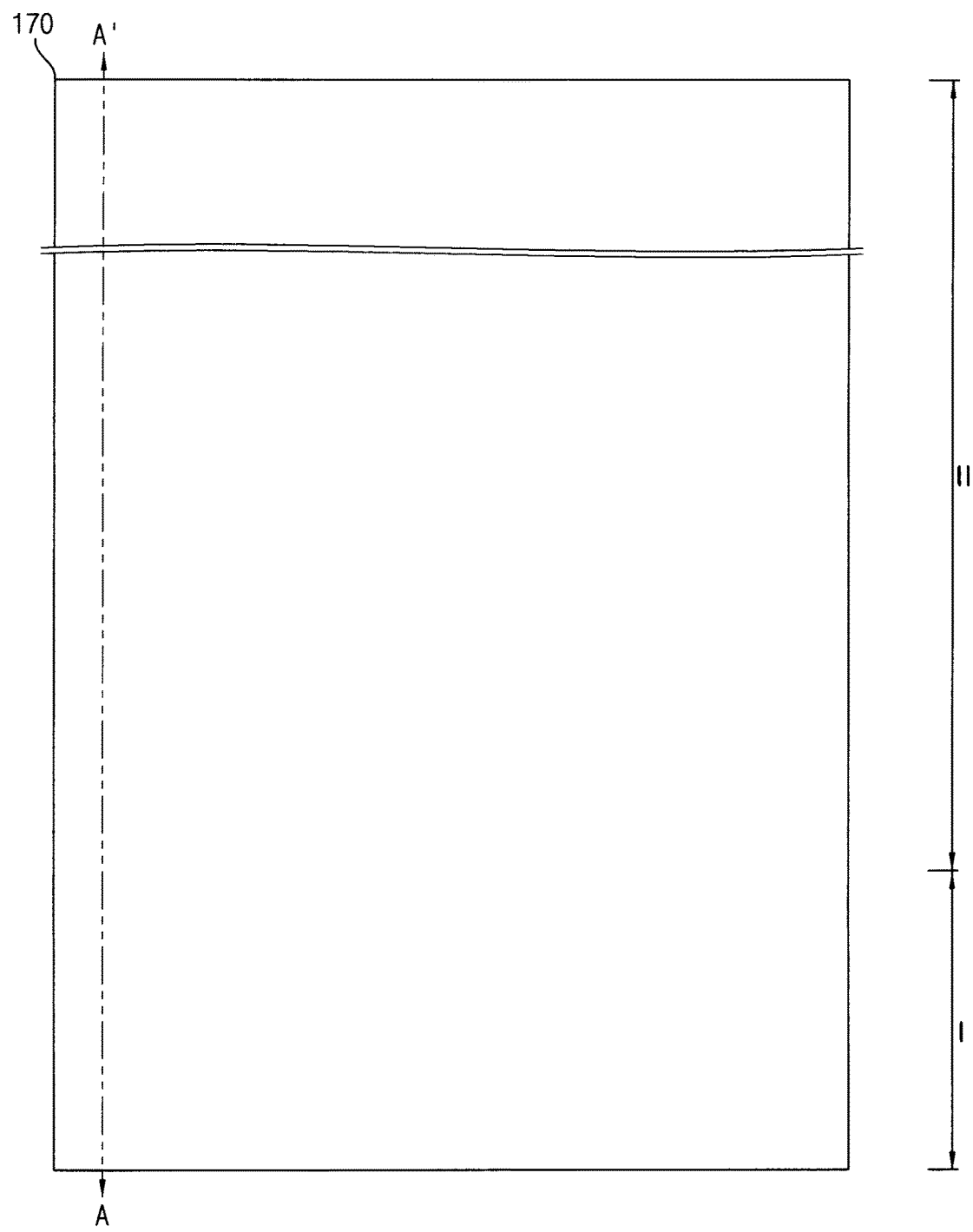
Figure 3:
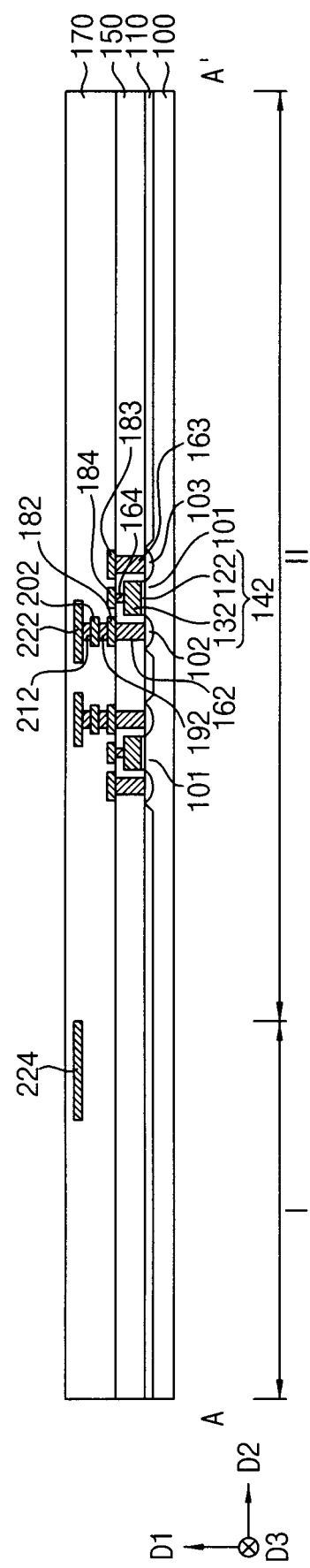

Referring to the exemplary embodiments of FIGS. 2 and 3, a lower circuit pattern may be formed on the substrate 100, and first and second insulating interlayers 150 and 170 may be sequentially formed on the substrate 100 to cover the lower circuit pattern.

The substrate 100 may include a field region on which an isolation pattern 110 is formed, and an active region 101 on which no isolation pattern is formed. In an exemplary embodiment, the isolation pattern 110 may be formed by, a shallow trench isolation (STI) process, etc. and may include an oxide, such as silicon oxide, etc. However, exemplary embodiments of the present inventive concepts are not limited thereto.

In an exemplary embodiments the vertical memory device may have a cell-over-periphery (COP) structure. For example, the lower circuit pattern may be formed on the substrate 100, and the memory cells, the upper contact plugs and the upper circuit pattern may be formed over the lower circuit pattern.

The lower circuit pattern may include transistors, lower contact plugs, lower wirings, lower vias, etc.

Alternatively, the vertical memory device may not have a COP structure, and in this exemplary embodiment, a peripheral circuit pattern instead of the lower circuit pattern may be formed on the third region of the substrate 100. For example, the transistors, the lower contact plugs, the lower wirings, lower vias, etc., covered by the first and second insulating interlayers 150 and 170 on the substrate 100 may be formed on the third region of the substrate 100 to be electrically connected to the upper circuit pattern.

Referring to FIGS. 2 and 3 together with FIGS. 8, 9, 15 and 17, in some exemplary embodiments, a first transistor may be formed on the second region II of the substrate 100, and second and third transistors may be formed on the first region I of the substrate 100. The second transistor may be formed on a portion of the first region I adjacent to the second region II of the substrate 100. In an exemplary embodiment, each of the first and second transistors may serve as a pass transistor.

Figure 9:
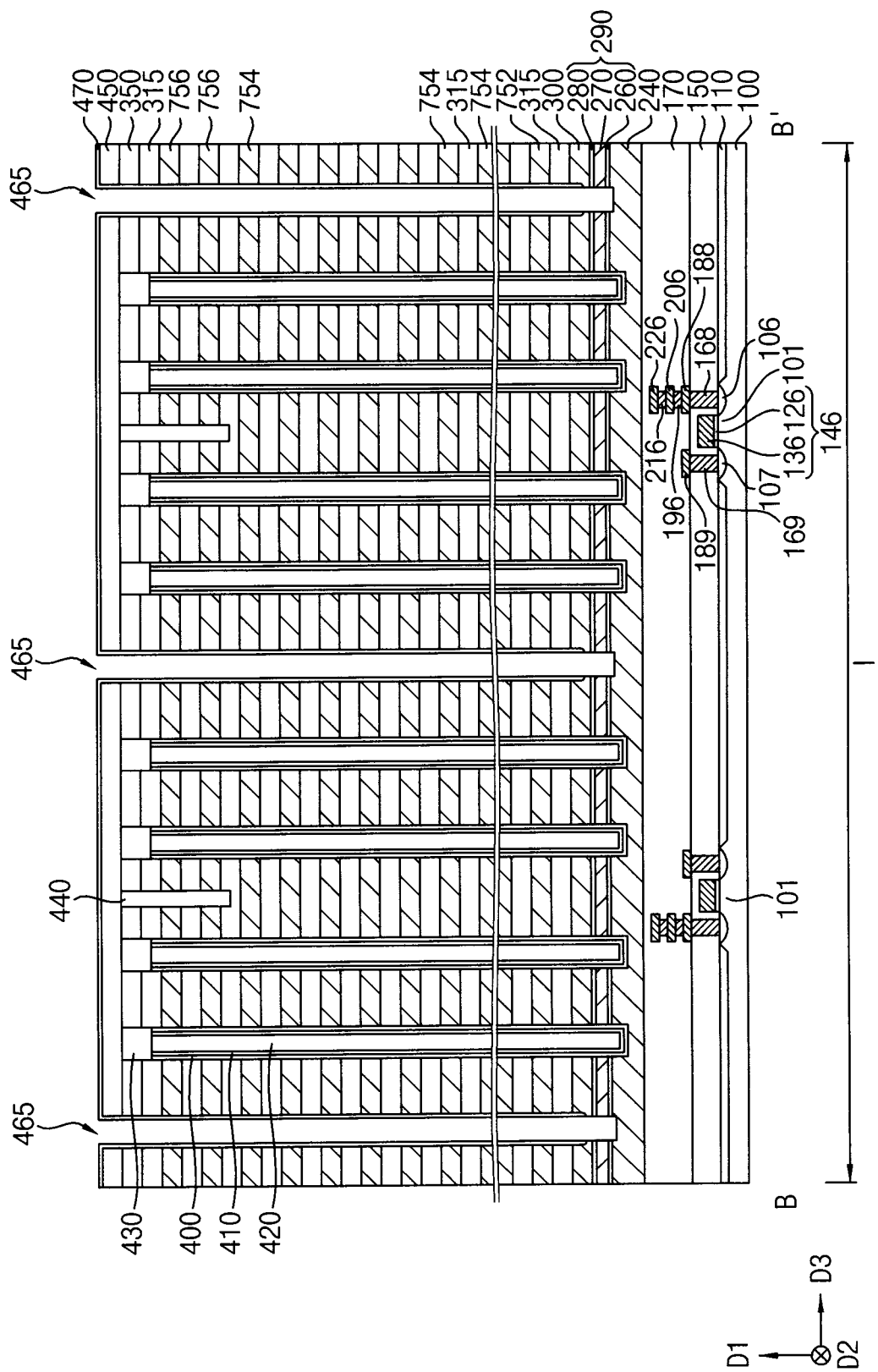

For example, the first transistor may include a first lower gate structure 142, and first and second impurity regions 102 and 103 serving as source/drains, respectively, at upper portions of the active region 101 adjacent thereto. The second transistor as shown in FIG. 17 may include a second lower gate structure 144, and third and fourth impurity regions 104 and 105 serving as source/drains, respectively, at upper portions of the active region 101 adjacent thereto. The third transistor as shown in FIG. 9 may include a third lower gate structure 146, and fifth and sixth impurity regions 106 and 107 serving as source/drains, respectively, at upper portions of the active region 101 adjacent thereto.

The first lower gate structure 142 may include a first lower gate insulation pattern 122 and a first lower gate electrode 132 sequentially stacked on the substrate 100. The second lower gate structure 144 may include a second lower gate insulation pattern 124 and a second lower gate electrode 134 sequentially stacked on the substrate 100. The third lower gate structure 146 may include a third lower gate insulation pattern 126 and a third lower gate electrode 136 sequentially stacked on the substrate 100.

The first insulating interlayer 150 may be formed on the substrate 100 to cover the first to third transistors, and first, second, fourth, fifth, seventh and eighth lower contact plugs 162, 163, 165, 166, 168 and 169 extending through the first insulating interlayer 150 to contact the first to sixth impurity regions 102, 103, 104, 105, 106 and 107, respectively, and third and sixth lower contact plugs 164 and 167 extending through the first insulating interlayer 150 to contact the first and second lower gate electrodes 132 and 134, respectively, may be formed. Additionally, in an exemplary embodiment, a ninth lower contact plug extends through the first insulating interlayer 150 to contact the third lower gate electrode 136 may be further formed.

The first, second, fourth, fifth, seventh and eighth lower wirings 182, 183, 185, 186, 188 and 189 may be formed on the first insulating interlayer 150 to contact the first, second, fourth, fifth, seventh and eighth lower contact plugs 162, 163, 165, 166, 168 and 169, respectively. The third and sixth lower wirings 184 and 187 may be formed on the first insulating interlayer 150 to contact the third and sixth lower contact plugs 164 and 167, respectively. For example, the first through eight lower wirings 182-189 may be formed on an upper surface of the first insulating interlayer 150.

A first lower via 192, a ninth lower wiring 202, a fourth lower via 212 and a twelfth lower wiring 222 may be sequentially stacked (e.g., in the first direction D1) on the first lower wiring 182. A second lower via 194, a tenth lower wiring 204, a fifth lower via 214 and a thirteenth lower wiring 224 may be sequentially stacked (e.g., in the first direction D1) on the fourth lower wiring 185, and a third lower via 196, an eleventh lower wiring 206, a sixth lower via 216 and a fourteenth lower wiring 226 may be sequentially stacked (e.g., in the first direction D1) on the seventh lower wiring 188.

The second insulating interlayer 170 may be formed on the first insulating interlayer 150 to cover the first to fourteenth lower wirings 182, 183, 184, 185, 186, 187, 188, 189, 202, 204, 206, 222, 224 and 226 and the first to sixth lower vias 192, 194, 196, 212, 214 and 216.

In an exemplary embodiment, the first lower gate structure 142 of the first transistor may be connected to a driving circuit through the third lower contact plug 164 and the third lower wiring 184, and the second impurity region 103 of the first transistor may be connected to a driving circuit through the second lower contact plug 163 and the second lower wiring 183. For example, the first transistor may transfer electrical signals from the driving circuits to the first lower contact plug 162, the first lower wiring 182, the first lower via 192, the ninth lower wiring 202, the fourth lower via 212 and the twelfth lower wiring 222.

Additionally, the second lower gate structure 144 of the second transistor may be connected to a driving circuit through the fifth lower contact plug 166 and the fifth lower wiring 186, and the fourth impurity region 105 of the second transistor may be connected to a driving circuit through the sixth lower contact plug 167 and the sixth lower wiring 187. For example, the second transistor may transfer electrical signals from the driving circuits to the fourth lower contact plug 165, the fourth lower wiring 185, the second lower via 194, the tenth lower wiring 204, the fifth lower via 214 and the thirteenth lower wiring 224.

In an exemplary embodiment, each element of the lower circuit pattern may be formed by a patterning process and/or a damascene process.

Figure 4:
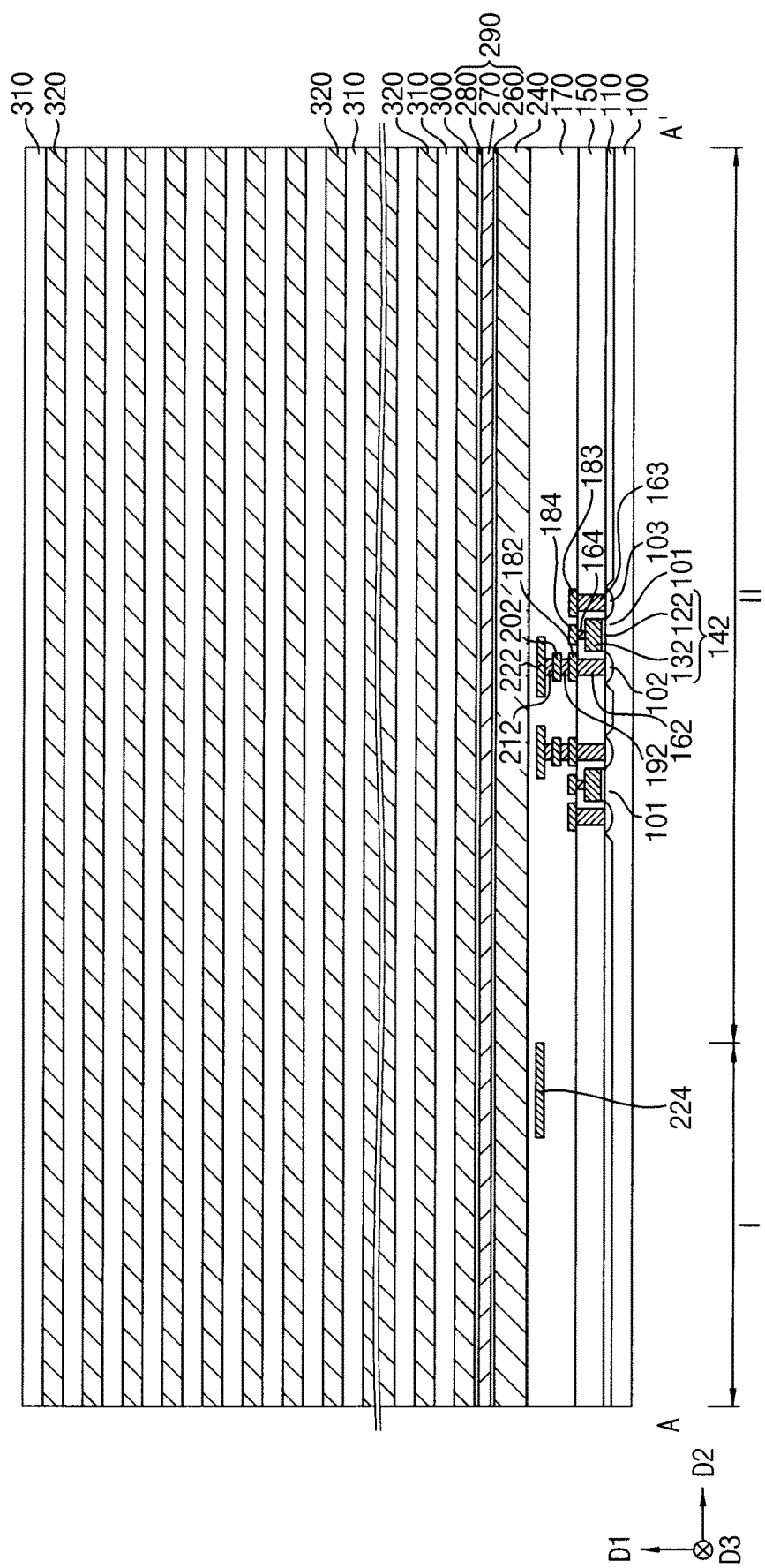

Referring to the exemplary embodiment of FIG. 4, a common source plate (CSP) 240, a sacrificial layer structure 290, and a support layer 300 may be sequentially formed (e.g., stacked in the first direction D1) on the second insulating interlayer 170.

In an exemplary embodiment, the CSP 240 may include polysilicon doped with n-type impurities. Alternatively, the CSP 240 may include a metal silicide layer and a polysilicon layer doped with n-type impurities sequentially stacked. The metal silicide layer may include, e.g., tungsten silicide. However, exemplary embodiments of the present inventive concepts are not limited thereto.

The sacrificial layer structure 290 may include first to third sacrificial layers 260, 270 and 280 sequentially stacked (e.g., in the first direction D1). In an exemplary embodiment, the first and third sacrificial layers 260 and 280 may include an oxide, such as silicon oxide, etc. and the second sacrificial layer 270 may include a nitride, such as silicon nitride, etc. However, exemplary embodiments of the present inventive concepts are not limited thereto.

In an exemplary embodiment, the support layer 300 may include a material having an etching selectivity with respect to the first to third sacrificial layers 260, 270 and 280. For example, the support layer 300 may include polysilicon doped with n-type impurities. However, exemplary embodiments of the present inventive concepts are not limited thereto. A portion of the support layer 300 may extend through the sacrificial layer structure 290 to contact an upper surface of the CSP 240, which may form a support pattern.

A first insulation layer 310 and a first gate electrode layer 320 may be alternately and repeatedly stacked on the support layer 300 in the first direction D1. Accordingly, a mold layer including a plurality of first insulation layers 310 and a plurality of first gate electrode layers 320 alternately and repeatedly stacked in the first direction D1 may be formed. In an exemplary embodiment, the first insulation layer 310 may include an oxide, such as silicon oxide, etc., and the first gate electrode layer 320 may include polysilicon doped with n-type impurities, etc. However, exemplary embodiments of the present inventive concepts are not limited thereto.

Referring to the exemplary embodiment of FIG. 4 together with FIG. 6, a first division pattern 330 may be formed through a lowermost one of the first gate electrode layers 320. The first division pattern 330 may be formed on the second region II of the substrate 100, and may include an oxide, such as silicon oxide, etc. However, exemplary embodiments of the present inventive concepts are not limited thereto. In an exemplary embodiment, a plurality of first division patterns 330 may be spaced apart from each other in the third direction D3.

Figure 5:
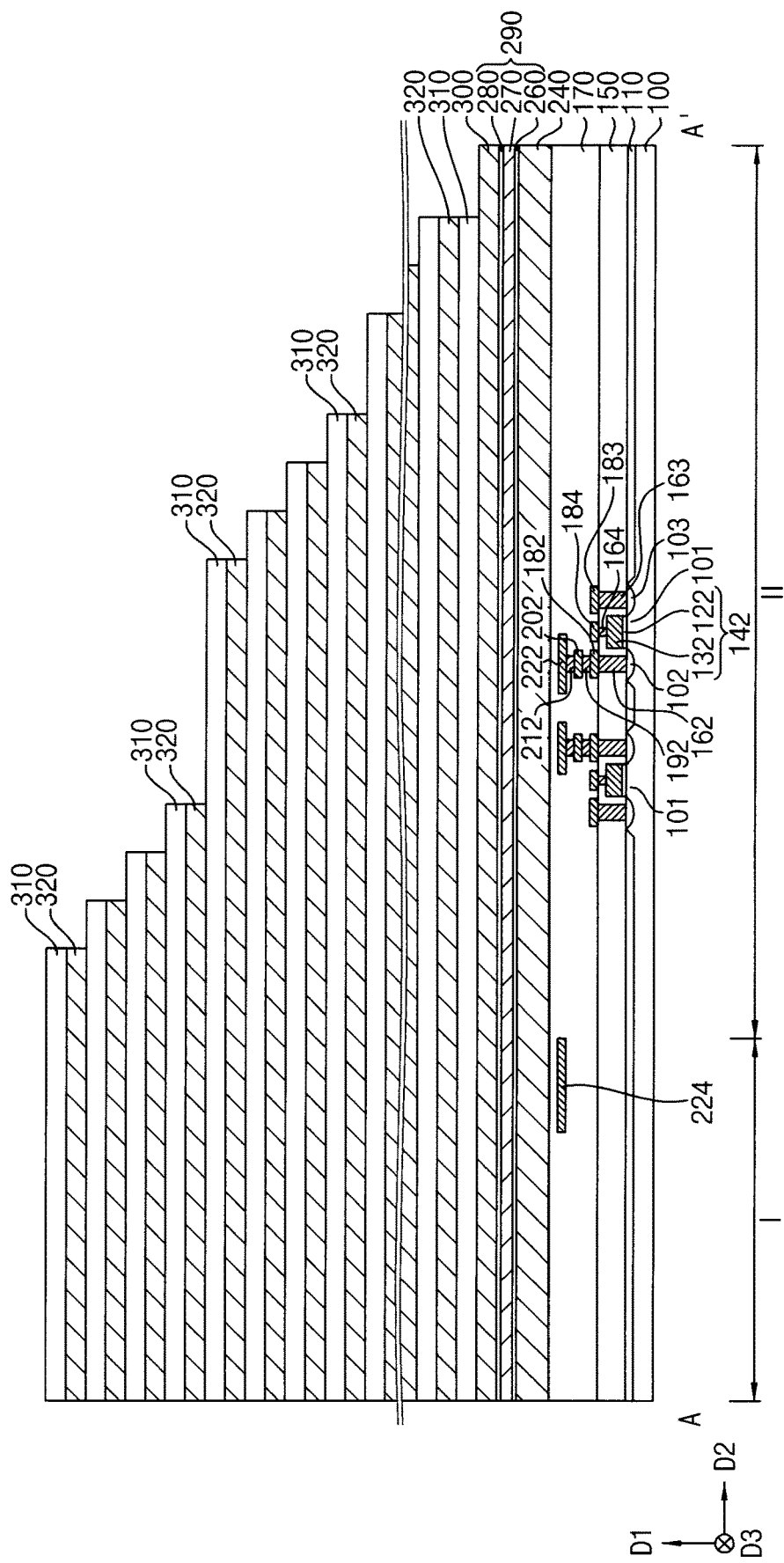

Referring to the exemplary embodiment of FIG. 5, a photoresist pattern partially covering an uppermost one of the first insulation layers 310 may be formed thereon, and the uppermost one of the first insulation layers 310, and an uppermost one of the first gate electrode layers 320 thereunder may be etched using the photoresist pattern as an etching mask. Accordingly, a portion of one of the first insulation layers 310 directly under the uppermost one of the first gate electrode layers 320 may be exposed.

After a trimming process for reducing an area of the photoresist pattern by a given ratio is performed, an etching process may be performed such that the uppermost one of the first insulation layers 310, the uppermost one of the first gate electrode layers 320, the exposed one of the first insulation layers 310 and one of the first gate electrode layers 320 thereunder may be etched using the reduced photoresist pattern as an etching mask. As the trimming process and the etching process are repeatedly performed, a mold including a plurality of step layers which may include the first gate electrode layer 320 and the first insulation layer 310 sequentially stacked and having a staircase shape may be formed. The length (e.g., in the second direction D2) of the step layers may decrease as the distance from the substrate 100 in the first direction D1 increases.

Hereinafter, each of the "step layers" may be considered to include not only an exposed portion, but also a portion thereof covered by upper step layers, and thus may refer to an entire portion of the first gate electrode layer 320 and an entire portion of the first insulation layer 310 at each level (e.g., distance from an upper surface of the substrate 100 in the first direction D1). The exposed portion of the step layer not covered by upper step layers may be referred to as a "step." In an exemplary embodiment, the steps may be arranged in the second direction D2. In an exemplary embodiment, a first plurality of steps in the mold may have differences in the lengths in the second direction D2 between adjacent steps that are substantially constant. A second plurality of steps in the mold may have differences in the lengths in the second direction D2 between adjacent steps that are greater than those in the first plurality of the steps. In an exemplary embodiment, the first plurality of steps may comprise a majority of the steps in the mold. Hereinafter, steps in the first plurality of steps may be referred to as first steps, respectively, and steps in the second plurality of steps may be referred to as second steps, respectively. FIG. 5 shows two second steps. The steps are shown by dotted lines in each plan views.

The mold may be formed on the support layer 300 on the first and second regions I and II of the substrate 100. As shown in the exemplary embodiment of FIG. 5, an upper surface of a lateral end of the support layer 300 may not be covered by the mold and may be exposed. Each of the steps in the mold may be formed on the second region II of the substrate 100.

Referring to the exemplary embodiments of FIGS. 6, 7A and 7B, a third insulating interlayer 340 may be formed on the CSP 240 to cover the mold and the exposed edge upper surface of the support layer 300. In an exemplary embodiment, an upper portion of the third insulating interlayer 340 may be planarized until an upper surface of the uppermost one of the first insulation layers 310 is exposed. Therefore, a sidewall of the mold may be covered by the third insulating interlayer 340. A fourth insulating interlayer 350 may be formed on the mold and the third insulating interlayer 340. For example, as shown in the exemplary embodiment of FIG. 7A, a lower surface of the fourth insulating interlayer 350 may directly contact an upper surface of the third insulating interlayer 340.

A channel hole may be formed through the fourth insulating interlayer 350, the mold, the support layer 300 and the sacrificial layer structure 290 and may extend in the first direction D1 to expose an upper surface of a portion of the CSP 240 on the first region I of the substrate 100. In an exemplary embodiment, a plurality of channel holes may be formed to be spaced apart from each other in each of the second and third directions D2 and D3.

A charge storage structure layer and a channel layer may be sequentially formed on sidewalls of the channel holes, the exposed upper surface of the CSP 240, and the fourth insulating interlayer 350, and a filling layer may be formed on the channel layer to fill the channel holes. The filling layer, the channel layer and the charge storage structure layer may be planarized until the upper surface of the fourth insulating interlayer 350 is exposed to form a charge storage structure 400, a first channel 410 and a filling pattern 420 sequentially stacked in each of the channel holes. Each of the charge storage structure 400, the first channel 410 and the filling pattern 420 may extend in the first direction D1. The first channel may be referred to as a vertical channel.

As shown in the exemplary embodiment of FIG. 7B, the charge storage structure 400 may include a tunnel insulation pattern 390, a charge storage pattern 380 and a first blocking pattern 370 sequentially stacked in a horizontal direction substantially parallel to the upper surface of the substrate 100 from an outer lateral sidewall of the first channel 410 and sequentially stacked in a vertical direction on a lower surface of the first channel 410. In an exemplary embodiment, the tunnel insulation pattern 390 and the first blocking pattern 370 may include an oxide, such as silicon oxide, etc., the charge storage pattern 380 may include a nitride, such as silicon nitride, etc., and the filling pattern 420 may include an oxide, such as silicon oxide, etc. However, exemplary embodiments of the present inventive concepts are not limited thereto.

Upper portions of the charge storage structure 400, the first channel 410 and the filling pattern 420 sequentially stacked in each of the channel holes may be removed to form a first trench, and a capping pattern 430 may be formed to fill the first trench. In an exemplary embodiment, the capping pattern 430 may include, polysilicon doped with n-type impurities, etc. However, exemplary embodiments of the present inventive concepts are not limited thereto.

In an exemplary embodiment, a plurality of first channels 410 may be spaced apart from each other in each of the second and third directions D2 and D3, and thus a channel array may be defined. As shown in the exemplary embodiment of FIG. 6, the channel array may include a first channel column 410*a* including the first channels 410 arranged in the second direction D2, and a second channel column 410*b* including the first channels 410 arranged in the second direction D2 and spaced apart from the first channel column 410*a* in the third direction D3. In an exemplary embodiment, the first channels 410 included in the first channel column 410*a* may be located at an acute angle in the second direction D2 or the third direction D3 with respect to the first channels 410 included in the second channel column 410*b*.

The first and second channel columns 410*a* and 410*b* may be alternately and repeatedly arranged in the third direction D3. In an exemplary embodiment, five first channel columns 410*a* and four second channel columns 410*b* may be alternately disposed in the third direction D3, which may form a channel group.

Hereinafter, four channel columns disposed in the channel group may be referred to as first, second, third and fourth channel columns 410*a*, 410*b*, 410*c* and 410*d*, respectively. A channel column at a central portion of the channel group may be referred to as a fifth channel column 410*e*, and other four channel columns may be referred to as first, second, third and fourth channel columns 410*a*, 410*b*, 410*c* and 410*d*, respectively.

Two channel groups disposed in the third direction D3 may form a channel block. Memory cells each including the first channels 410, the charge storage structures 400, and gate electrodes illustrated later may also define a memory group and a memory block, correspondingly. An erase operation may be performed by the unit of the memory block in the vertical memory device. FIG. 6 shows two memory blocks disposed in the third direction D3, and each of the memory blocks may include two memory groups disposed in the third direction D3.

The fourth insulating interlayer 350, and some of the first insulation layers 310 and the first gate electrode layers 320 may be partially etched to form a first opening extending in the second direction D2, and a second division pattern 440 may be formed in the first opening.

In an exemplary embodiment, the second division pattern 440 may extend through upper portions of some of the first channels 410. For example, as shown in the exemplary embodiment of FIG. 6, the second division pattern 440 may extend through the fifth channel column 410e in each channel group. Additionally, the second division pattern 440 may extend through the fourth insulating interlayer 350, the first gate electrode layers 320 at the upper two levels, respectively, and the first insulation layers 310 at the upper two levels, respectively, and partially through the first insulation layers 310 at a third highest level. The second division pattern 440 may extend in the second direction D2 on the first and second regions I and II of the substrate 100, and may extend through step layers at the upper two levels, respectively, in the mold. Accordingly, the first gate electrode layers 320 at the respective upper two levels may be divided in the third direction D3 by the second division pattern 440.

Referring to the exemplary embodiments of FIGS. 8 and 9, a fifth insulating interlayer 450 may be formed on the fourth insulating interlayer 350, the capping pattern 430 and the second division pattern 440. Second and third openings 460 and 465 may be formed through the third to fifth insulating interlayers 340, 350 and 450 and the mold.

In an exemplary embodiment, each of the second and third openings 460 and 465 may extend in the second direction D2 on the first and second regions I and II of the substrate 100. The second opening 460 may extend to opposite ends in the second direction D2 of the mold having a staircase shape. However, in an exemplary embodiment, the third opening 465 may be partially discontinuous on the second region II of the substrate 100. Therefore, the mold may be entirely divided in the third direction D3 by the second opening 460. However, as shown in the exemplary embodiment of FIG. 8, the mold may not be entirely divided in the third direction D3 by the third opening 465, and molds at opposite sides of the third opening 465 in the third direction D3 may be connected with each other by a first connecting portion 990. In an exemplary embodiment, the first connecting portion 990 may extend downwardly in the first direction D1 from the third highest level, and may overlap the first division pattern 330 in the first direction.

The etching process may be performed until the second and third openings 460 and 465 expose an upper surface of the support layer 300, and the second and third openings 460 and 465 may further extend through an upper portion of the support layer 300. As the second and third openings 460 and 465 are formed, sidewalls of the first insulation layers 310 and the first gate electrode layers 320 of the mold may be exposed, and the first insulation layers 310 and the first gate electrode layers 320 may be divided into first insulation patterns 315 and gate electrodes, respectively.

The first insulation patterns 315 and the gate electrodes at opposite sides of the third opening 465 may not be entirely divided but may be partially connected with each other by the first connecting portion 990. For example, the first connecting portion 990 of the mold may include a connecting pattern for the first insulation pattern 315 and a connection pattern for the gate electrode, and the first insulation patterns 315 at opposite sides of the third opening 465 (e.g., in the third direction D3) may be connected with each other and the gate electrodes at opposite sides of the third opening 465 may be connected with each other. The mold may have a flat upper surface on the first region I of the substrate 100, and may have a staircase shape on the second region II of the substrate 100 and each of the opposite ends in the second direction D2 of the first region I of the substrate 100. The mold may extend in the second direction D2.

In an exemplary embodiment, each of the gate electrodes may extend in the second direction D2, and a plurality of gate electrodes stacked in the first direction D1 may form a gate electrode structure. The gate electrode structure may have a staircase shape including step layers of the gate electrodes. A step of each step layer that is not overlapped by upper step layers, such as an end portion of each step layer in the second direction D2, may be referred to as a pad.

In an exemplary embodiment, a plurality of gate electrode structures may be formed in the third direction D3, which may be spaced apart from each other in the third direction D3 by the second and third openings 460 and 465. However, in an exemplary embodiment, the gate electrode structures at opposite sides of the third opening 465 may not be entirely divided from each other but may be partially connected with each other by the connecting pattern of the gate electrode in the first connecting portion 990 of the mold. A pair of adjacent gate electrode structures that are separated by the second openings 460 in the third direction D3 may be referred to as one gate electrode structure.

The gate electrode structure may include first, second and third gate electrodes 752, 754 and 756 sequentially stacked in the first direction D1. In an exemplary embodiment, the first gate electrode 752 may be formed at a lowermost level to serve as a ground selection line (GSL), the third gate electrode 756 may be formed at an uppermost level and a second level from above to serve as a string selection line (SSL), and the second gate electrode 754 may be formed at a plurality of levels between the first and third gate electrodes 752 and 756 to serve as a word line. However, a gate electrode through which an erase operation may be performed by using gate induced drain leakage (GIDL) phenomenon may be further disposed under the first gate electrode 752 and/or over the third gate electrode 756.

However, exemplary embodiments of the present inventive concepts are not limited thereto and the number of stacks of each of the first to third gate electrodes 752, 754 and 756 may vary in other exemplary embodiments.

In an exemplary embodiment, each of the second and third openings 460 and 465 may extend in the second direction D2 between memory groups on the first region I of the substrate 100. A plurality of second openings 460 may be arranged in the third direction D3, and a plurality of third openings 465 may be arranged in the third direction D3. For example, in an exemplary embodiment, the second opening 460 may be formed at each of the opposite lateral sides in the third direction D3 of a shared memory block including a plurality of memory blocks that share word lines with each other. The third opening 465 may be formed between the memory blocks in the shared memory block and between memory groups in each of the memory blocks.

FIG. 8 shows two memory blocks each including two memory groups that share word lines with each other to form a shared memory block. Therefore, the second openings 460 are formed at opposite sides (e.g., lateral sides in the third direction D3), respectively, of the shared memory block. Additionally, three third openings 465 are formed between four memory groups, respectively, in the shared memory block. However, exemplary embodiments of the present inventive concepts are not limited thereto and the number of the memory blocks included in each memory block, and the number of the memory blocks included in each shared memory block may vary. For example, in another exemplary embodiment, one shared memory block may include, four or eight memory blocks therein.

In the shared memory block shown in the exemplary embodiment of FIG. 8, word lines at each level may be connected with each other by the connecting pattern of the gate electrode in the first connecting portion 990 of the mold to be shared. Eight SSLs formed by the third gate electrodes 756 may be spaced apart from each other by the second division pattern 440 and the third openings 465, and four GSLs formed by the first gate electrodes 752 may be spaced apart from each other by the first division pattern 330 and the third openings 465. For example, each of the memory blocks in the shared memory block may include two word lines formed by the second gate electrodes 754 at each level that may be connected with each other by the first connecting portion 990 to function as one word line, and further the two word lines at each level included in the respective memory blocks in the shared memory block may be also connected with each other by the first connecting portion 990 to function as one word line. Thus, the shared memory block may include four word lines at each level to be function as one word line.

A spacer layer may be formed on sidewalls of the second and third openings 460 and 465 and an upper surface of the fifth insulating interlayer 450, and portions of the spacer layer on bottoms of the second and third openings 460 and 465 may be removed by an anisotropic etching process to form a spacer 470, and a portion of the support layer 300 may be partially exposed.

The exposed portion of the support layer 300 and a portion of the sacrificial layer structure 290 thereunder may be removed to enlarge each of the second and third openings 460 and 465 downwardly (e.g., in the first direction D1). Therefore, each of the second and third openings 460 and 465 may expose an upper surface of the CSP 240, and further may extend through an upper portion of the CSP 240.

In an exemplary embodiment, the spacer 470 may include undoped polysilicon. When the sacrificial layer structure 290 is partially removed, the sidewalls of the second and third openings 460 and 465 may be covered by the spacer 470, and thus the first insulation patterns 315 and the gate electrodes 752, 754 and 756 of the mold may not be removed.

Figure 10:
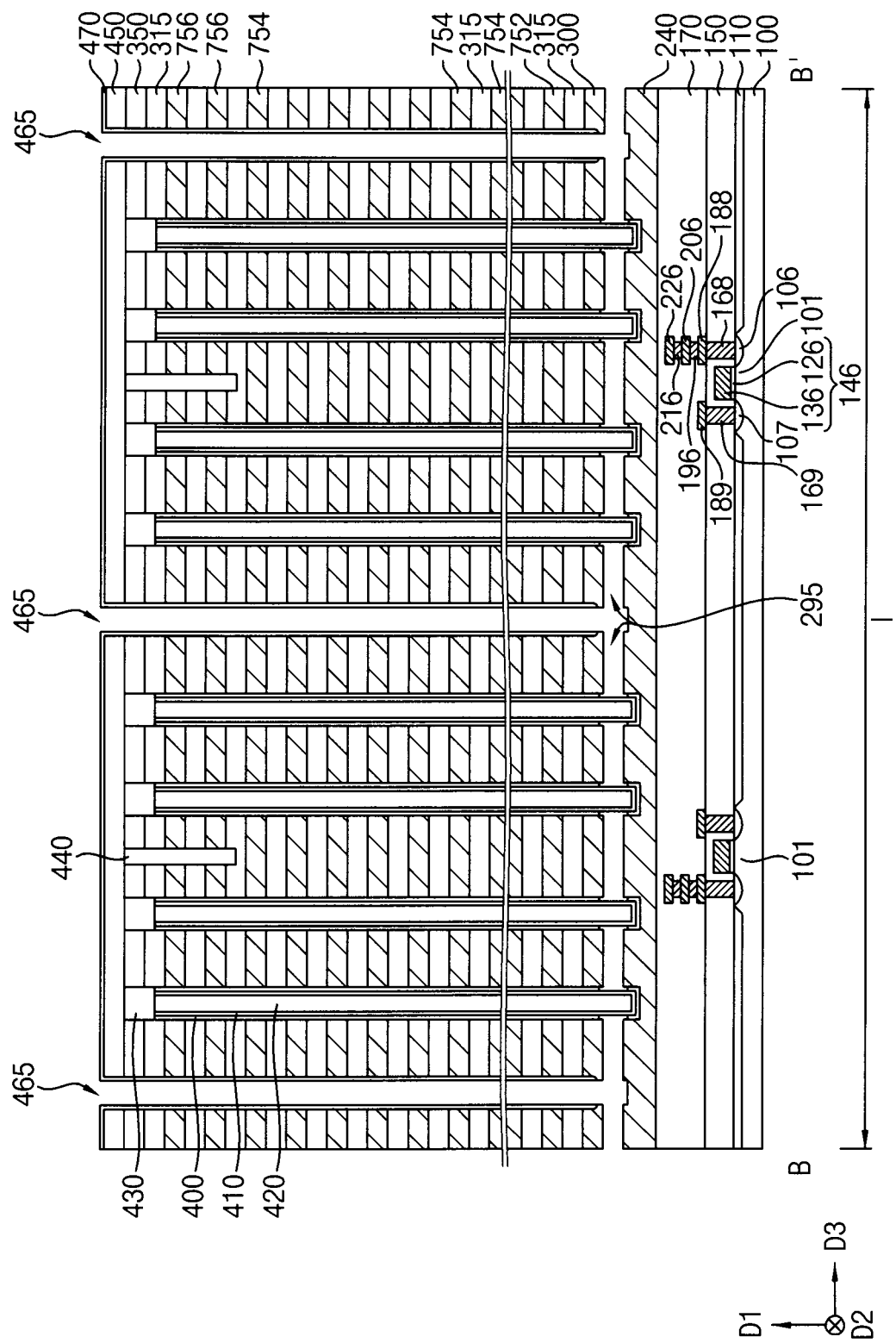

Referring to the exemplary embodiment of FIG. 10, the sacrificial layer structure 290 may be removed through the second and third openings 460 and 465. For example, the sacrificial layer structure 290 may be removed by a wet etching process, etc., and thus a first gap 295 may be formed. However, exemplary embodiments of the present inventive concepts are not limited thereto.

In an exemplary embodiment, the wet etching process may be performed using hydrofluoric acid (HF) and/or phosphoric acid ($H_3PO_4$). However, exemplary embodiments of the present inventive concepts are not limited thereto.

As the first gap 295 is formed, a lower surface of the support layer 300 and an upper surface of the CSP 240 may be exposed. Additionally, a sidewall of a portion of the charge storage structure 400 may be exposed by the first gap 295, and the exposed sidewall of the portion of the charge storage structure 400 may be further removed during the wet etching process to expose an outer sidewall of the first channel 410. Accordingly, the charge storage structure 400 may include an upper portion extending through the mold to cover a majority of the outer sidewall of the first channel 410 and a lower portion covering a bottom surface of the first channel 410 on the CSP 240 which are separated from each other by the first gap 295.

Figure 11:
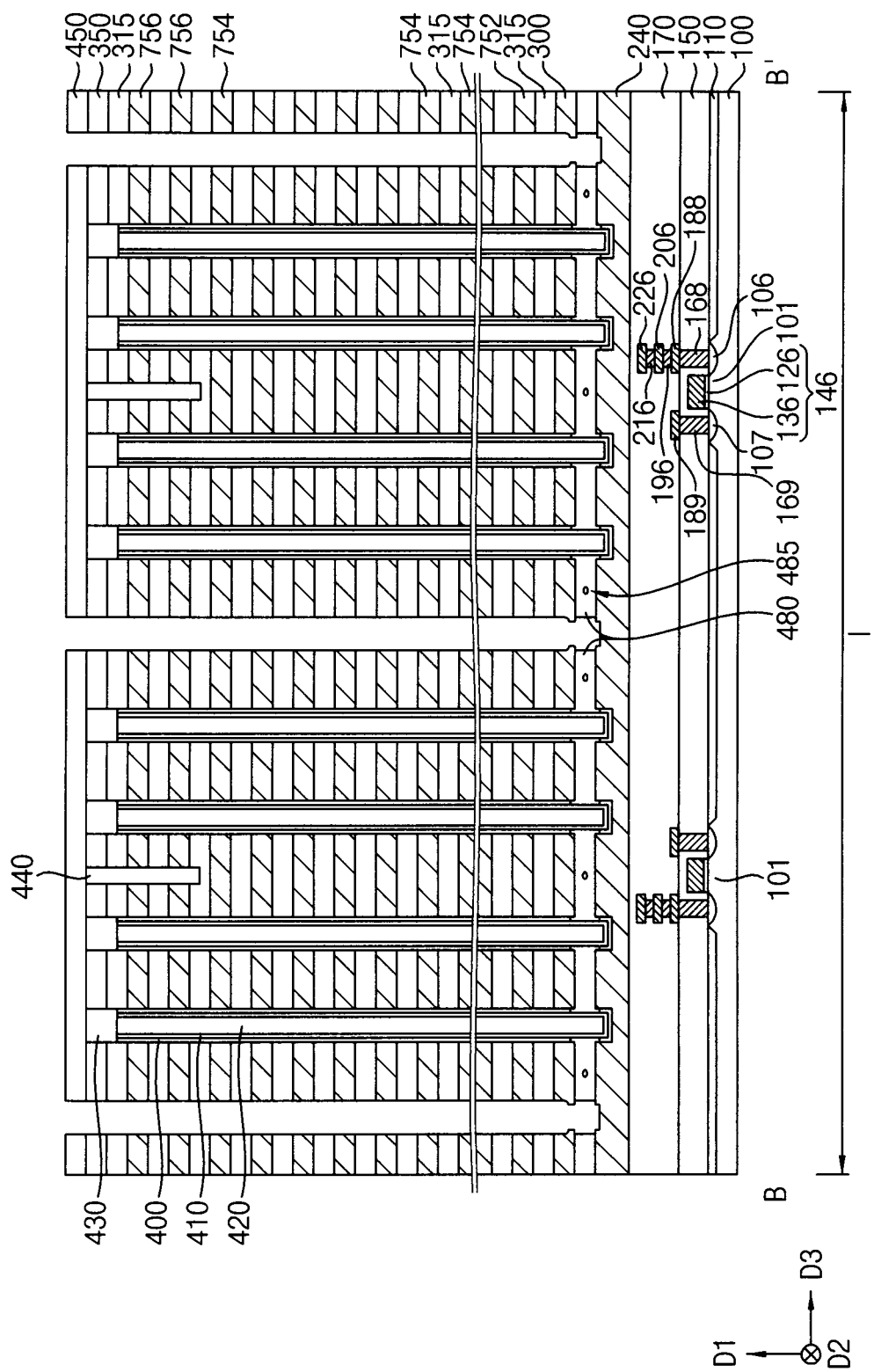

Referring to the exemplary embodiment of FIG. 11, the spacer 470 may be removed, and a channel connection layer may be formed on the sidewalls of the second and third openings 460 and 465 and in the first gap 295. A portion of the channel connection layer in the second and third openings 460 and 465 may be removed by an etch back process to form a channel connection pattern 480 in the first gap 295.

As the channel connection pattern 480 is formed, the first channels 410 between adjacent second and third openings 460 and 465 (e.g., adjacent in the third direction D3), such as the first channels 410 included in each channel group, may be connected with each other.

In an exemplary embodiment, the channel connection pattern 480 may include, undoped polysilicon or polysilicon doped with n-type impurities, etc. However, exemplary embodiments of the present inventive concepts are not limited thereto.

As shown in the exemplary embodiment of FIG. 11, an air gap 485 may be formed in the channel connection pattern 480.

Figure 12:
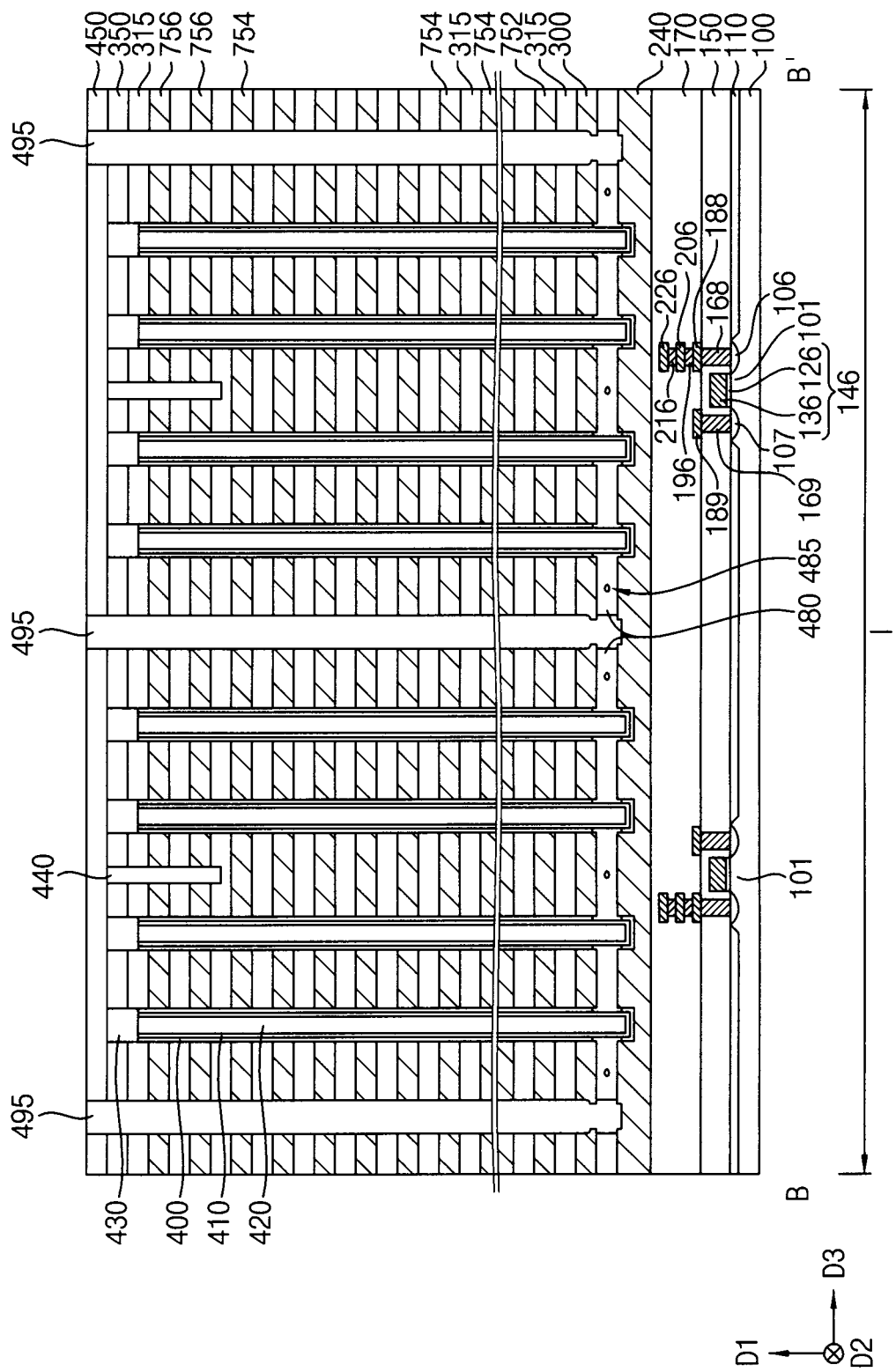

Referring to the exemplary embodiment of FIG. 12, third and fourth division patterns 490 and 495 (refer to FIG. 13) may be formed in the second and third openings 460 and 465, respectively.

In an exemplary embodiment, the third and fourth division patterns 490 and 495 may include an oxide, such as silicon oxide, etc. However, exemplary embodiments of the present inventive concepts are not limited thereto.

Figure 13:
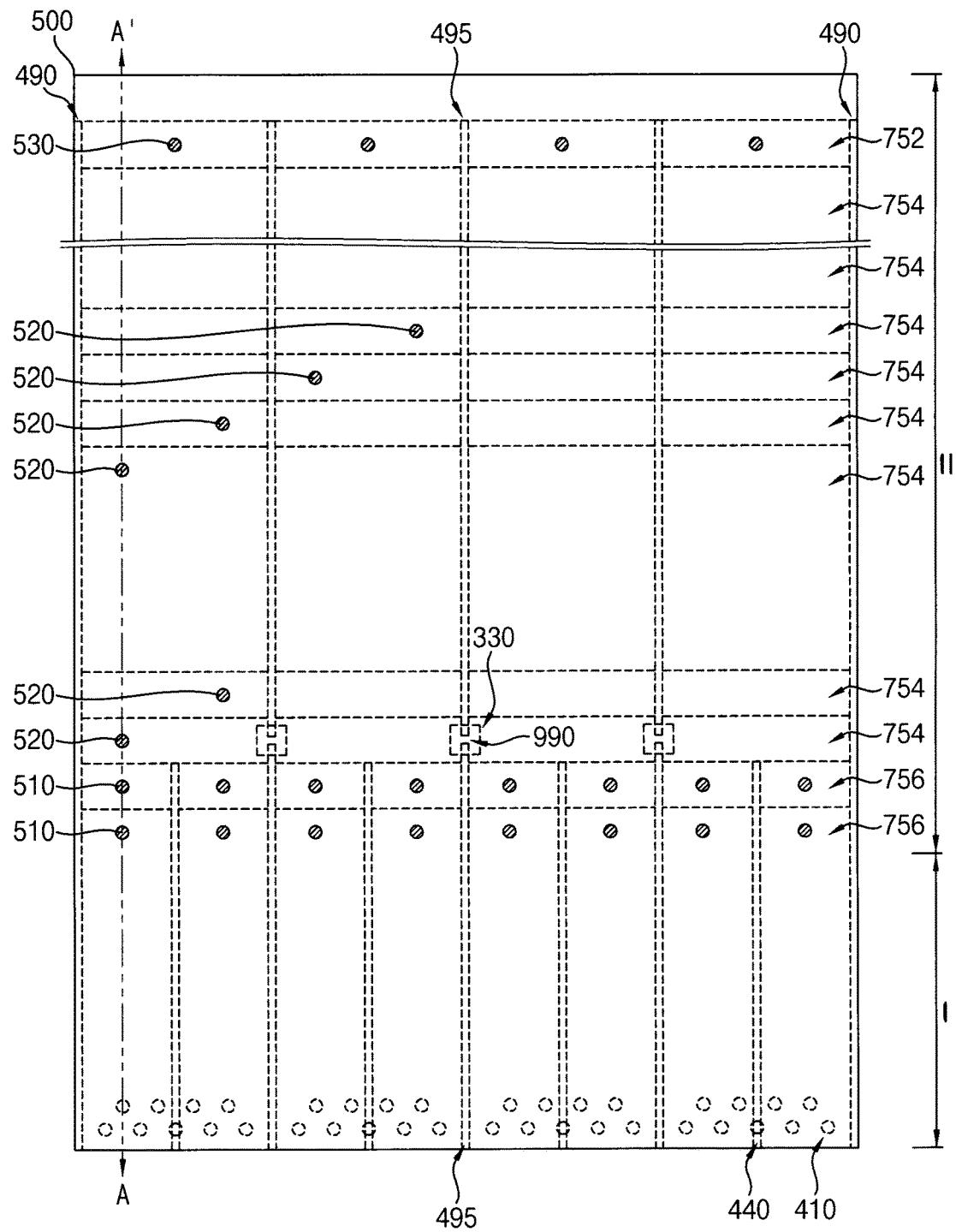
Figure 14:
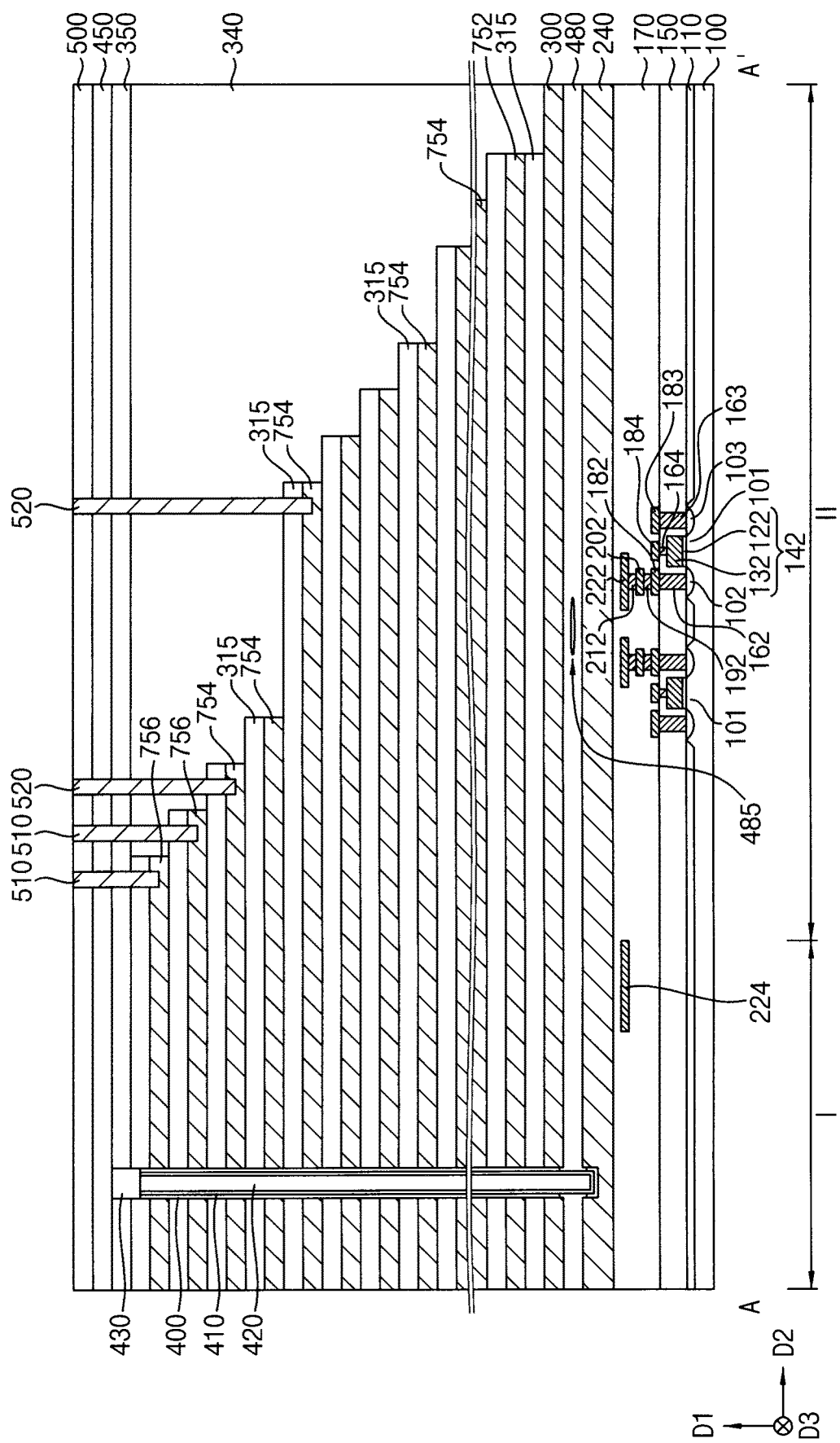

Referring to the exemplary embodiments of FIGS. 13 and 14, a sixth insulating interlayer 500 may be formed on the fifth insulating interlayer 450 and the third and fourth division patterns 490 and 495, and first, second and third upper contact plugs 510, 520 and 530 may be formed on the second region II of the substrate 100.

Each of the first to third upper contact plugs 510, 520 and 530 may extend in the first direction D1 through the third to sixth insulating interlayers 340, 350, 450 and 500 and the first insulation pattern 315, and may contact the pads of the third, second and first gate electrodes 756, 754 and 752, respectively. FIG. 13 shows one shared memory block including two memory blocks sharing word lines, and thus one second upper contact plug 520 at each level, eight first upper contact plugs 510 at each level, and four third upper contact plugs 530 at each level are shown to correspond to one second gate electrode 754 at each level, eight third gate electrodes 756 at each level, and four first gate electrodes 752 at each level, respectively.

However, exemplary embodiments of the present inventive concepts are not limited thereto and the first to third upper contact plugs 510, 520 and 530 may not be limited to the locations shown in the drawings, but may be freely arranged on pads of the third to first gate electrodes 756, 754 and 752, respectively.

As shown in the exemplary embodiment of FIGS. 15 and 16A, each of first to third through vias 562, 564 and 566 and a first vertical gate electrode 580 may be formed by forming a hole through the third to seventh insulating interlayers 340, 350, 450, 500 and 540, the mold, the support layer 300, the channel connection pattern 480, the CSP 240, and upper portion of the second insulating interlayer 170 and filling the hole with a conductive material. As shown in the exemplary embodiment of FIG. 16A, each of the first to third through vias 562, 564 and 566 may contact the twelfth lower wiring 222, and the first vertical gate electrode 580 may contact the thirteenth lower wiring 224. In comparison with the first vertical gate electrode 580 extending in the first direction D1, each of the first to third gate electrodes 752, 754 and 756 extending in the second direction D2 (e.g., a horizontal direction) may be referred to as a horizontal gate electrode.

Second to fourth insulation patterns 552, 554 and 556 may be formed on sidewalls of the first to third through vias 562, 564 and 566, respectively, and a fifth insulation pattern 570 may be formed on a sidewall of the first vertical gate electrode 580. Therefore, the first to third through vias 562, 564 and 566 and the first vertical gate electrode 580 may be electrically insulated from corresponding gate electrodes 752, 754 and 756 of the mold, the support layer 300, the channel connection pattern 480 and the CSP 240.

In an exemplary embodiment, the first to third through vias 562, 564 and 566 and the first vertical gate electrode 580 may include, a metal, a metal nitride, a metal silicide, etc., and the second to fifth insulation patterns 552, 554, 556 and 570 may include an oxide, such as silicon oxide, etc. However, exemplary embodiments of the present inventive concepts are not limited thereto.

In an exemplary embodiment, the first to third through vias 562, 564 and 566 may extend through second steps of the mold that may be disposed at positions corresponding to the first to third upper contact plugs 510, 520 and 530, respectively, in the second direction D2. The third through via 566 may extend through a portion of the support layer 300 not covered by the mold.

A common source contact plug may be further formed on the portion of the support layer 300 not covered by the mold.

In an exemplary embodiment, the first vertical gate electrode 580 may be formed on a portion of the first region I of the substrate 100 adjacent to the second region II of the substrate 100, and a plurality of first vertical gate electrodes 580 may be arranged in each of the second and third directions D2 and D3. In an exemplary embodiment, the first vertical gate electrode 580 may be formed at each of the opposite lateral sides in the third direction D3 of the second division pattern 440 in each memory group. In the exemplary embodiment of FIG. 15, seven first vertical gate electrodes 580 are shown at each of the opposite lateral sides in the third direction D3 of the second division pattern 440 in each memory group. However, exemplary embodiments of the present inventive concepts are not limited thereto and the numbers of the first vertical gate electrodes 580 and their positioning at each of the opposite lateral sides of the second division pattern 440 may vary in other exemplary embodiments.

In an exemplary embodiment, in a plan view (e.g., in a plane defined by the second and third directions D2, D3), each first vertical gate electrode 580 may have a shape of a circle, ellipse or regular polygon. However, exemplary embodiments of the present inventive concepts are not limited thereto.

In an exemplary embodiment, the first vertical gate electrode 580, the fifth insulation pattern 570 covering a sidewall of the first vertical gate electrode 580, and portions of the second gate electrodes 754 at a plurality of levels, respectively, surrounding the fifth insulation pattern 570 may form a first switching transistor 600. The portions of the second gate electrodes 754 may serve as a channel of the first switching transistor, and thus may be referred to as a second channel. For example, the first switching transistor 600 may include the first vertical gate electrode 580, the fifth insulation pattern 570 surrounding the first vertical gate electrode 580 and serving as a gate insulation pattern for the first vertical gate electrode 580, and the second channel 590 surrounding the gate insulation pattern and serving as a channel. In comparison with the first channel 410 extending in the first direction D1, the second channel 590 may be referred to as a horizontal channel, and each of second to fifth channels 590, 597 and 790 that will be described later may be also referred to as horizontal channels. The second gate electrodes 754 and the horizontal channels formed thereby may include polysilicon doped with impurities.

In an exemplary embodiment, one second transistor serving as a pass transistor may be formed under each memory block on the first region I of the substrate 100. The pass transistor may be electrically connected to a plurality of first vertical gate electrodes 580 in each memory block through the thirteenth lower wiring 224. Therefore, as many second transistors as the number of memory blocks in each shared memory block may be disposed under the shared memory block, and each second transistor may selectively apply electrical signals to a corresponding memory block, which may be referred to as a memory block selection transistor. In the drawings, two memory block selection transistors are shown under one shared memory block. However, exemplary embodiments of the present inventive concepts are not limited thereto.

Electrical signals applied to the second horizontal gate electrodes 754 which serve as the word lines may be controlled by the first switching transistor 600 including the first vertical gate electrodes 580 of a corresponding memory block to which electrical signals are applied by the memory block selection transistor.

Referring to the exemplary embodiment of FIG. 16B, a filling insulation pattern 243 may be further formed in a portion of the CSP 240 through which the first to third through vias 562, 564 and 566 and the first vertical gate electrode 580 extend.

As illustrated with reference to the exemplary embodiment of FIG. 4, the CSP 240 may be formed on the second insulating interlayer 170, and a hole may be formed in an area through which the first to third through vias 562, 564 and 566 and the first vertical gate electrode 580 extend. The filling insulation pattern 243 may fill the hole. In an exemplary embodiment, the filling insulation pattern 243 may include an oxide, such as silicon oxide, etc. or a nitride, such as silicon nitride, etc. However, exemplary embodiments of the present inventive concepts are not limited thereto.

As the filling insulation pattern 243 is formed previously, when the holes for the first to third through vias 562, 564 and 566 and the first vertical gate electrode 580 are formed, an etching process for removing a portion of the CSP 240 may be easily performed.

Figure 18:
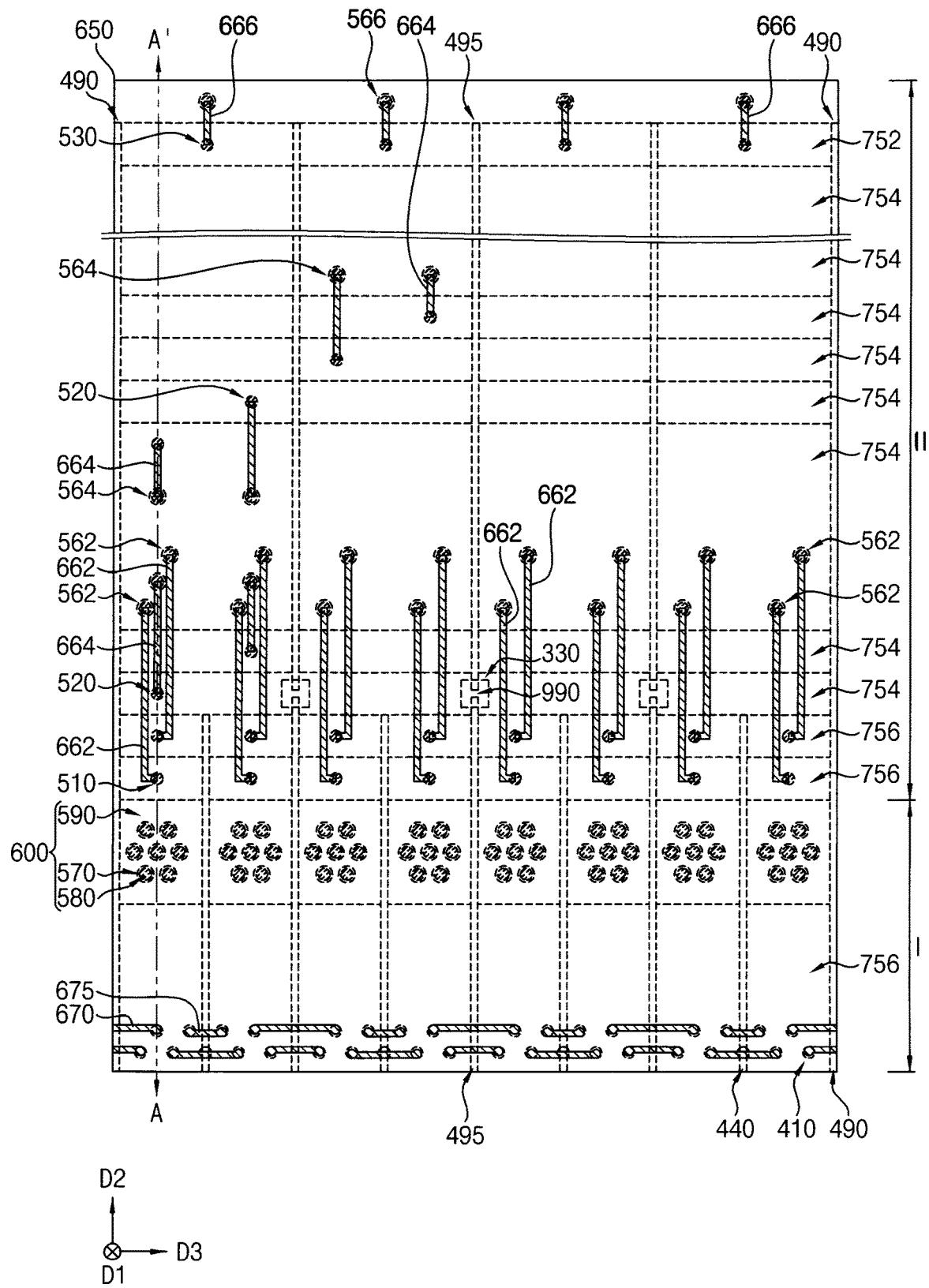
Figure 19:
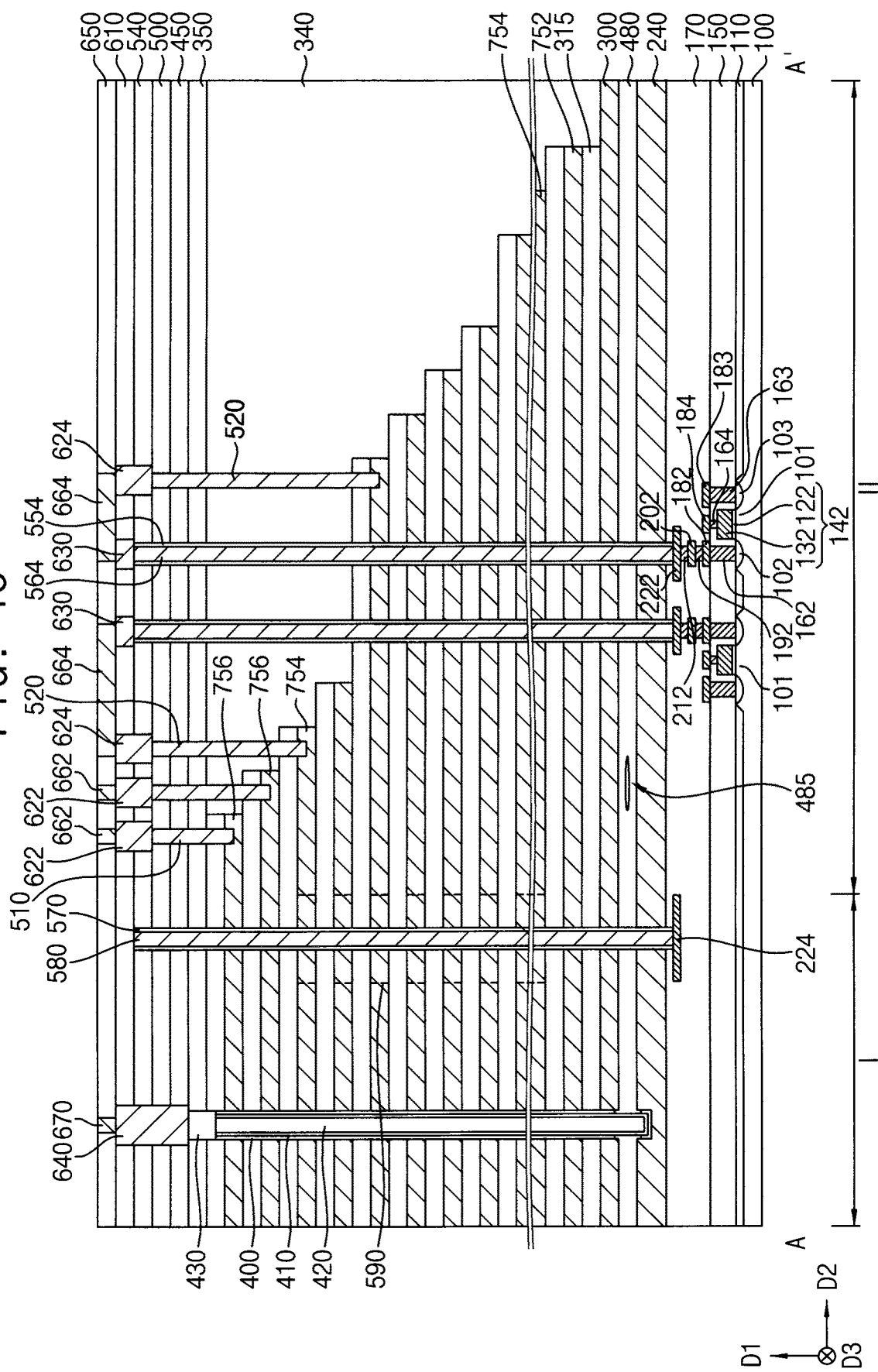

Referring to the exemplary embodiments of FIGS. 18 and 19, an eighth insulating interlayer 610 may be formed on the seventh insulating interlayer 540, the first to third through vias 562, 564 and 566, and the first vertical gate electrodes 580, and fourth and fifth upper contact plugs 622 and 624, a sixth upper contact plug, and seventh and eighth upper contact plugs 630 and 640 may be formed.

The fourth and fifth upper contact plugs 622 and 624 and the sixth upper contact plug may extend through the seventh and eighth insulating interlayers 540 and 610 to contact the first to third upper contact plugs 510, 520 and 530, respectively, the seventh upper contact plug 630 may extend through the eighth insulating interlayer 610 to contact a corresponding one of the first to third through vias 562, 564 and 566, and the eighth upper contact plug 640 may extend through the fifth to eighth insulating interlayers 450, 500, 540 and 610 to contact the capping pattern 430.

A ninth insulating interlayer 650 may be formed on the eighth insulating interlayer 610, the fourth and fifth upper contact plugs 622 and 624, the sixth upper contact plug, and the seventh and eighth upper contact plugs 630 and 640, and first to fifth upper wirings 662, 664, 666, 670 and 675 may be formed through the ninth insulating interlayer 650. For example, as shown in the exemplary embodiment of FIG. 19, the first to fifth upper wirings 662, 664, 666, 670 and 675 may extend through the entire thickness of the ninth insulating layer 650 in the first direction D1.

The first upper wiring 662 may contact the fourth upper contact plug 622 and the seventh upper contact plug 630 on the first through via 562, the second upper wiring 664 may contact the fifth upper contact plug 624 and the seventh upper contact plug 630 on the second through via 564, and the third upper wiring 666 may contact the sixth upper contact plug and the seventh upper contact plug 630 on the third through via 566.

Two eighth upper contact plugs 640 adjacent to each other in the third direction D3 may form a pair, and may be electrically connected with each other by a corresponding one of the fourth and fifth upper wirings 670 and 675. The fourth and fifth upper wirings 670 and 675 may be arranged in a zigzag pattern along the third direction D3.

Referring to the exemplary embodiments of FIGS. 20, 21A, 22 and 23, a tenth insulating interlayer 680 may be formed on the ninth insulating interlayer 650 and the first to fifth upper wirings 662, 664, 666, 670 and 675, and a first upper via 690 and a second upper via may be formed therethrough.

As shown in the exemplary embodiment of FIG. 22, the first upper via 690 may contact the fourth upper wiring 670, and the second upper via may contact the fifth upper wiring 675.

An eleventh insulating interlayer 700 may be formed on the tenth insulating interlayer 680, the first upper via 690 and the second upper via, and a sixth upper wiring 710 extending through the eleventh insulating interlayer 700 to contact the first upper via 690 and a seventh upper wiring 715 extending through the eleventh insulating interlayer 700 to contact the second upper via may be formed. For example, the sixth upper wiring 710 and the seventh upper wiring 715 may extend through the entire thickness of the eleventh insulating interlayer 700 in the first direction D1.

In an exemplary embodiment, each of the sixth and seventh upper wirings 710 and 715 may extend in the third direction D3, and may be connected to a plurality of first upper vias 690 and a plurality of second upper vias, respectively. In an exemplary embodiment, the sixth and seventh upper wirings 710 and 715 may serve as a bit line of the vertical memory device.

The vertical memory device may be manufactured by the above-described processes.

Referring to the exemplary embodiment of FIG. 21B, as illustrated with reference to FIG. 16B, the filling insulation pattern 243 may be further formed in the portion of the CSP 240 through which the first to third through vias 562, 564 and 566 and the first vertical gate electrode 580 extend therethrough.

The vertical memory device may structural characteristics as follows.

The vertical memory device may include the first transistors disposed on the second region II of the substrate 100, the second transistors disposed on the first region I of the substrate 100, the lower circuit patterns electrically connected to the first and second transistors, respectively, on the substrate 100, the CSP 240 disposed on the lower circuit patterns, the first to third horizontal gate electrodes 752, 754 and 756 spaced apart from each other in the first direction D1 and disposed on the CSP 240. Each of the first to third horizontal gate electrodes 752, 754, 756 may extend in the second direction D2 on the first and second regions I and II of the substrate 100. The first channels 410 extend in the first direction D1 through the first to third horizontal gate electrodes 752, 754 and 756 on the first region I of the substrate 100. The charge storage structures 400 are disposed on sidewalls of the first channels 410, respectively. The first vertical gate electrodes 580 extend in the first direction D1 through the first to third horizontal gate electrodes 752, 754 and 756 but are electrically insulated therefrom, and are electrically insulated from the first horizontal channel at a portion of each of the second horizontal gate electrodes 754 adjacent to the first vertical gate electrode 580. The vertical memory device may further include the first switching transistors 600 for controlling the electrical signals applied to the second horizontal gate electrodes 754 on the first region I of the substrate 100, the first to third upper contact plugs 510, 520 and 530 on the first to third horizontal gate electrodes 752, 754 and 756, respectively, to be electrically connected thereto on the second region II of the substrate 100, and the first to third through vias 562, 564 and 566 electrically connected to the first to third upper contact plugs 510, 520 and 530, respectively, on the second region IQ of the substrate 100, which may extend through the first to third horizontal gate electrodes 752, 754 and 756 (e.g., in the first direction D1) but may be electrically insulated from the first to third horizontal gate electrodes 752, 754 and 756. The first to third through vias 562, 564 and 566 may be electrically connected to corresponding first transistors, respectively, and the first switching transistors 600 may be electrically connected to corresponding second transistors, respectively.

As illustrated above, in the vertical memory device, word lines included in a plurality of memory blocks, respectively, may be shared to form a shared memory block. Therefore, the number of the upper circuit pattern for applying electrical signal to the shared word lines on the second region II of the substrate 100, (e.g., the second, fifth and seventh upper contact plugs 520, 624 and 630, the second upper wiring 664 and the second through via 564), the number of the first transistor electrically connected to the upper circuit pattern thereunder, and the number of the lower circuit pattern electrically connected to the first transistor may be reduced. Therefore, an area of the second region II of the substrate 100 may be reduced, and the layout freedom of the upper circuit pattern on the second region II of the substrate 100 may be increased.

The first switching transistor 600 electrically connected to each of the word lines and the second transistor electrically connected to the first switching transistor 600 serve as a pass transistor. Therefore, the word lines of respective memory blocks included in the shared memory block may be independently operated. For example, a memory block selection transistor may be further formed. The first switching transistor 600 may be formed on a portion of the first region I of the substrate 100 adjacent to the second region II of the substrate 100, and may not increase the area of the second region II of the substrate 100. Additionally, the first switching transistor 600 may include the first vertical gate electrode 580, the fifth insulation pattern 570 surrounding the first vertical gate electrode 580, and the second channel 590 surrounding the fifth insulation pattern 570. Therefore, there is a relatively small increase in the area of the vertical memory device.

For example, the second channel 590 of the first switching transistor 600 may use a portion of the second gate electrode 754, and obviates an additional process for forming the second channel 590. However, in an exemplary embodiment in which a portion of the second gate electrode 754 serves as the second channel 590, the second channel 590 may be formed to have an impurity concentration less than other portions of the second gate electrode 754, if necessary. In an exemplary embodiment in which the remaining portions of the second gate electrode 754 have an impurity concentration greater than the impurity concentration of the second channel 590, the other portions may have a relatively low resistance.

As illustrated with reference to the exemplary embodiment of FIG. 4, when the first insulation layer 310 and the first gate electrode layer 320 are alternately and repeatedly stacked on the support layer 300, the impurity concentration of an area where the second channel 590 will be formed and the impurity concentration of areas where the other portions of the second gate electrode 754 will be formed may be controlled so that different impurity concentrations may be implemented.

In an exemplary embodiment, the first transistor for transferring electrical signal applied by each driving circuit to the word line through the lower and upper circuit patterns and/or the second transistor for transferring electrical signal applied by each driving circuit to the first switching transistor 600 through the lower circuit pattern may not be formed. In this exemplary embodiment, the electrical signal may be transferred from each driving circuit to the word line or the first switching transistor 600 directly through the lower circuit pattern and/or the upper circuit pattern.

In an exemplary embodiment, the vertical memory device may not have the COP structure. In this exemplary embodiment, a peripheral circuit pattern instead of the lower circuit pattern may be formed on the third region of the substrate 100. For example, the first to third transistors, and the lower contact plugs, the lower vias, and the lower wirings electrically connected thereto may not be formed under the CSP 240 but may be formed on the third region of the substrate 100 to be electrically connected to the upper circuit pattern. However, even in this exemplary embodiment, the number of the first and second transistors and the circuit pattern electrically connected thereto may be reduced so as to increase the integration degree of the vertical memory device.

Hereinafter, the decrease of the area by the reduction of the number of the first transistor and the increase of the area by the addition of the second transistor will be particularly explained with reference to the comparative embodiment shown in FIG. 24.

Figure 24:
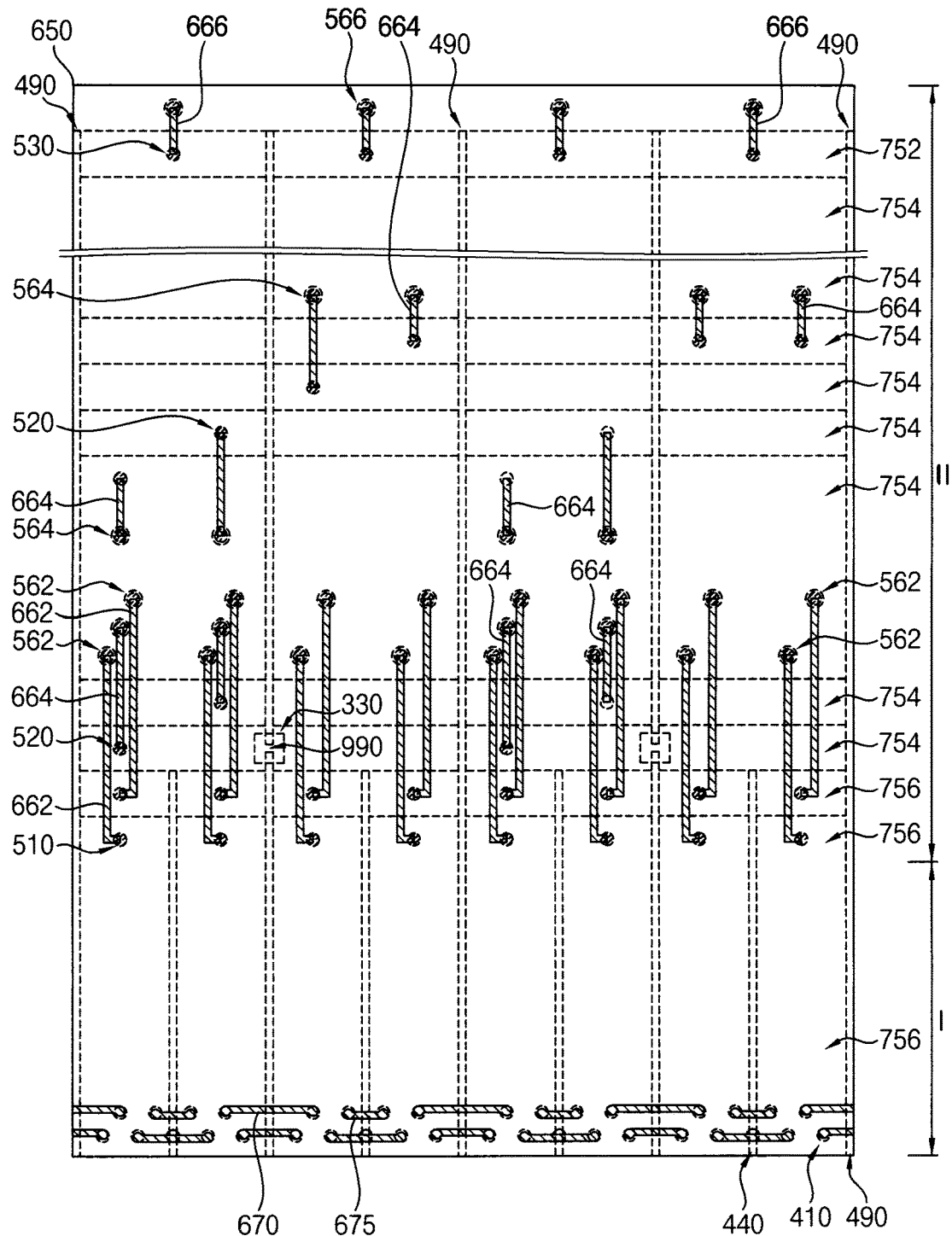
FIG. 24 is a plan view illustrating a vertical memory device in accordance with a comparative embodiment, which may correspond to FIG. 18.

FIG. 24 is a plan view illustrating a vertical memory device in accordance with a comparative embodiment, which may correspond to FIG. 18.

Referring to FIG. 24, in the vertical memory device in accordance with comparative embodiment, each memory block includes one word line at each level, and two memory blocks not sharing the word lines are disposed in the third direction D3. For example, the third division pattern 490 instead of the fourth division pattern 495 may be formed between the memory blocks which are entirely spaced apart from each other and do not share word lines. The vertical memory device does not include the first switching transistor 600 and the second transistor connected thereto.

In the vertical memory device of the comparative embodiment of FIG. 24, two word lines are formed at each level in the two memory blocks, respectively, and thus two upper circuit patterns may be formed to be connected thereto, respectively, and two first transistors serving as pass transistors may be formed thereunder. Accordingly, if each memory block includes word lines at 100 levels, respectively, 200 first transistors are formed in the two memory blocks on the second region II of the substrate 100.

Referring to FIL 18, in the vertical memory device in accordance with exemplary embodiments of the present inventive concepts, two word lines are formed at each level in the two memory blocks, respectively. However, the two word lines may be connected with each other and shared by the two memory blocks, which may form one shared memory block. Therefore, only one word line may be formed at each level. Accordingly, only one upper circuit pattern may be formed to be connected thereto, and only one first transistor may be formed thereunder. As a result, if each memory block includes word lines at 100 levels, respectively, 100 first transistors are formed in the shared memory block on the second region II of the substrate 100.

Meanwhile, one second transistor serving as a pass transistor for independently operating the word line in an on-off manner in each memory block may be formed in each memory block in the comparative embodiment shown in FIG. 24. Therefore, two second transistors may be formed on the first region I of the substrate 100.

In the vertical memory device in accordance with an exemplary embodiment of the present inventive concepts, 102 transistors are needed to independently operate the word lines in each memory block, which is significantly less than 200 transistors needed to independently operate the word lines in each memory block in the vertical memory device in accordance with comparative embodiment. Further, if the shared memory block includes more than two memory blocks, the number of transistors needed in the shared memory block may be much reduced.

Figure 25:
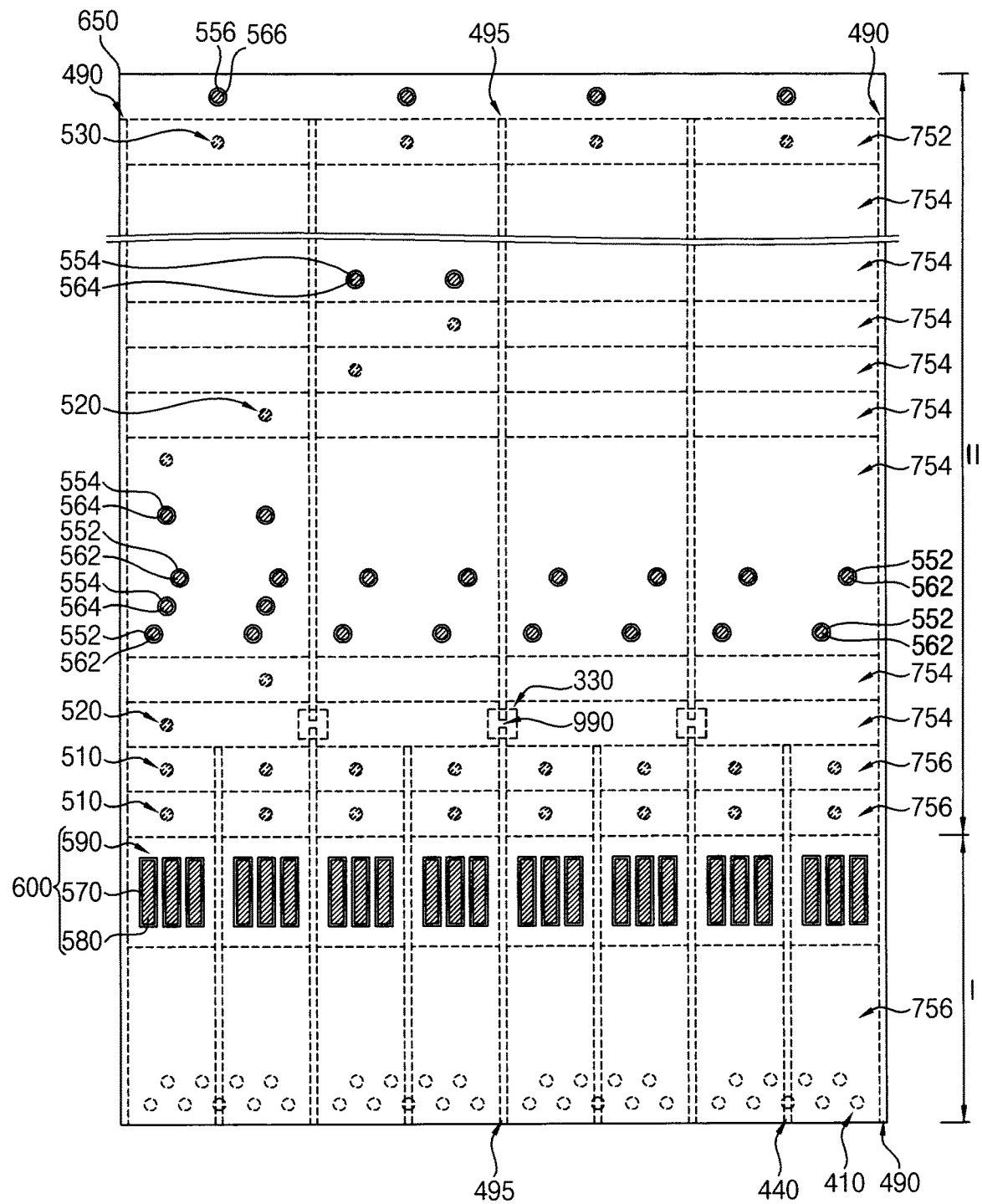
FIGS. 25 and 26 are plan views illustrating vertical memory devices in accordance with exemplary embodiments of the present inventive concepts, which may correspond to FIG. 15.
Figure 26:
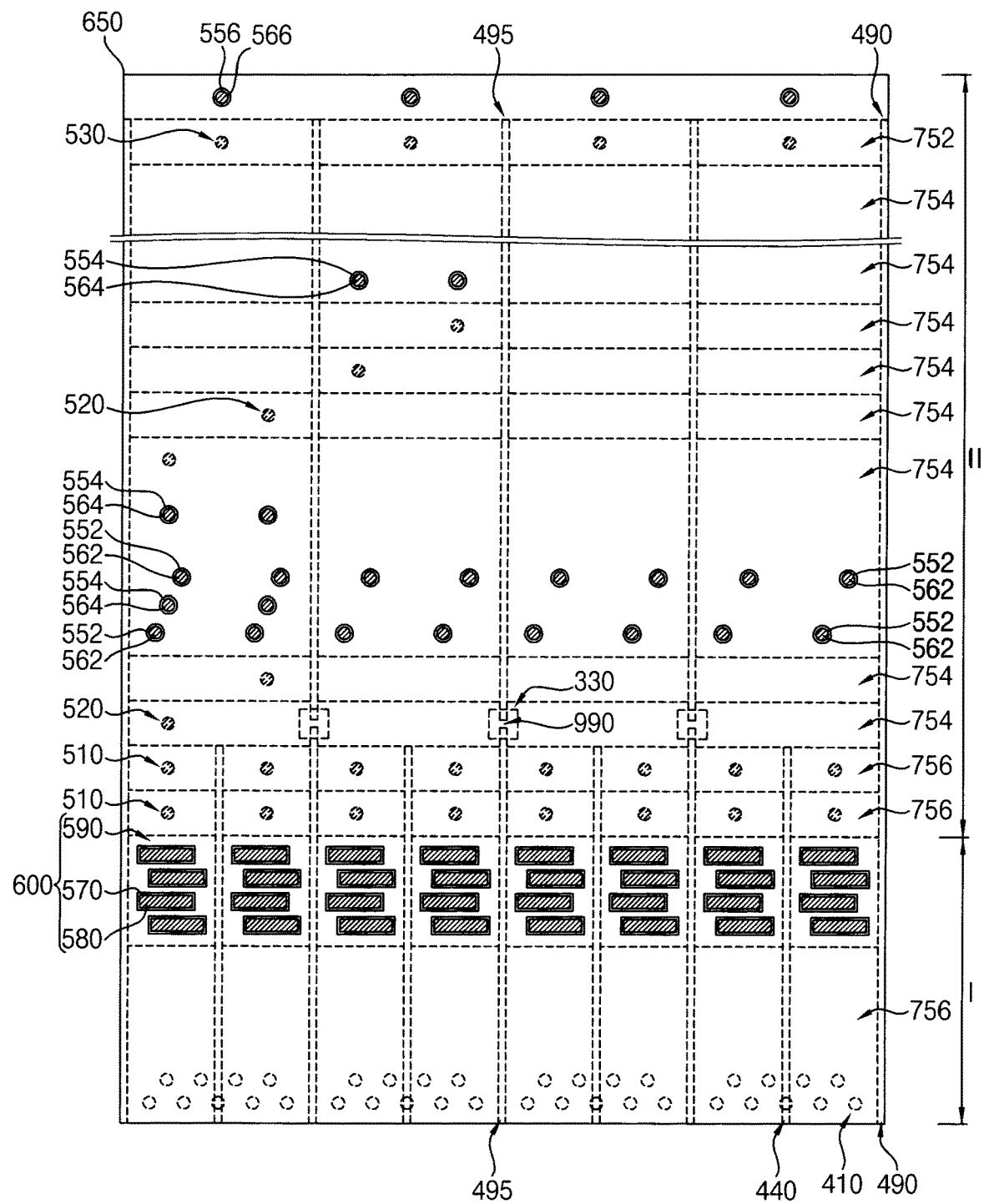

FIGS. 25 and 26 are plan views illustrating vertical memory devices in accordance with exemplary embodiments of the present inventive concepts, which may correspond to FIG. 15.

Referring to the exemplary embodiment of FIG. 25, the first vertical gate electrode 580 of the first switching transistor 600 may have a bar shape extending in the second direction D2 in a plan view (e.g., in a plane defined in the second and third directions D2, D3), and a plurality of the first vertical gate electrodes 580 may be spaced apart from each other in the third direction D3.

Alternatively, referring to the exemplary embodiment of FIG. 26, the first vertical gate electrode 580 of the first switching transistor 600 may have a bar shape extending in the third direction D3 in a plan view (e.g., in a plane defined in the second and third directions D2, D3), and a plurality of first vertical gate electrodes 580 may be spaced apart from each other in the second direction D2. In an exemplary embodiment, the first vertical gate electrodes 580 may be arranged in a zigzag pattern along the second direction D2 in which lateral ends in the third direction D3 of adjacent first vertical gate electrodes 580 are offset from each other.

However, exemplary embodiments of the present inventive concept are not limited thereto, and the first vertical gate electrodes 580 may be arranged with a combination of two or more of the arrangements shown in the exemplary embodiments of FIGS. 15, 25 and 26.

Figure 27:
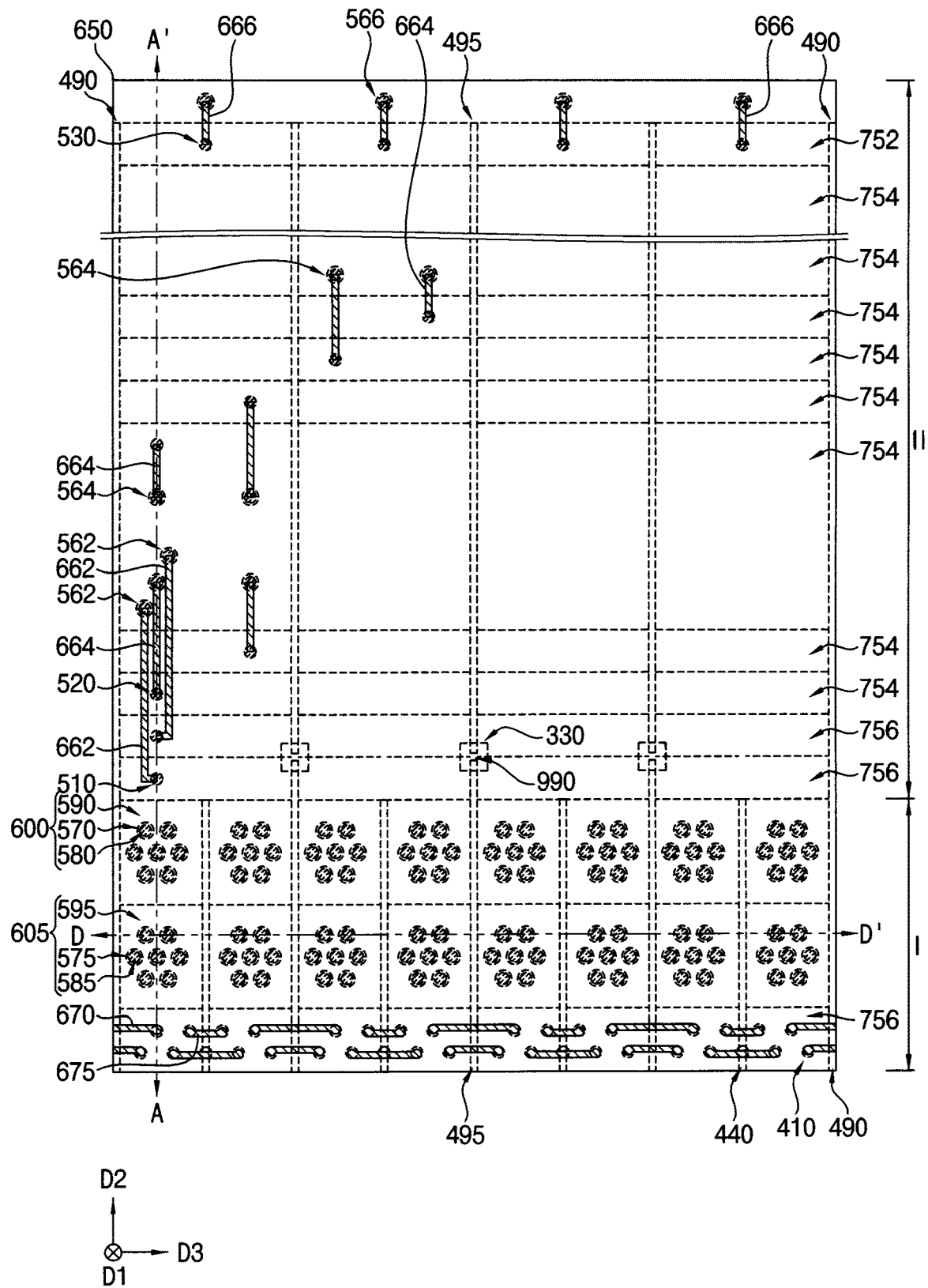
FIGS. 27 to 29 are a plan view and cross-sectional views illustrating a vertical memory device in accordance with exemplary embodiments of the present inventive concepts.
Figure 28:
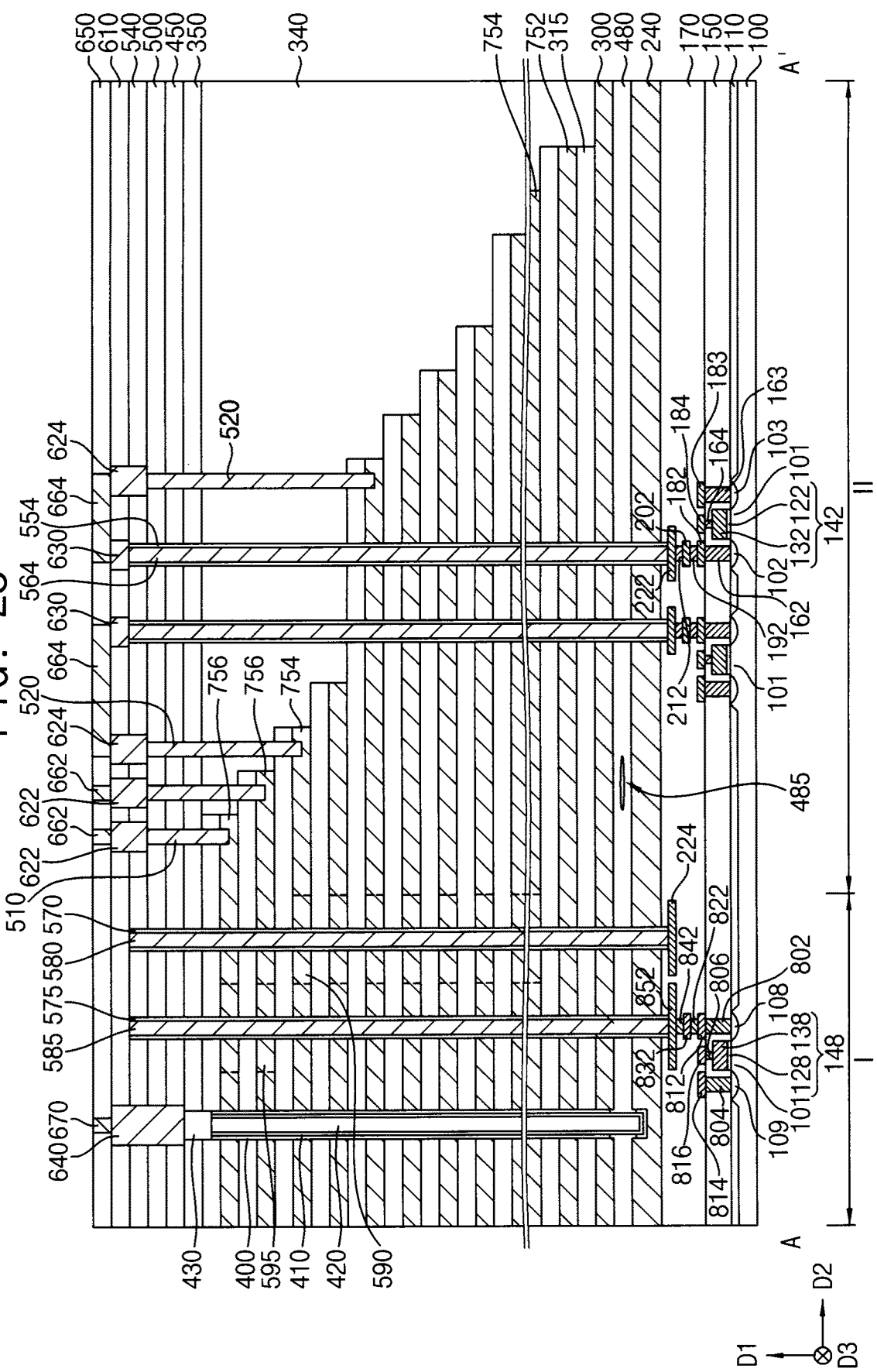
Figure 29:
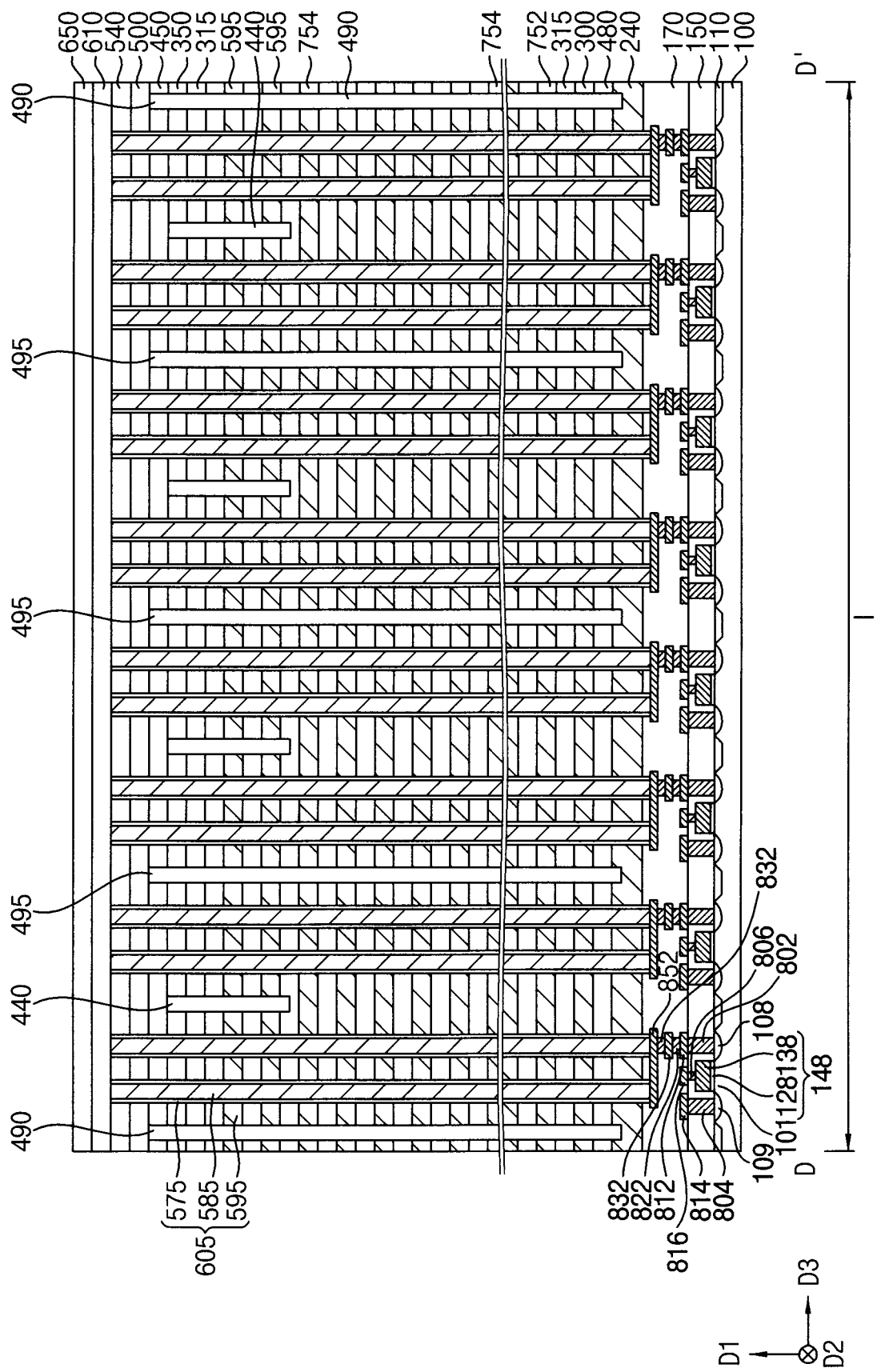

FIGS. 27 to 29 are a plan view and cross-sectional views illustrating a vertical memory device in accordance with exemplary embodiments of the present inventive concepts. FIG. 27 is the plan view, FIG. 28 is a cross-sectional view taken along a line A-A' of FIG. 27, and FIG. 29 is a cross-sectional view taken along a line D-D' of FIG. 27.

Referring to the exemplary embodiments of FIGS. 27 to 29, a shared memory block sharing word lines included in two memory blocks may also share SSLs at each level of the two memory blocks.

Figure 20:
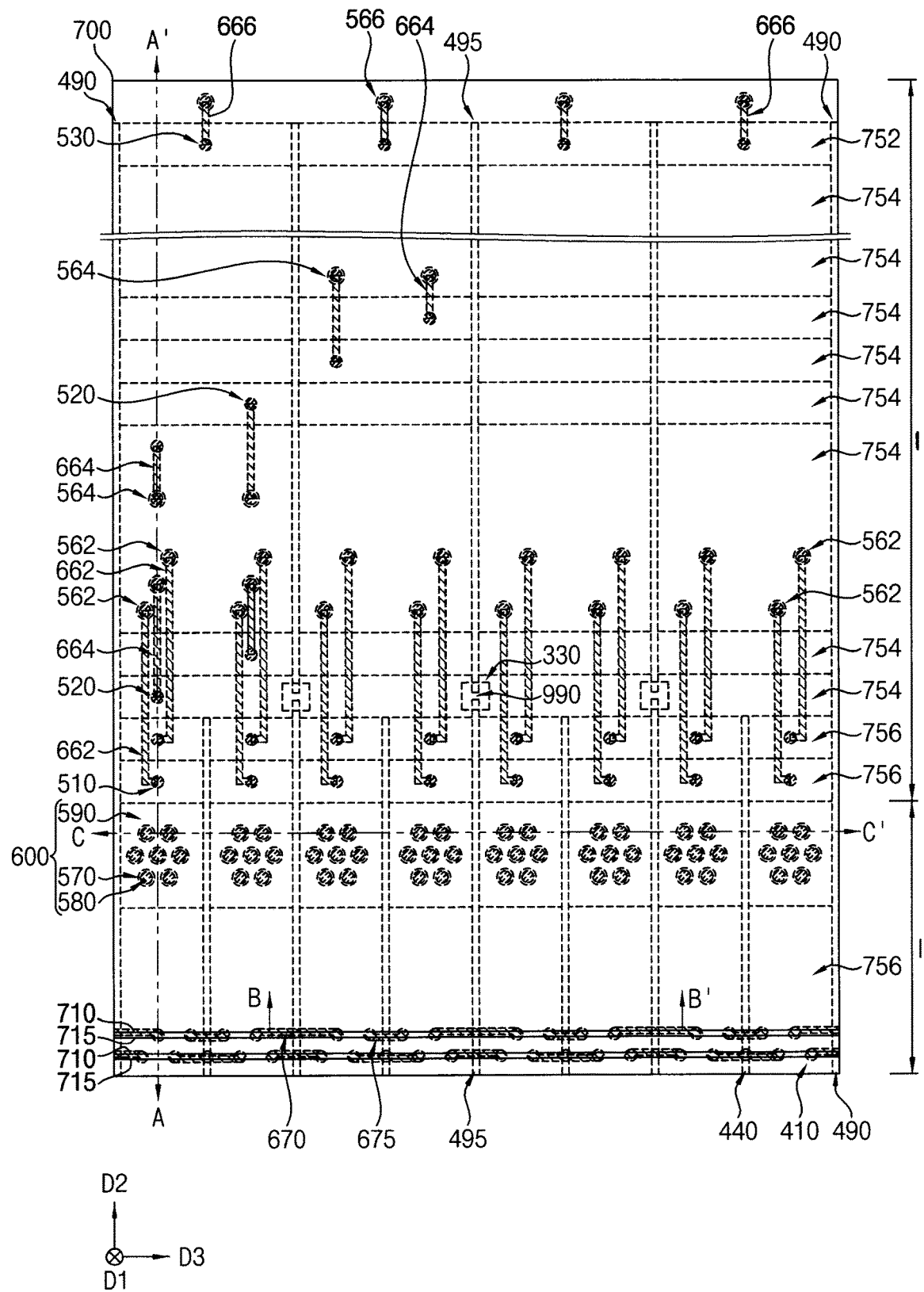

Therefore, in contrast with the second division pattern 440 of the exemplary embodiment of FIG. 20 which entirely divides each of the third gate electrodes 756 at the upper two levels in the third direction D3 which, respectively, serve as the SSL, the second division pattern 440 of the exemplary embodiment of FIG. 27 may extend in the second direction D2 only on the first region I of the substrate 100, and thus may not divide each of the third gate electrodes 756 at the upper two levels, respectively, in the third direction D3.

In an exemplary embodiment, the second division pattern 440 may extend in the second direction D2 outwardly from a central portion in the second direction of the first region I of the substrate 100, and an end in the second direction D2 of the second division pattern 440 may be coplanar in the second direction D2 with an end in the second direction D2 of the first region I of the substrate 100, such as a first end in the second direction D2 of the first switching transistor 600 distal to the central portion of the first region I of the substrate 100. Alternatively, the end in the second direction D2 of the second division pattern 440 may be aligned with a second end in the second direction D2 of the first switching transistor 600 proximate to the central portion of the first region I of the substrate 100. However, exemplary embodiments of the present inventive concepts are not limited thereto, and the end of the second division pattern 440 may be located in any position between the first and second ends. Further, in an exemplary embodiment, the second division pattern 440 may not be formed.

The first connecting portion 990 of the mold in the shared memory block may extend in the first direction D1 downwardly to a boundary area between an uppermost step and the second highest step, and the first division pattern 330 may overlap the first connecting portion 990 in the first direction D1.

Therefore, in the shared memory block shown in the exemplary embodiment of FIG. 27, not only the word lines at each level but also the SSLs at each level may not be divided and are shared. Accordingly, one first upper contact plug 510, one fourth upper contact plug 622, one first upper wiring 662, one first through via 562, and one first transistor may be formed on the second region II of the substrate 100. Therefore, when compared to the eight SSLs at each level and the upper circuit patterns electrically connected thereto as shown in the exemplary embodiment of FIG. 20, the area of the second region II of the substrate 100 may be significantly reduced.

A second switching transistor 605 may be further formed to be close to the first switching transistor 600 on the first region I of the substrate 100. The second switching transistor 605 may be adjacent to the first switching transistor 600 in the second direction D2. The second switching transistor 605 may include a second vertical gate electrode 585, a sixth insulation pattern 575 surrounding the second vertical gate electrode 585, and a third channel 595 surrounding the sixth insulation pattern 575. As the second channel 590 of the first switching transistor 600 is a portion of the second gate electrode 754, the third channel 595 of the second switching transistor 605 may be also a portion of the third gate electrode 756. In an exemplary embodiments, the third channel 595 may have an impurity concentration that is different from other portions of the third gate electrode 756. For example, in an exemplary embodiment, the third channel 595 may have a lower impurity concentration than other portions of the third gate electrode 756. In an exemplary embodiment, the second switching transistor 605 may be disposed between the first switching transistor 600 and the first channels 410 (e.g., in the second direction D2).

In an exemplary embodiment, a fourth transistor serving as a pass transistor may be formed under the second switching transistor 605 to be electrically connected thereto.

As shown in the exemplary embodiment of FIG. 28, the fourth transistor may include a fourth lower gate structure 148, and seventh and eighth impurity regions 108 and 109 serving as source/drains, respectively, at upper portions of the active region 101. The fourth lower gate structure 148 may include a fourth gate insulation pattern 128 and a fourth lower gate electrode 138 sequentially stacked on the substrate 100 (e.g., in the first direction D1).

Tenth and eleventh lower contact plugs 802 and 804 extending in the first direction D1 through the first insulating interlayer 150 to contact the seventh and eighth impurity regions 108 and 109, respectively, and a twelfth lower contact plug 806 contacting the fourth lower gate electrode 138 may be formed. Additionally, fifteenth to seventeenth lower wirings 812, 814 and 816 may be formed on the tenth to twelfth lower contact plugs 802, 804 and 806, respectively.

A seventh lower via 822, an eighteenth lower wiring 832, an eighth lower via 842 and a nineteenth lower wiring 852 may be sequentially stacked on the fifteenth lower wiring 812 (e.g., in the first direction D1). The fourth lower gate structure 148 of the fourth transistor may be electrically connected to a driving circuit through the twelfth lower contact plug 806 and the seventeenth lower wiring 816, and the eighth impurity region 109 of the fourth transistor may be electrically connected to a driving circuit through the eleventh lower contact plug 804 and the sixteenth lower wiring 814.

As the shared memory block shares the SSLs at each level, eight fourth transistors may be connected to the shared SSL to apply electrical signal so that eight portions of the shared SSL may be independently operated, and thus the fourth transistor may be referred to as an SSL selection transistor. However, the shared SSL may be formed at two levels, and thus two first transistors and eight fourth transistors may make ten transistors in total, which may be less than sixteen transistors that is the number of the transistors when the shared memory block does not share the SSLs as shown in the exemplary embodiment of FIG. 20.

Figure 30:
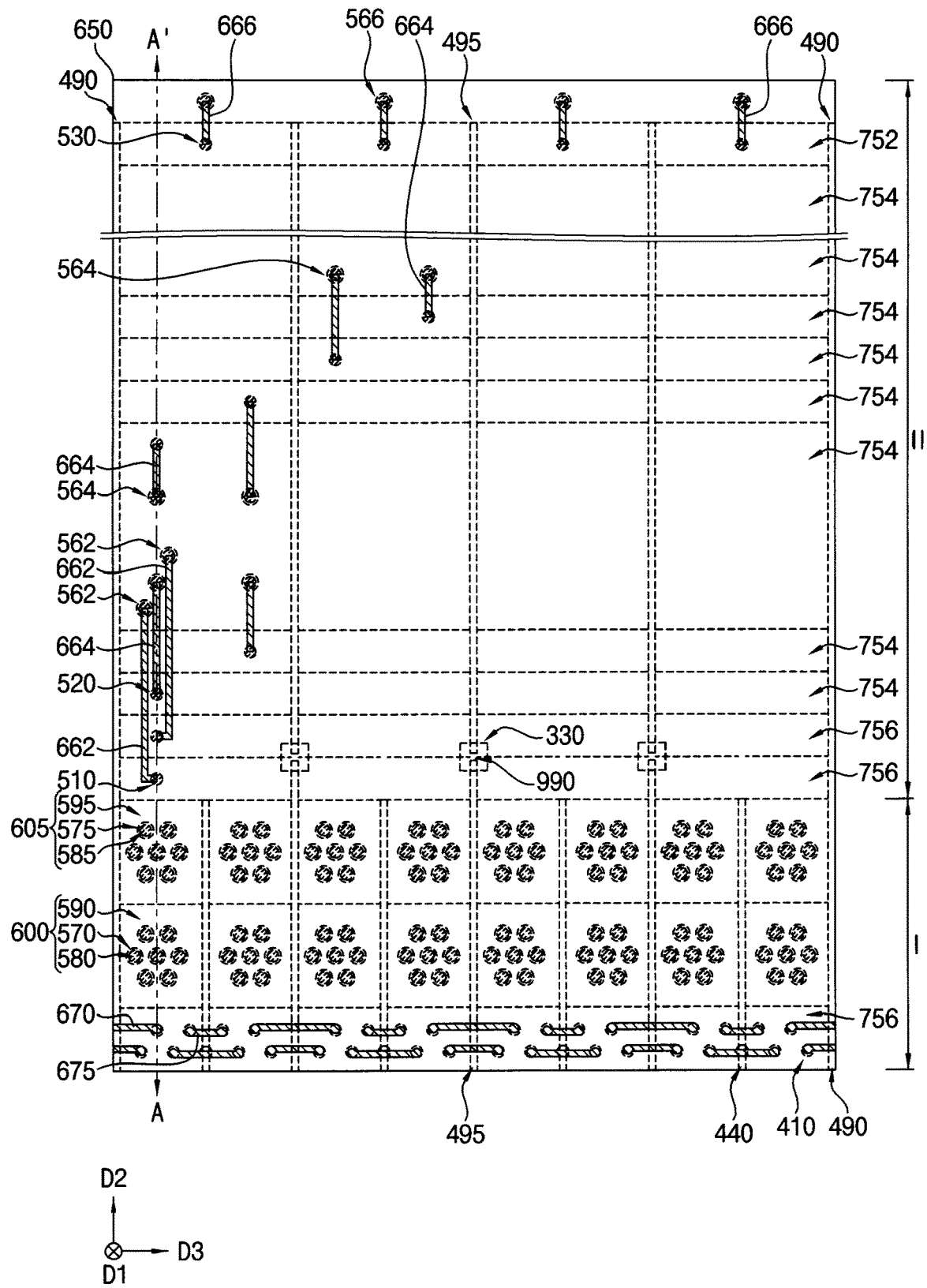
FIG. 30 is a vertical memory device in accordance with an exemplary embodiment of the present inventive concepts.

FIG. 30 is a vertical memory device in accordance with an exemplary embodiment of the present inventive concepts.

Referring to the exemplary embodiment of FIG. 30, unlike the layout of the exemplary embodiment of FIG. 29 in which the first channels 410, the second switching transistor 605 and the first switching transistor 600 are disposed in this order from the central portion of the first region I of the substrate 100 toward the end thereof in the second direction D2, the layout of the exemplary embodiment of FIG. 30 has the first channels 410, the first switching transistor 600 and the second switching transistor 605 arranged in this order in the second direction from the central portion of the first region I of the substrate 100.

The second transistor and the fourth transistor may be formed under the first and second switching transistors 600 and 605, respectively.

Figure 31:
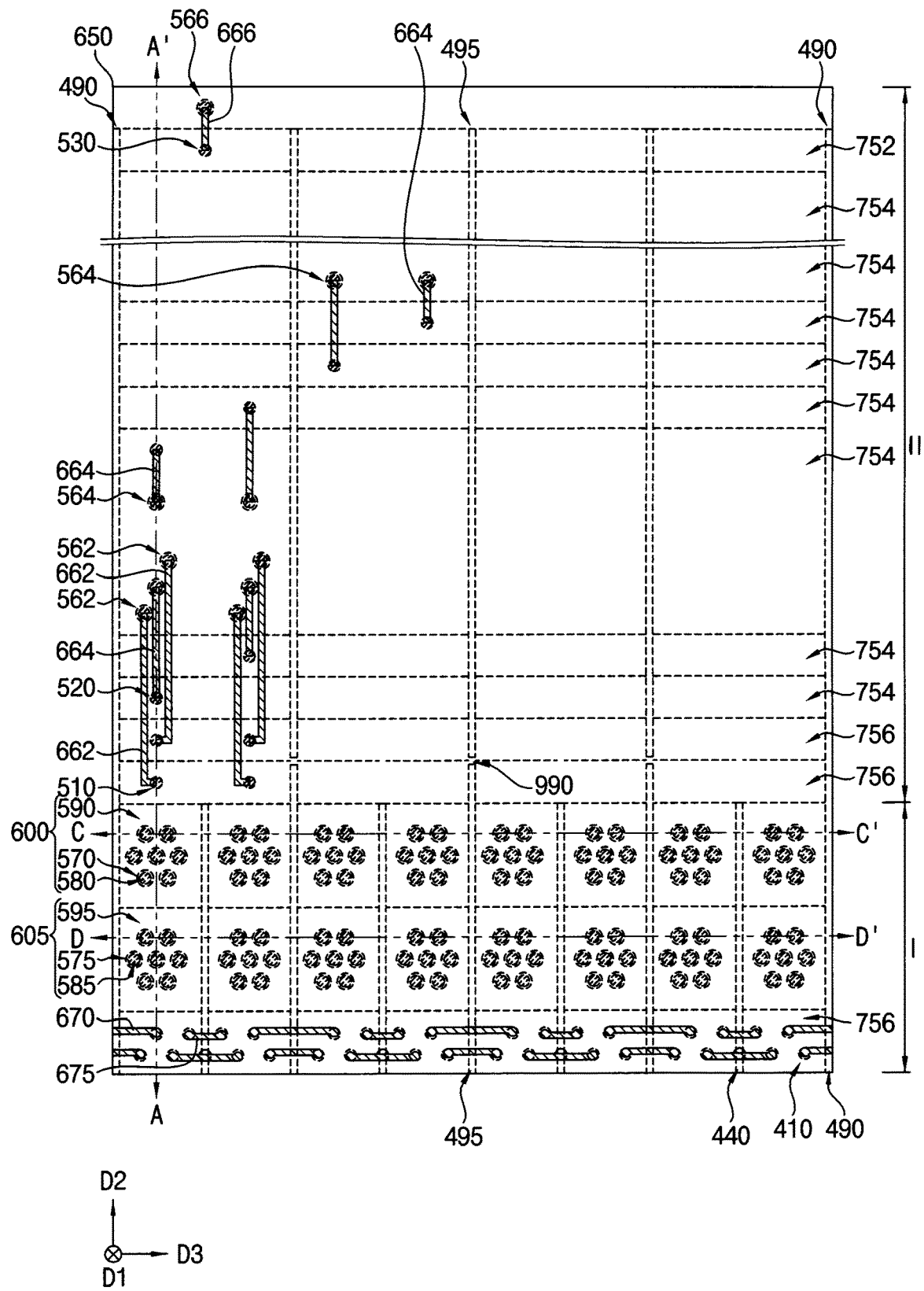
Figure 32B:
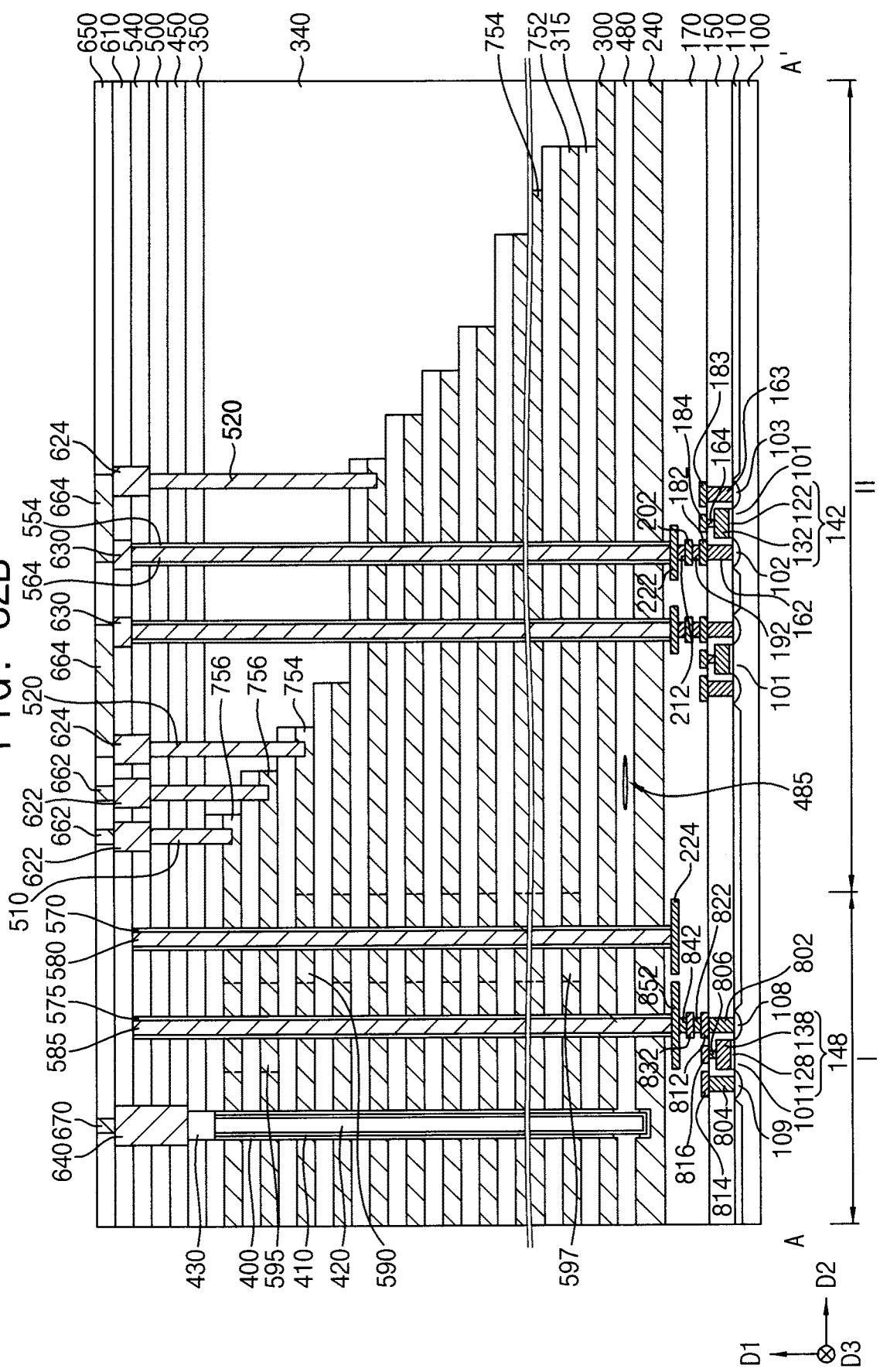
Figure 33A:
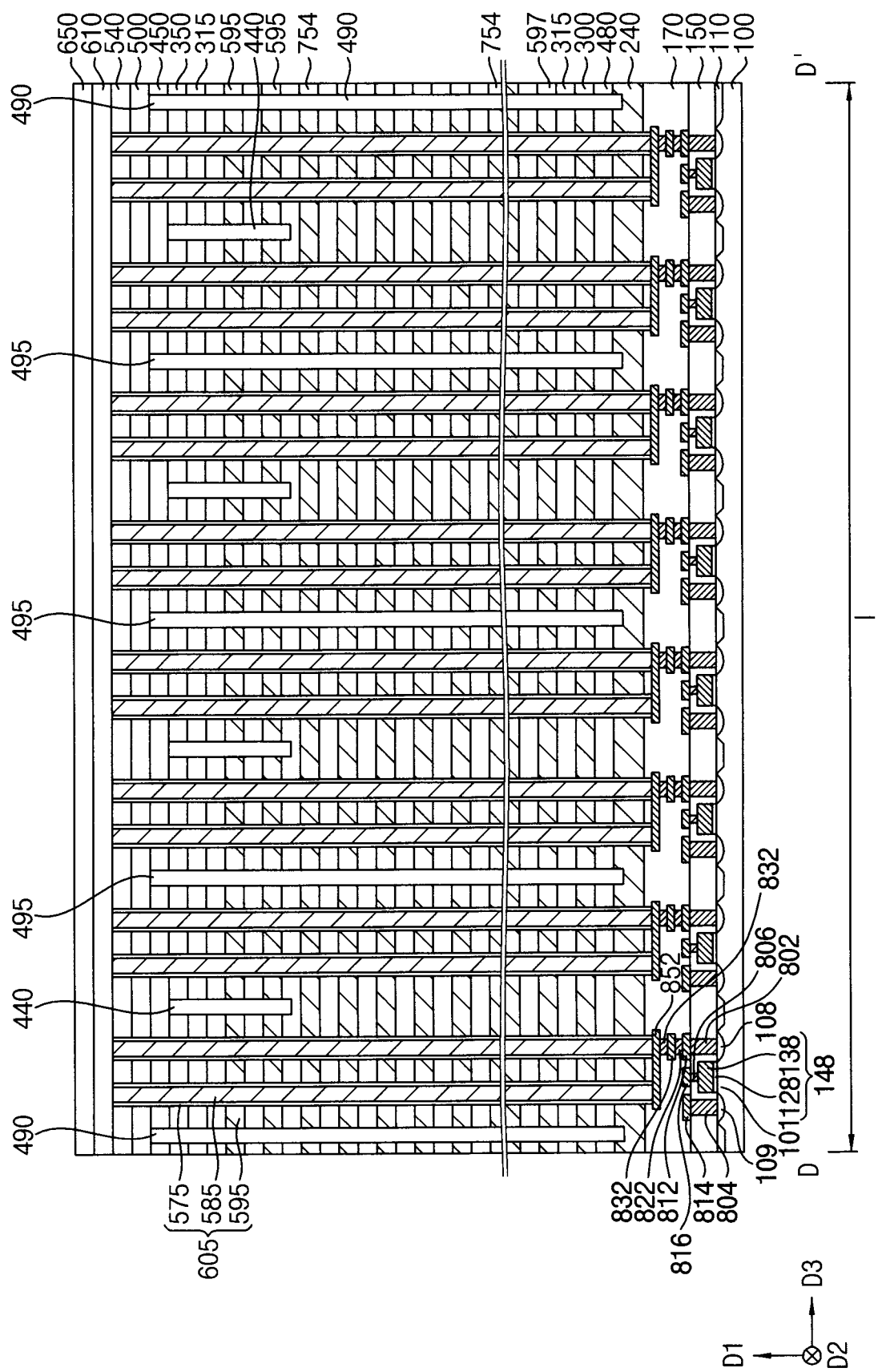

FIGS. 31, 32A, 32B, 33A and 33B are a plan view and cross-sectional views illustrating a vertical memory device in accordance with exemplary embodiments of the present inventive concepts. FIG. 31 is the plan view, FIGS. 32A and 32B are cross-sectional views taken along a line A-A' of FIG. 31, and FIGS. 33A and 33B are cross-sectional views taken along a line D-D' of FIG. 31.

Referring to the exemplary embodiments of FIGS. 31, 32A and 33A, the shared memory block sharing word lines included in two memory blocks may also share GSLs therein.

Therefore, in comparison with the exemplary embodiment of FIG. 20, the first division pattern 330 may not be formed. Four GSLs in the shared memory block may be connected with each other by the connecting pattern of the gate electrode in the first connecting portion 990 of the mold.

For example, as shown in the exemplary embodiment of FIG. 31, the shared memory block may include one first gate electrode 752 serving as a GSL, and one upper circuit pattern, one lower circuit pattern, and one first transistor may be connected to the GSL. Additionally, each of the fourth transistors in the shared memory block may be electrically connected to the third switching transistor to selectively apply electrical signals to the four portions of the GSL. Therefore, the four portions of the GSL may be independently operated, and thus may be referred to as a GSL selection transistor. For example, the fourth transistor may serve both as the SSL selection transistor and the GSL selection transistor. However, for example, four fourth transistors may be formed in each memory block, and two portions of the GSL may be independently operated in each memory block. Therefore, in an exemplary embodiment, two fourth transistors may form a pair, and two pairs of the fourth transistors may apply electrical signal to the third switching transistor.

As shown in the exemplary embodiment of FIG. 32A, the third switching transistor may include the second vertical gate electrode 585, the sixth insulation pattern 575 surrounding the second vertical gate electrode 585, and a fourth channel 597 surrounding the sixth insulation pattern 575. The fourth channel 597 may have an impurity concentration that is different from other portions of the first gate electrode 752. For example, in an exemplary embodiment, the impurity concentration of the fourth channel 597 may be lower than the other portions of the first gate electrode 752.

In another exemplary embodiment, referring to FIGS. 31, 32B and 33B, the second transistor, instead of the fourth transistor, may serve both as a block selection transistor and a GSL selection transistor. The third switching transistor may include the first vertical gate electrode 580, the fifth insulation pattern 570 surrounding the first vertical gate electrode 580, and the fourth channel 597 surrounding the fifth insulation pattern 570.

As illustrated above, two portions of the GSL may be independently operated in each memory block. Therefore, in comparison with the exemplary embodiments of FIGS. 1 to 23, two second transistors may be formed in each memory block to apply electrical signal to the third switching transistor. The two second transistors in each memory block may form a pair, and may apply electrical signal to the first switching transistor 600.

FIGS. 34, 35A, 35B, 36A, 36B and 37 are a plan view and cross-sectional views illustrating a vertical memory device in accordance with exemplary embodiments of the present inventive concepts. FIG. 34 is the plan view corresponding to FIG. 15, and FIGS. 35A, 35B, 36A, 36B and 37 are cross-sectional views taken along a line E-E' of FIG. 34.

Figure 35A:
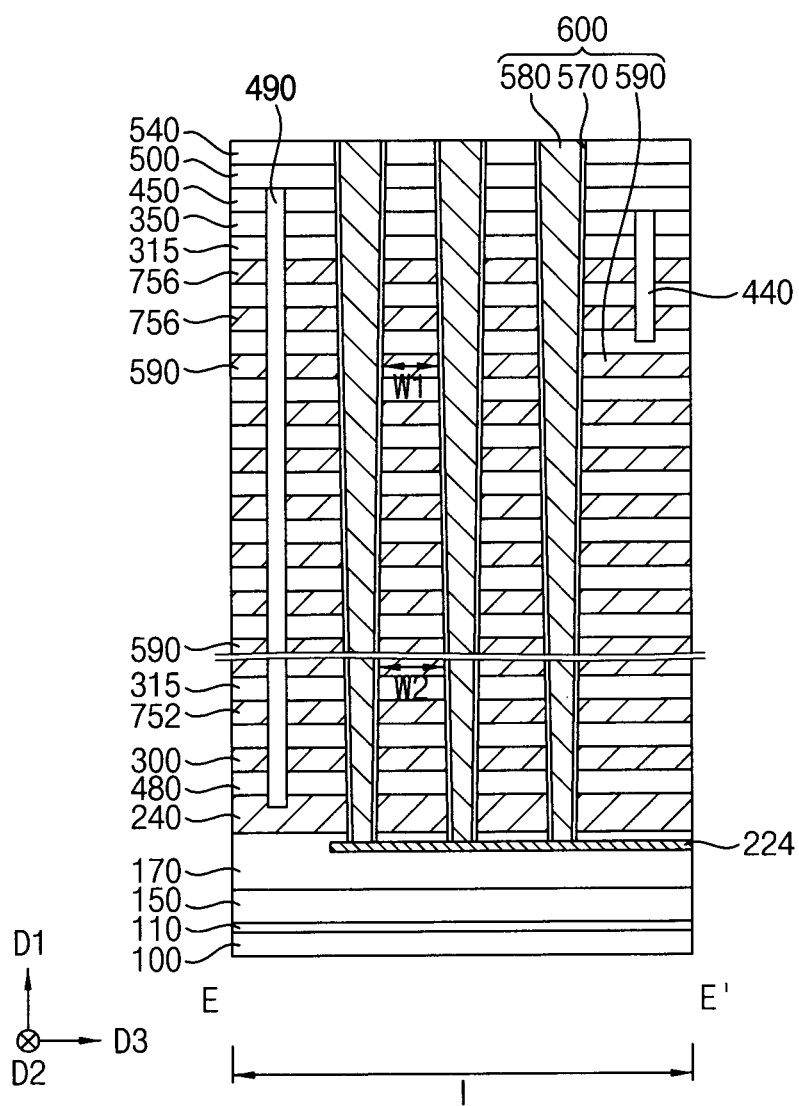

Referring to the exemplary embodiments of FIGS. 34 and 35A, each of the first vertical gate electrodes 580 may have a slanted sidewall, and a width (e.g., length in the third direction D3) of each of the first vertical gate electrodes 580 may gradually decrease from a top toward a bottom thereof.

Accordingly, a distance between adjacent first vertical gate electrodes 580 may increase from a top toward a bottom thereof. For example, as shown in the exemplary embodiment of FIG. 35A, a first width W1 of a first portion of the second channel 590 at an uppermost level of the second gate electrodes 754 between adjacent first vertical gate electrodes 580 may be less than a second width W2 of a second portion of the second channel 590 at a lowermost level of the second gate electrodes 754 between the adjacent first vertical gate electrodes 580. Therefore, when current flows in the second channel 590 in the horizontal direction, such as in a direction of a line F-F' shown in the exemplary embodiment of FIG. 34, a resistance of the portion of the second channel 590 at the uppermost level of the second gate electrodes 754 may be greater than a resistance of the portion of the second channel 590 at the lowermost level of the second gate electrodes 754.

Accordingly, to decrease the resistance difference between upper and lower levels of the second channels 590 to maintain constant electric characteristics of the second channels 590, the impurity concentrations of the second channels 590 at respective levels including polysilicon doped with n-type impurities may be adjusted. For example, as illustrated with respect to the exemplary embodiment of FIG. 4, when the first insulation layer 310 and the first gate electrode layer 320 are alternately and repeatedly stacked on the support layer 300, the first gate electrode layers 320 may be deposited such that the impurity concentrations of the first gate electrode layers 320 may increase from a lowermost level toward an uppermost level. Accordingly, even though an upper level of the second channels 590 has a relatively small area and there is a decreased width between adjacent first vertical gate electrodes 580, the upper level of the second channels 590 may have a relatively high impurity concentration to have a resistance similar to the resistance of a lower level of the second channels 590.

Figure 35B:
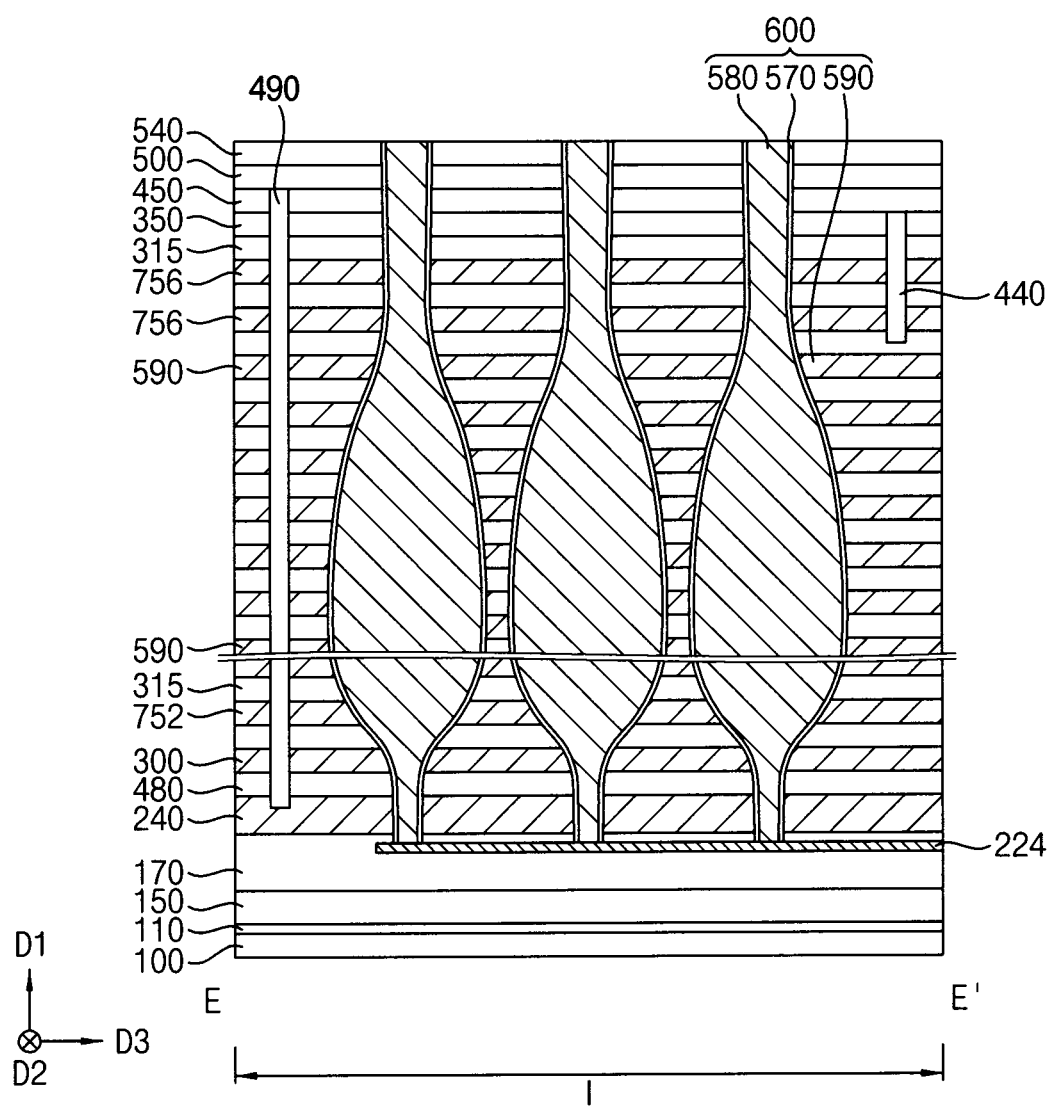

Referring to the exemplary embodiment of FIG. 35B, each of the first vertical gate electrodes 580 may include a lower portion, a central portion and an upper portion sequentially stacked (e.g., in the first direction D1). A width (e.g., length in the third direction D3) of the central portion may be greater than a width of the upper portion. The width of the upper portion may be greater than a width of the lower portion.

In an exemplary embodiment, an impurity concentration of one of the second gate electrodes 754 at a central level may be greater than an impurity concentration of one of the second gate electrodes 754 at an upper level. The impurity concentration of the second gate electrode 754 at the upper level may be greater than an impurity concentration of one of the second gate electrodes 754 at a lower level. Therefore, even though one of the second channels 590 at the central level, which is a portion of the one of the second gate electrodes 754 at the central level, has a relatively small area, it may have a relatively high impurity concentration to have a resistance similar to that of one of the second channels 590 at the upper level or one of the second channels 590 at the lower level.

As shown in the exemplary embodiments of FIGS. 35A and 35B, a width (e.g., length in the third direction D3) of the first vertical gate electrode 580 may vary along the first direction D1, and an impurity concentration of one of the second gate electrodes 754 (e.g., the second channel 590) at the same level as a first portion of one of the first vertical gate electrodes 580 having a relatively large width may be greater than an impurity concentration of one of the second gate electrode 754 at the same level as a second portion of one of the first vertical gate electrode 580 (e.g., the second channel 590) having a relatively small width.

Figure 36A:
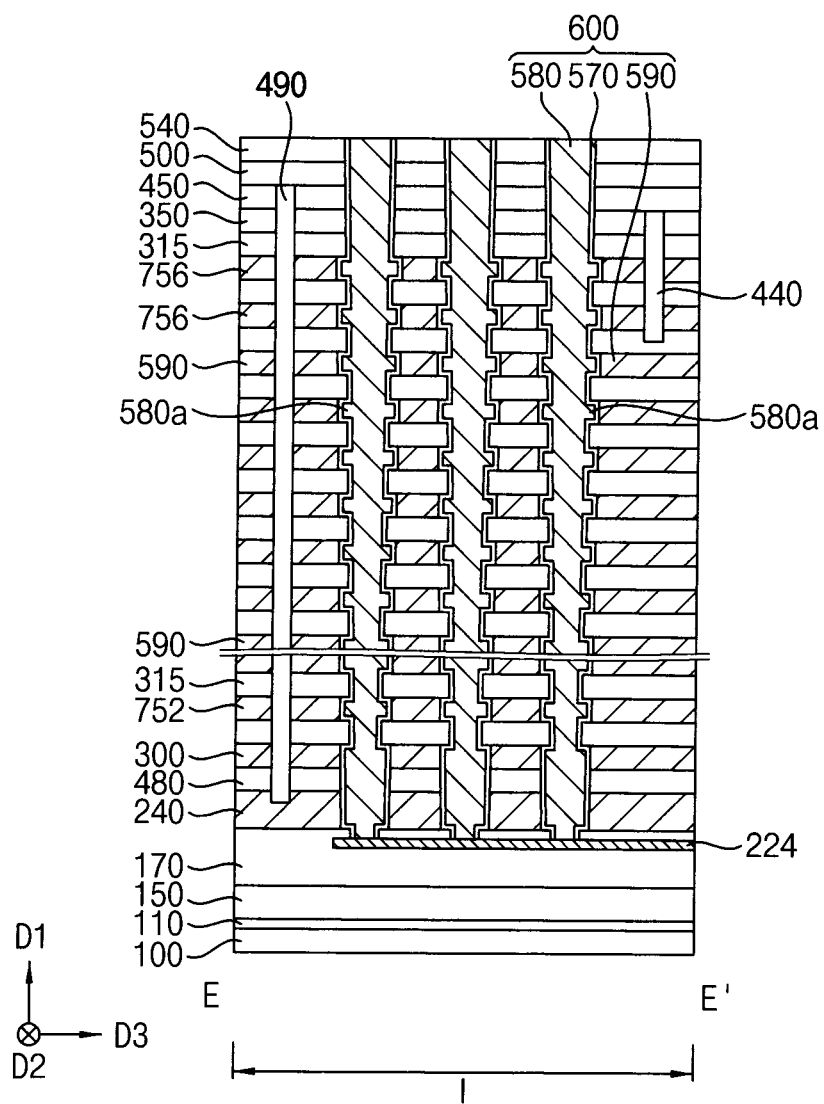

Referring to the exemplary embodiment of FIG. 36A, the first vertical gate electrode 580 may have a first protrusion portion 580a protruding from a sidewall of the first vertical gate electrode 580 that faces the first to third gate electrodes 752, 754 and 756 in the horizontal direction (e.g., in the third direction D3) towards the first to third gate electrodes 752, 754 and 756. Therefore, the sidewall of the first vertical gate electrode 580 may have an uneven surface in which the first protrusion portion 580a protrudes towards the first to third gate electrodes 752, 754 and 756 but the first vertical gate electrode 580 does not protrude towards the first insulation patterns 315.

As illustrated with respect to the exemplary embodiments of FIGS. 15 to 17, after forming the hole for the first vertical gate electrode 580, for example, a wet etching process may be further performed to remove portions of the first to third gate electrodes 752, 754 and 756 exposed by the hole. Portions of the support layer 300, the channel connection pattern 480 and the CSP 240, which may include doped polysilicon, exposed by the hole may be also removed.

The fifth insulation pattern 570 may be formed on a sidewall of the hole, and the first vertical gate electrode 580 may be formed to fill a remaining portion of the hole, so that the first protrusion portions 580a protrude in the horizontal direction facing the second channels 590, respectively.

As each of the first vertical gate electrodes 580 includes the first protrusion portions 580a, the control of the first vertical gate electrode 580 on a portion of the second channel 590 between the first vertical gate electrodes 580 may be improved, and the on-off characteristics of the first switching transistor 600 may be improved.

Figure 36B:
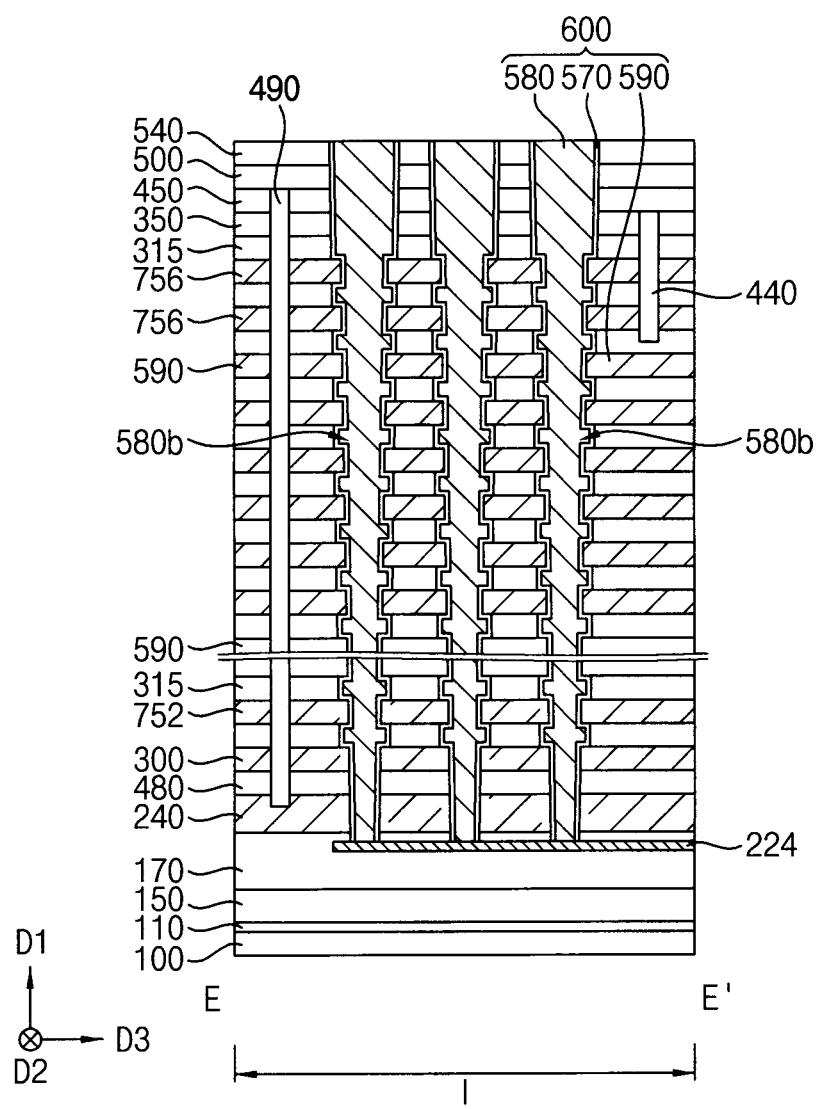

Alternatively, referring to the exemplary embodiment of FIG. 36B, each of the first vertical gate electrodes 580 may include second protrusion portions 580b protruding from a sidewall of the first vertical gate electrode 580 that faces the first insulation patterns 315 in the horizontal direction (e.g., in the third direction D3) towards the first insulation patterns 315, respectively. Therefore, the sidewall of the first vertical gate electrode 580 may have an uneven surface in which the second protrusion portions 580b protrude towards the first insulation patterns 315 but the first vertical gate electrode 580 does not protrude towards the first to third gate electrodes 752, 754 and 756.

The second protrusion portions 580b may be formed by forming the hole for the first vertical gate electrode 580, and for example, performing a wet etching process to partially remove portions of the first insulation patterns 315 exposed by the hole, and portions of the fourth to seventh insulating interlayers 350, 450, 500 and 540 exposed by the hole may be also removed.

Figure 37:
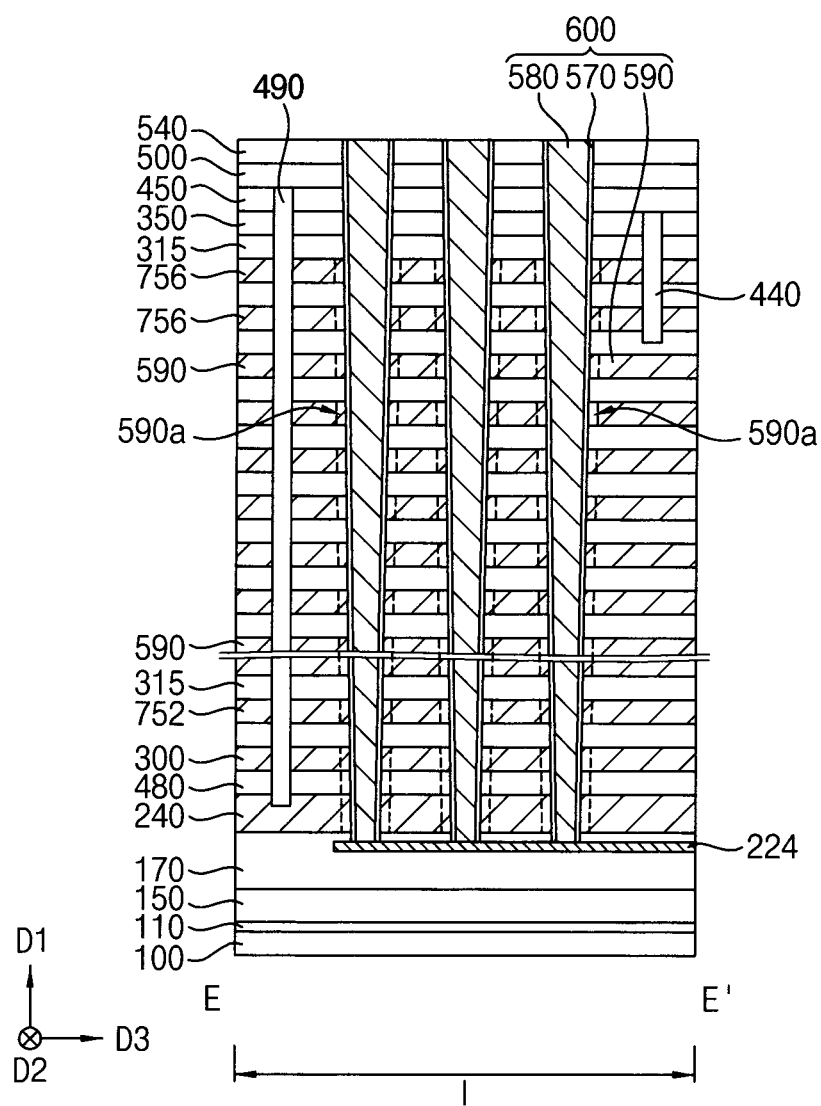

Referring to the exemplary embodiment of FIG. 37, a portion of the second channel 590 adjacent (e.g., in the third direction D3) to each of the first vertical gate electrodes 580 may have a low impurity doping portion 590a having a relatively low impurity doping concentration. Therefore, a portion of the second channel 590 proximate to each of the first vertical gate electrodes 580 may have an impurity doping concentration that is less than the impurity doping concentration of a portion of the second channel 590 distal to each of the first vertical gate electrodes 580.

As illustrated with respect to the exemplary embodiments of FIGS. 15 to 17, after forming the hole for the first vertical gate electrode 580, impurities having a conductivity type that is opposite to the conductivity type of the impurities doped into the first to third gate electrodes 752, 754 and 756 (e.g., p-type impurities) may be doped into portions of the first to third gate electrodes 752, 754 and 756 adjacent to the hole. Therefore, the low impurity doping portion 590a having an impurity doping concentration less than an impurity doping concentration of the n-type impurities of each of the first to third gate electrodes 752, 754 and 756 may be formed at the portion of the second channel 590 proximate to the first vertical gate electrode 580 (e.g., in the third direction D3).

As a result, a width of the depletion region of the portion of the second channel 590 proximate to the first vertical gate electrode 580 may increase, and the on-off characteristics of the first switching transistor 600 may be improved.

Figure 38A:
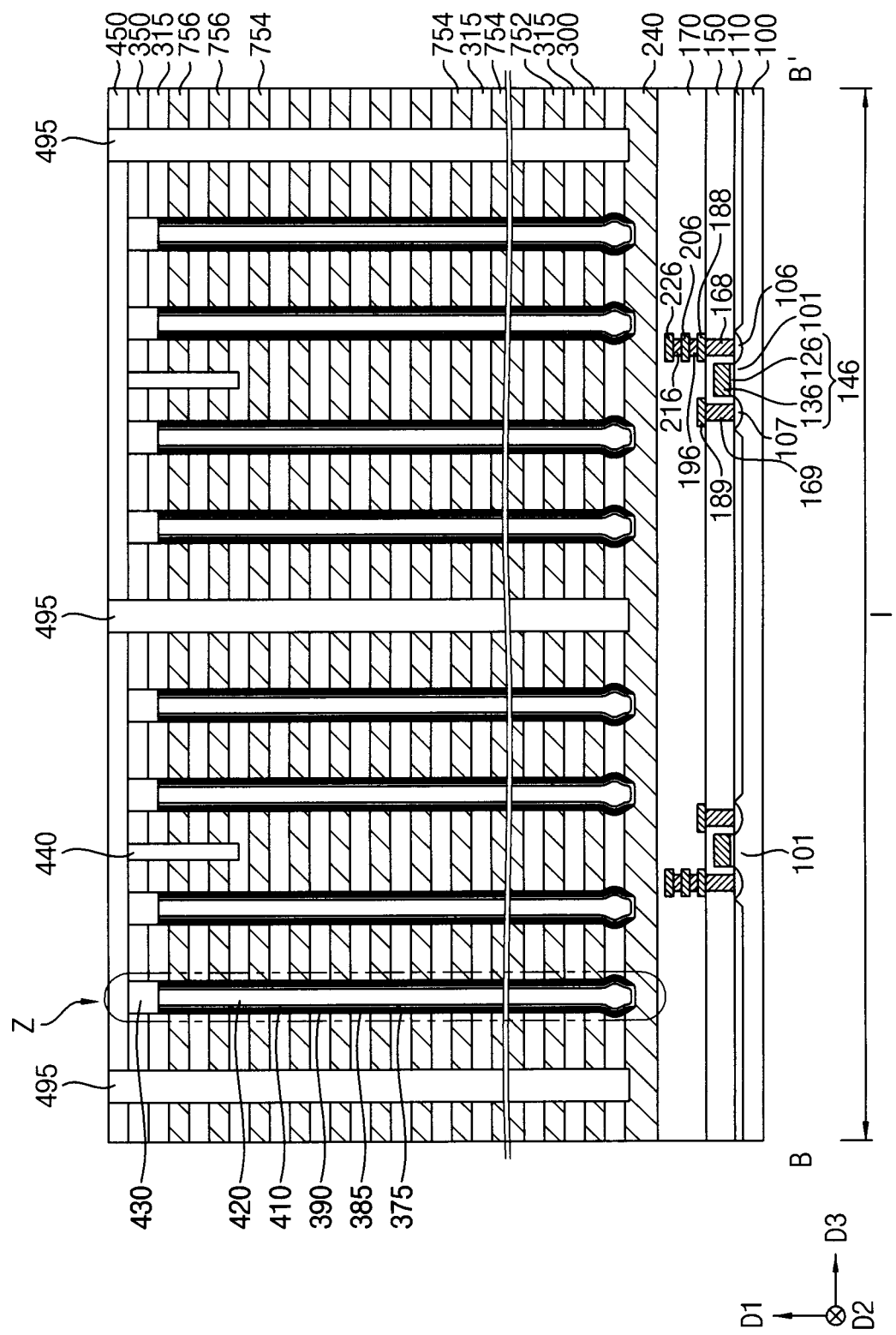
FIGS. 38A and 38B are cross-sectional views illustrating a vertical memory device in accordance with exemplary embodiments of the present inventive concepts.
Figure 38B:
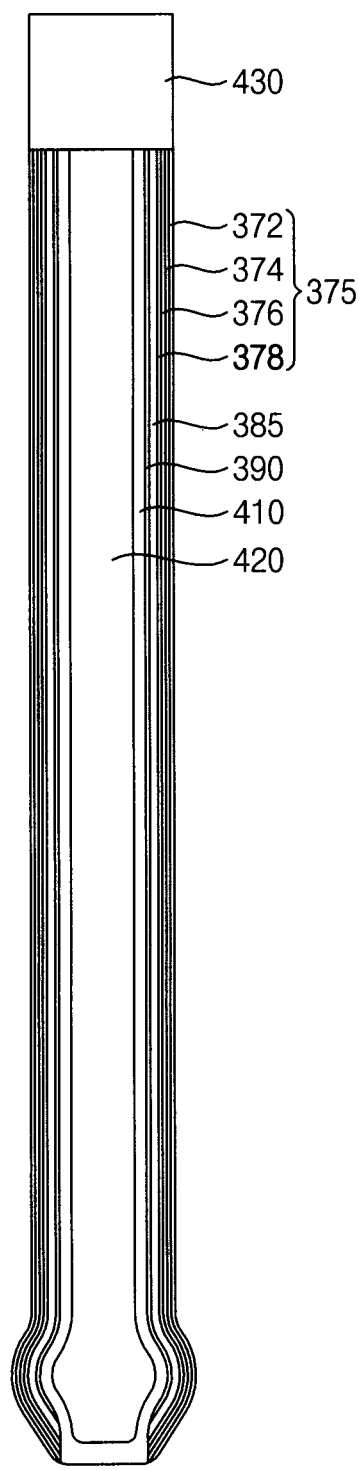

FIGS. 38A and 38B are cross-sectional views illustrating a vertical memory device in accordance with exemplary embodiments of the present inventive concepts. FIG. 38B is an enlarged cross-sectional view of a region Z of FIG. 38A.

Referring to the exemplary embodiments of FIGS. 38A and 38B, the charge storage structure and the channel in the channel hole may have a structure and/or shape different from those of the exemplary embodiments of FIGS. 7A and 7B.

For example, a gate insulation structure 375, a floating gate 385 and the tunnel insulation pattern 390 may be sequentially stacked in the horizontal direction on the sidewall of the channel hole between the vertical channel and each of the horizontal gate electrodes. Each of the gate insulation structure 375, the floating gate 385 and the tunnel insulation pattern 390 may have a cylindrical shape. Additionally, the first channel 410 having a cup-like shape may be formed on an inner sidewall of the tunnel insulation pattern 390, and an inner space formed by an inner wall of the first channel 410 may be filled with the filling pattern 420.

In an exemplary embodiment, the gate insulation structure 375 may include a first nitride layer 372, a first oxide layer 374, a second nitride layer 376 and a second oxide layer 378 sequentially stacked from the sidewall of the channel hole. However, exemplary embodiments of the present inventive concepts are not limited thereto and the gate insulation structure 375 may include any number of an oxide layer and a nitride layer alternately stacked. The floating gate 385 may include, doped polysilicon, etc. The first channel 410 may directly contact an upper surface of the CSP 240 to be electrically connected thereto. Therefore, the channel connection pattern 480 and the support layer 300 may not be formed on the CSP 240.

An insulation spacer may be further formed between the CSP 240 and the first gate electrode 752.

Figure 41:
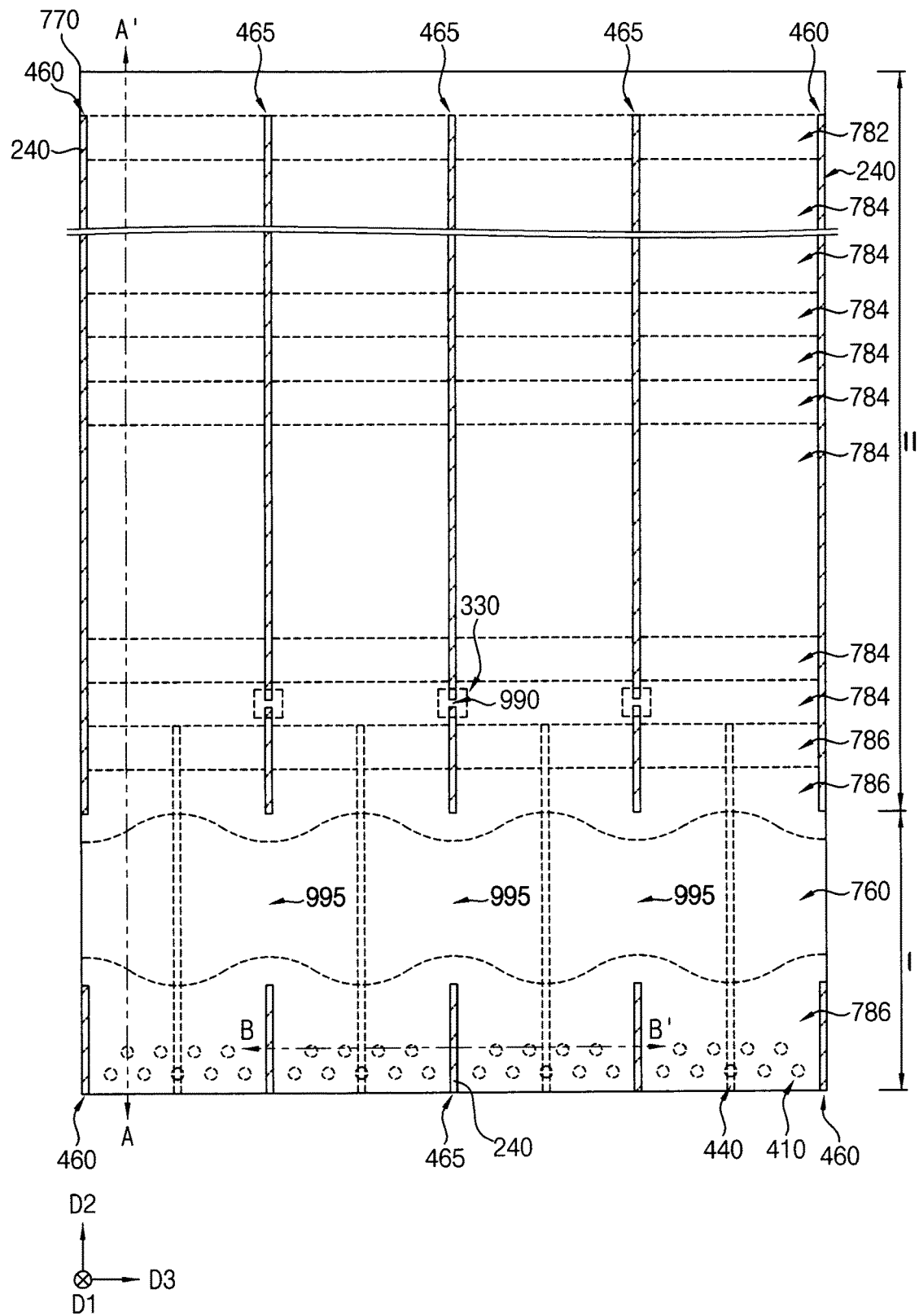
Figure 42:
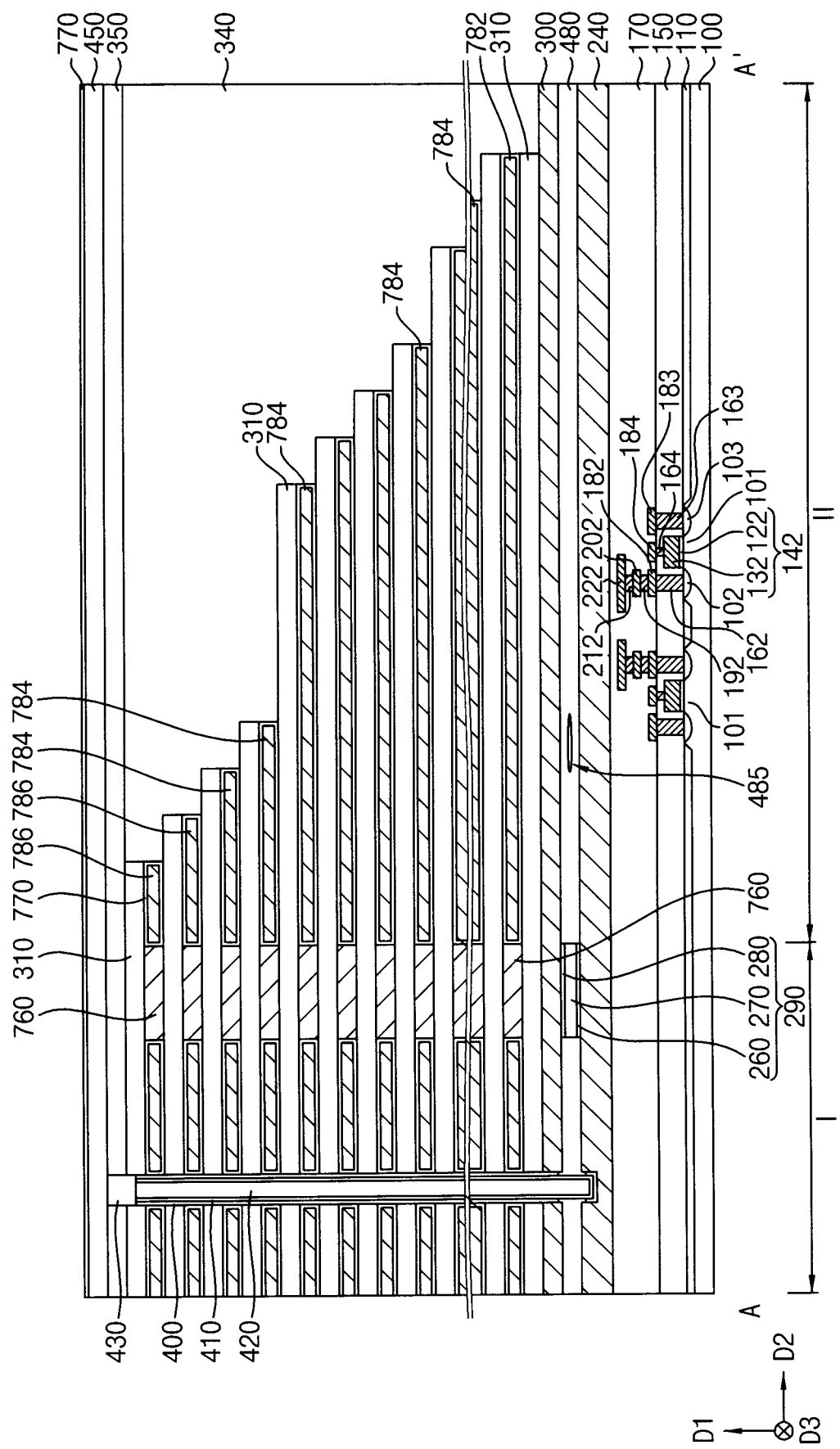
Figure 43:
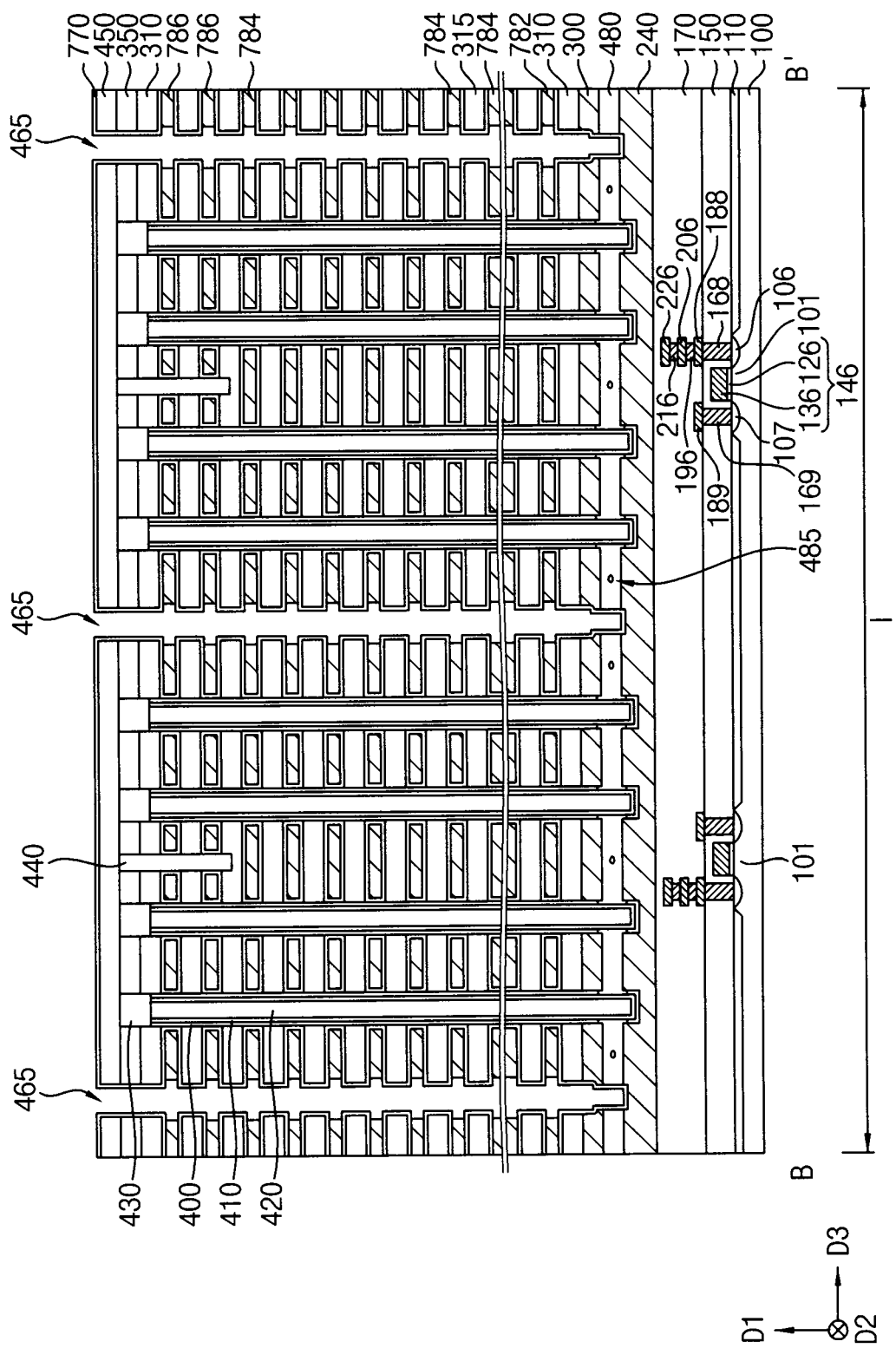
Figure 45:
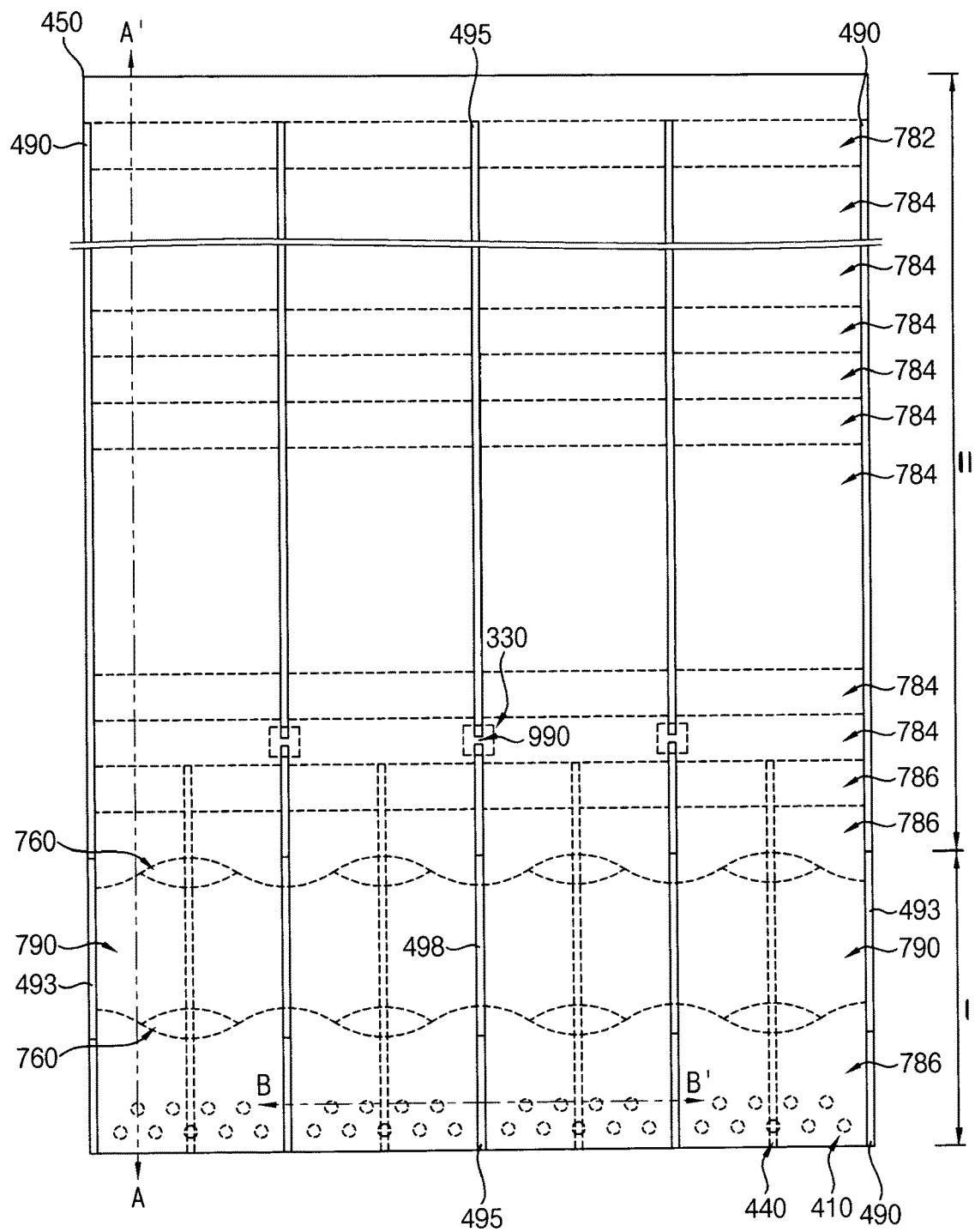
Figure 46:
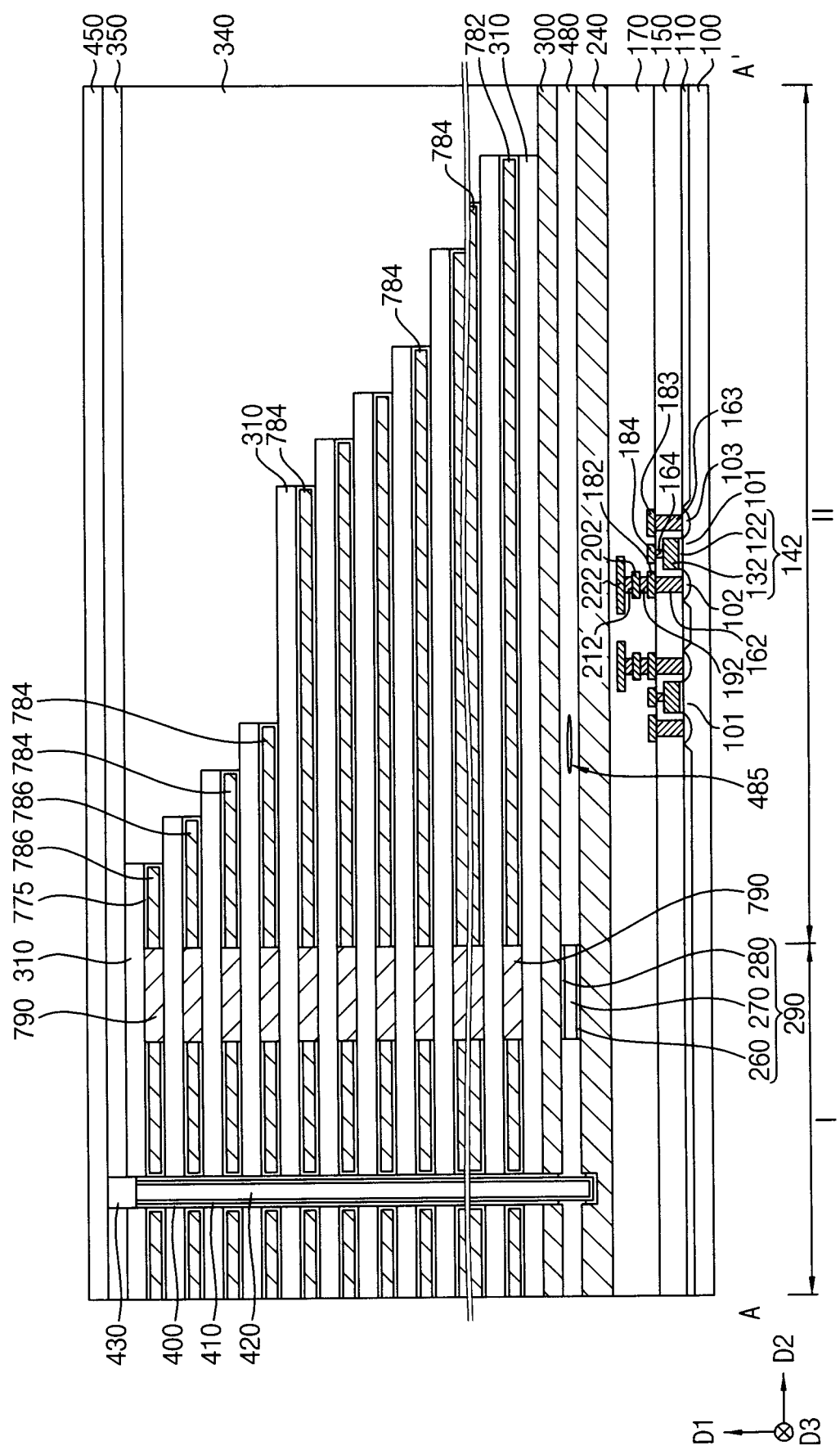
Figure 47:
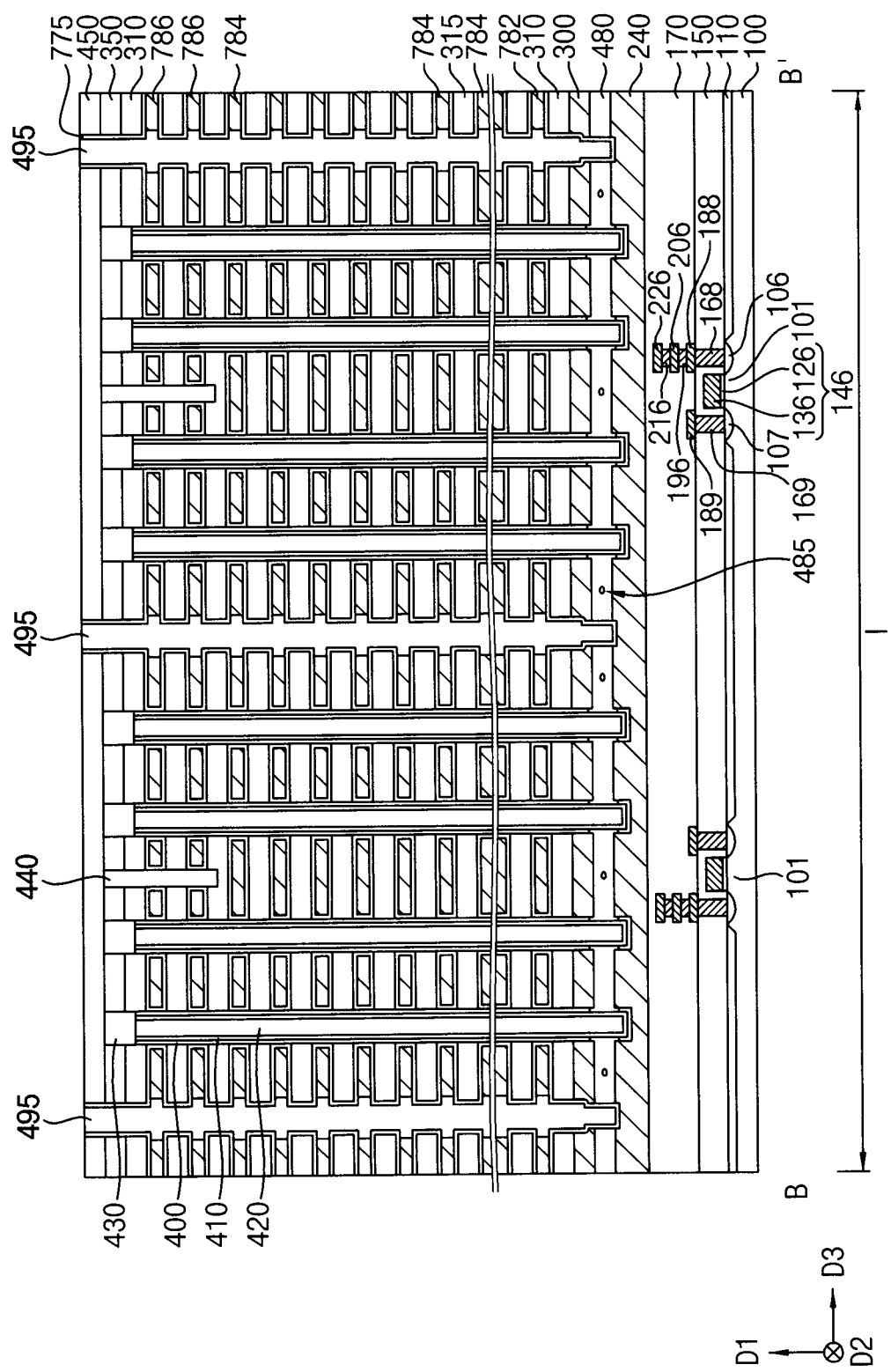

FIGS. 39 to 49 are plan views and cross-sectional views illustrating a method of manufacturing a vertical memory device in accordance with exemplary embodiments of the present inventive concepts. FIGS. 40-41, 44-45 and 48 are the plan views, and FIGS. 39, 42-43, 46-47 and 49 are cross-sectional views. FIGS. 39, 42, 46 and 49 are cross-sectional views taken along lines A-A' of corresponding plan views, respectively, and FIGS. 43 and 47 are cross-sectional views taken along lines B-B' of corresponding plan views, respectively.

This method may include processes substantially the same as or similar to the exemplary embodiments of FIGS. 1 to 23, and thus repeated descriptions thereon are omitted herein for convenience of explanation.

Figure 39:
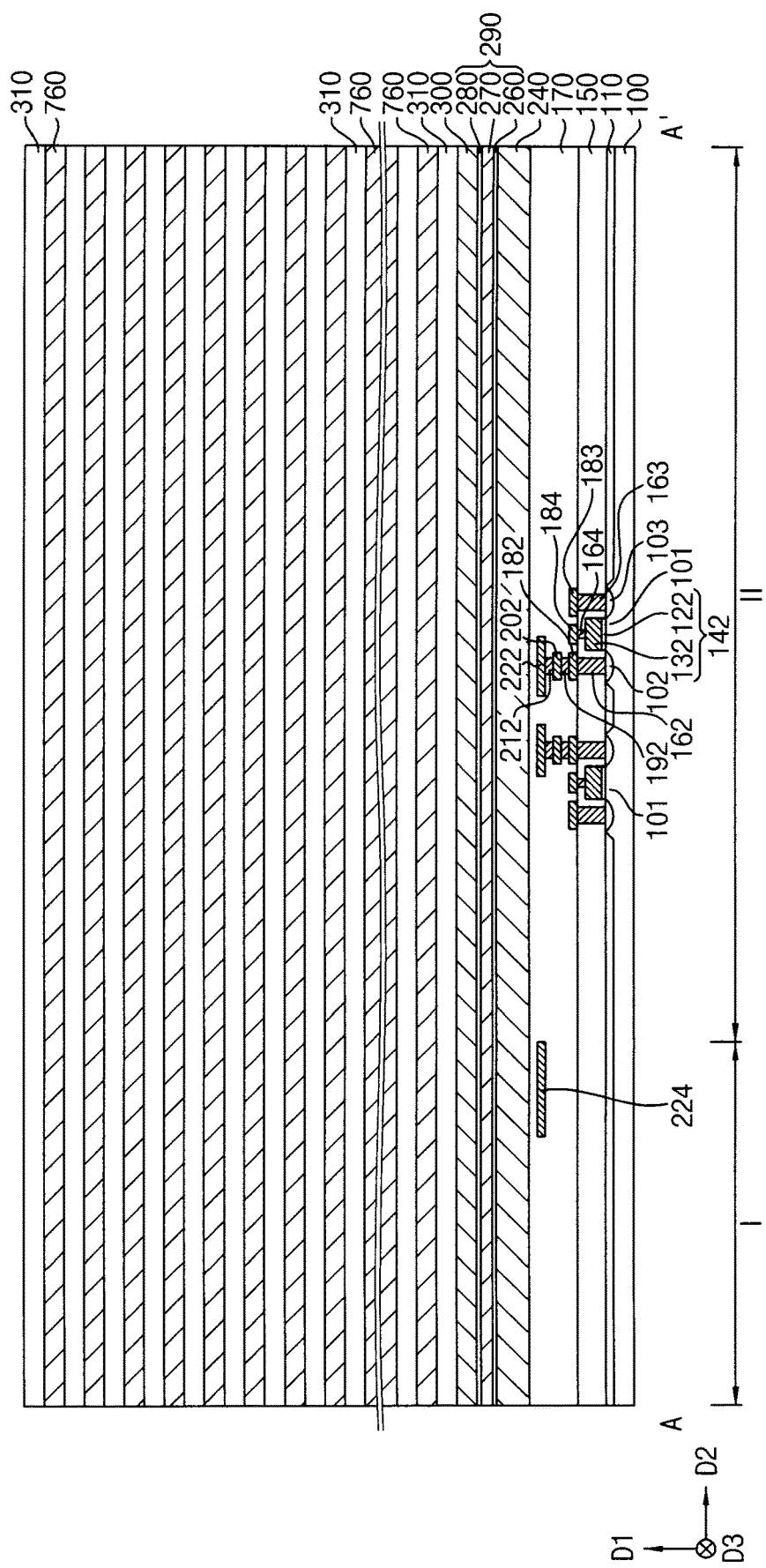
FIGS. 39 to 49 are plan views and cross-sectional views illustrating a method of manufacturing a vertical memory device in accordance with exemplary embodiments of the present inventive concepts.

Referring to the exemplary embodiment of FIG. 39, processes similar to those shown in FIGS. 1 to 4 may be performed. However, a fourth sacrificial layer 760, instead of the first gate electrode layer 320, may be formed on the support layer 300 and may be alternately and repeatedly stacked with the first insulation layer 310 in the first direction D1. In an exemplary embodiment, the fourth sacrificial layer 760 may include a material having an etching selectivity with respect to the first insulation layer 310. For example, the fourth sacrificial layer 760 may be a nitride such as silicon nitride.

Figure 40:
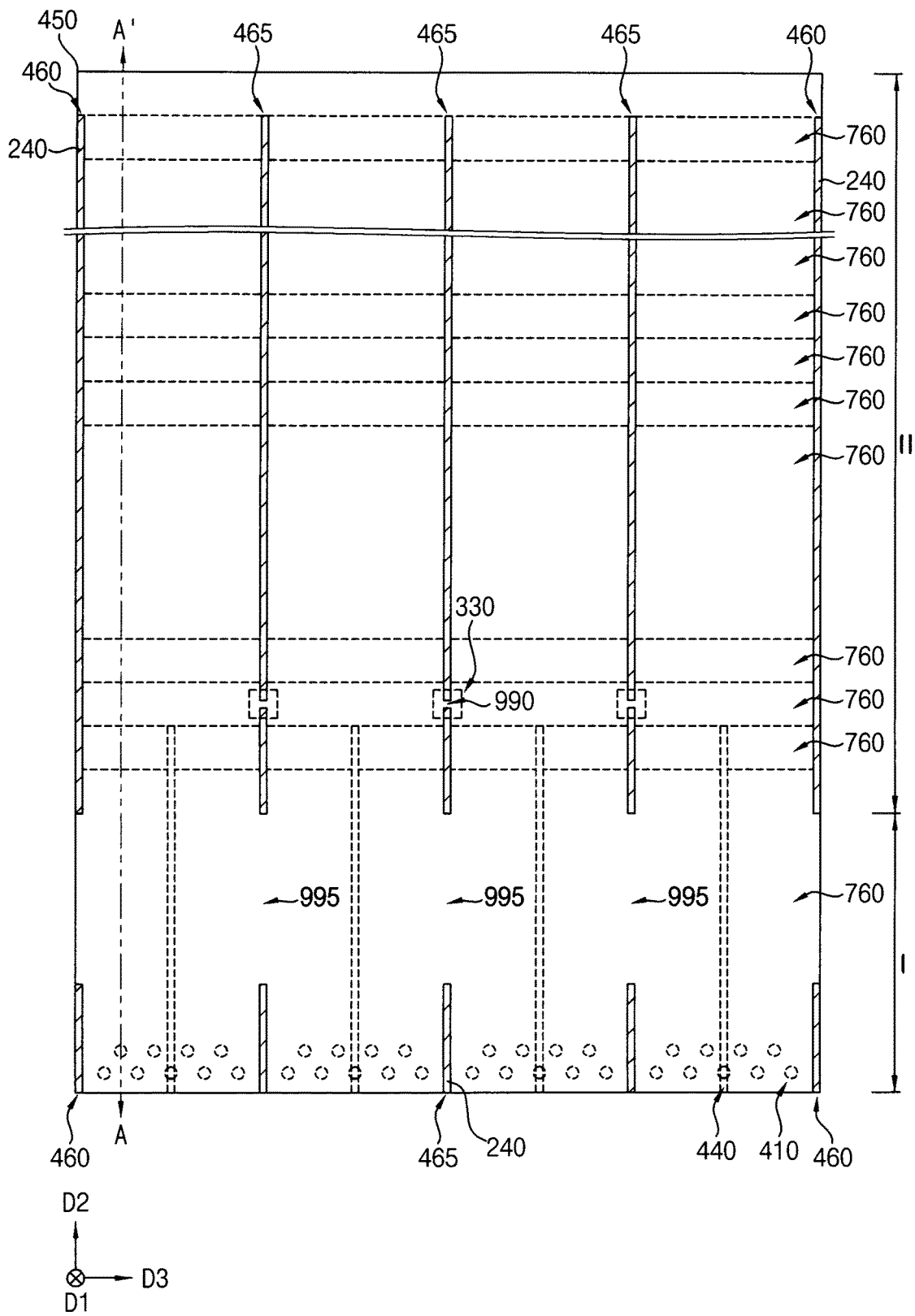

Referring to the exemplary embodiment of FIG. 40, processes similar to the exemplary embodiments of FIGS. 5 to 11 may be performed. However, each of the second and third openings 460 and 465 may be partially discontinuous on a portion of the first region I of the substrate 100 adjacent to the second region II of the substrate 100, and a second connecting portion 995 may be formed in the mold.

Therefore, each of the first insulation layer 310 and the fourth sacrificial layer 760 may not be entirely divided in the third direction D3 by each of the second and third openings 460 and 465. Additionally, a portion of the sacrificial layer structure 290 under the second connecting portion 995 of the mold may not be removed and may remain.

Referring to the exemplary embodiments of FIGS. 41 to 43, portions of the fourth sacrificial layers 760 exposed by the second and third openings 460 and 465 may be removed to form a second gap between the first insulation layers 310 at respective levels, and a portion of an outer sidewall of the charge storage structure 400 (e.g., an outer sidewall of the first blocking pattern 370) may be exposed by the second gap.

In an exemplary embodiment, the fourth sacrificial layers 760 may be removed by a wet etching process using phosphoric acid ($H_3PO_4$) or sulfuric acid ($H_2SO_4$). However, exemplary embodiments of the present inventive concepts are not limited thereto.

During the wet etching process, portions of the fourth sacrificial layers 760 adjacent to the second connecting portion 995 of the mold, such as an insulation structure, may not be removed and may remain.

A second blocking layer 770 may be formed on the exposed outer sidewall of the charge storage structure 400, inner walls of the second gaps, surfaces of the first insulation layers 310, an upper surface of the CSP 240 and an upper surface of the fifth insulating interlayer 450. A second gate electrode layer may be formed on the second blocking layer 770.

In an exemplary embodiment, the second blocking layer 770 may include a metal oxide, such as aluminum oxide, etc. The second gate electrode layer may include a gate barrier layer and a gate conductive layer sequentially stacked. In an exemplary embodiment, the gate barrier layer may include a metal nitride, and the gate conductive layer may include a metal.

The second gate electrode layer may be partially removed to form a gate electrode in each of the second gaps. In an exemplary embodiment, the second gate electrode layer may be partially removed by a wet etching process. However, exemplary embodiments of the present inventive concepts are not limited thereto.

In an exemplary embodiment, the gate electrode may extend in the second direction D2, and a plurality of gate electrodes may be stacked in the first direction D1 to be spaced apart from each other, and a gate electrode structure including the plurality of gate electrodes (e.g., horizontal gate electrodes) sequentially stacked in the first direction D1 may be formed. However, the gate electrode may be partially cut by the second connecting portion 995 of the mold.

The gate electrode structure may include first to third gate electrodes 782 sequentially stacked in the first direction D1. In an exemplary embodiment, the first gate electrode 782 may be formed at a lowermost level to provide a GSL, the third gate electrode 786 may be formed at an uppermost level and a second level from above to provide an SSL, and the second gate electrode 784 may be formed at a plurality of levels between the first and third gate electrodes 782 and 786 to provide word lines.

Figure 44:
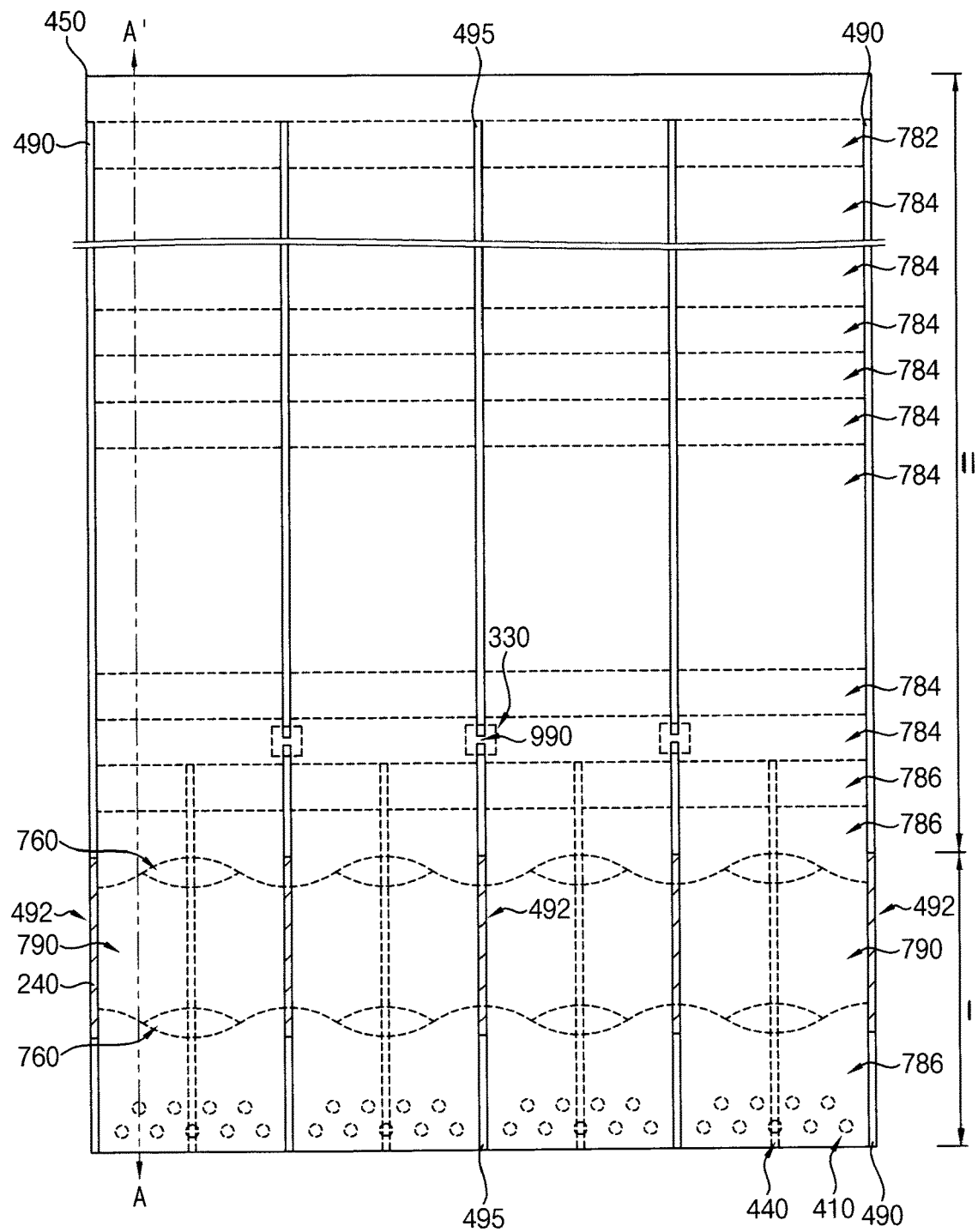

Referring to the exemplary embodiment of FIG. 44, a third division layer may be formed on the second blocking layer 770 to fill the second and third openings 460 and 465, and the third division layer and the second blocking layer 770 may be planarized until the upper surface of the fifth insulating interlayer 450 is exposed so that third and fourth division patterns 490 and 495 may be formed in the second and third openings 460 and 465, respectively, and the second blocking layer 770 may be transformed into a second blocking pattern 775 (refer to FIG. 46).

The fourth and fifth insulating interlayers 350 and 450, the mold, the support layer 300 and the channel connection pattern 480 may be etched using an etching mask that does not cover an area overlapping the second connecting portion 995 of the mold to form fourth and fifth openings 492 and 497. Portions of the fourth sacrificial layers 760 exposed by the fourth and fifth openings 492 and 497 may be removed to form a third gap between the first insulation layers 310 at respective levels. A fifth channel 790 may be formed to fill the third gap.

During the etching process, a portion of the second blocking pattern 775 exposed by the third gap may be also removed to expose sidewalls of the first to third gate electrodes 782, 784 and 786. Therefore, the fifth channel 790 filling the third gap may contact the sidewall of each of the first to third gate electrodes 782, 784 and 786.

In an exemplary embodiment, during the etching process, the fourth sacrificial layer 760 between the fourth and fifth openings 492 and 497 may partially remain or entirely removed.

In an exemplary embodiment, the fifth channel 790 may include polysilicon doped with n-type impurities. However, exemplary embodiments of the present inventive concepts are not limited thereto.

Referring to the exemplary embodiments of FIGS. 45 to 47, fifth and sixth division patterns 493 and 498 may be formed to fill the fourth and fifth openings 492 and 497, respectively.

In an exemplary embodiment, the fifth and sixth division patterns 493 and 498 may include an oxide, such as silicon oxide, etc. Therefore, the third and fifth division patterns 490 and 493 may be connected with each other to extend in the second direction D2, and the fourth and sixth division patterns 495 and 498 may be connected with each other to extend in the second direction D2 except for an area where the first connecting portion 990 of the mold is formed.

Figure 48:
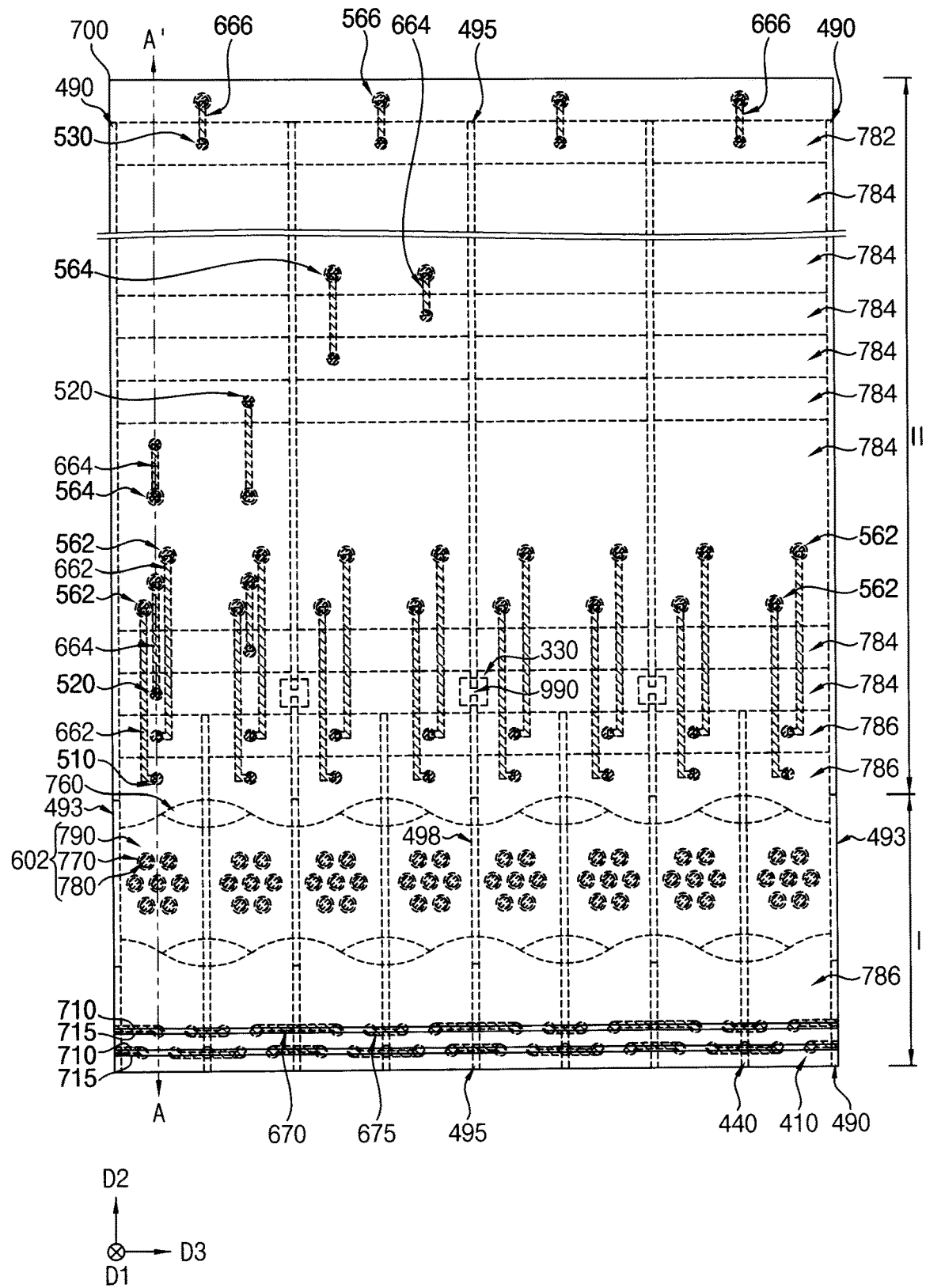
Figure 49:
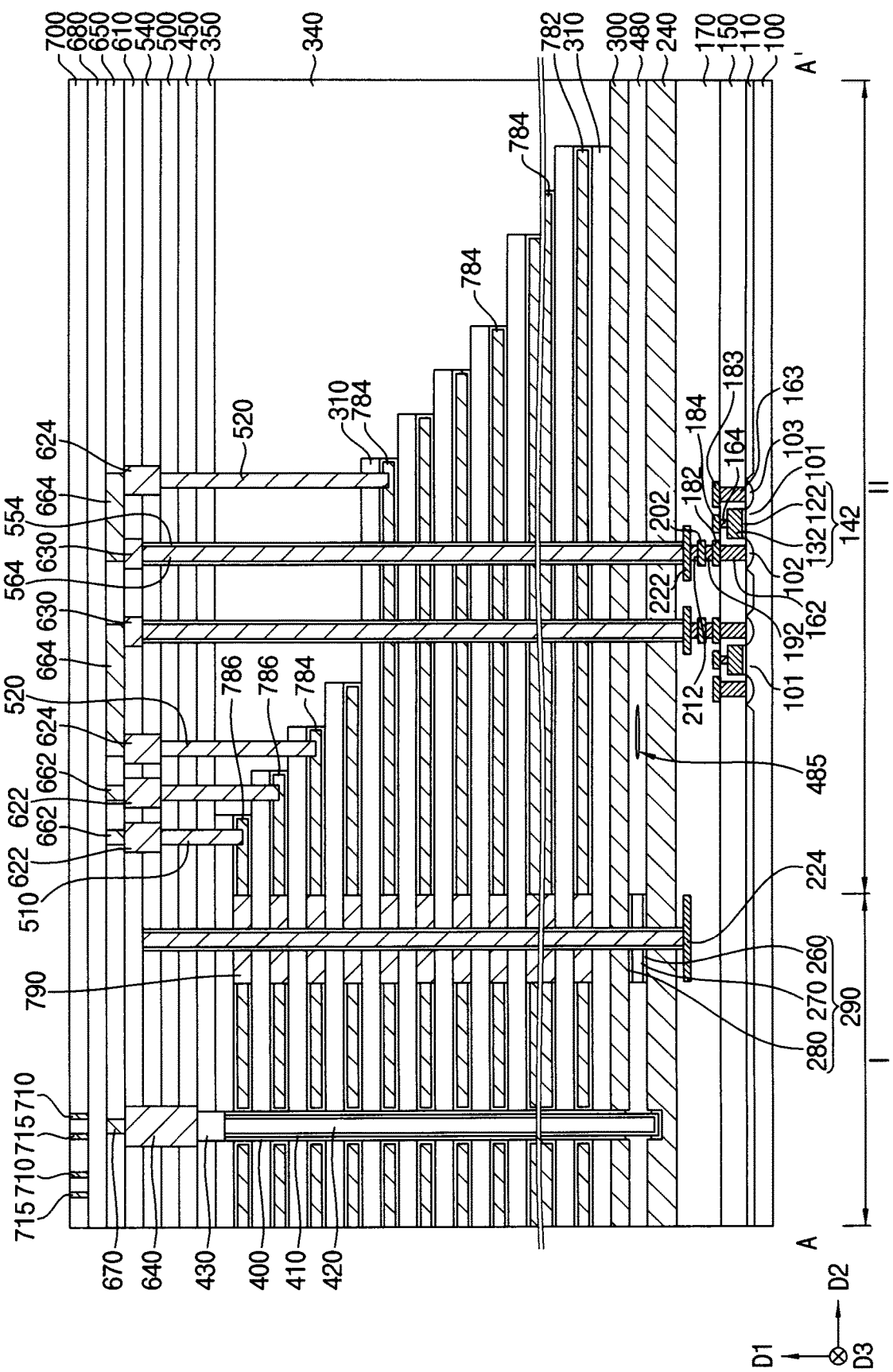

Referring to the exemplary embodiments of FIGS. 48 and 49, processes substantially the same as or similar to the processes shown in the exemplary embodiments of FIGS. 13 to 23 may be performed to complete the fabrication of the vertical memory device.

Unlike the processes of the exemplary embodiments of FIGS. 1 to 23, in the vertical memory device illustrated with reference to the exemplary embodiments of FIGS. 39 to 49, the first to third gate electrodes 782, 784, 786 may include a metal and the fifth channel 790 connected to the first to third gate electrodes 782, 784, 786 on a portion of the first region I of the substrate 100 adjacent to the second region II of the substrate 100 may include polysilicon doped with n-type impurities. Therefore, not only each of the first to third gate electrodes 782, 784 and 786 but also the fifth channel 790 connected thereto may serve as a horizontal gate electrode. The first to third gate electrodes 782, 784 and 786 and the adjacent fifth channel 790 may be referred to as a first portion and a second portion, respectively, of the horizontal gate electrode. The first portion and the second portion may directly contact each other and a blocking pattern is not disposed therebetween.

In an exemplary embodiment, in a plan view (e.g., in a plane defined by the second and third directions D2 and D3), each of the opposite lateral ends in the second direction D2 of the fifth channel 790 may have a curved line along the third direction D3. Each of the opposite lateral ends of the fifth channel 790 may be concave at an area adjacent to each of the fifth and sixth division patterns 493 and 498, and may be convex at an area adjacent to each of the second division pattern 440. Therefore, a width (e.g., length in the second direction D2) of a portion of the fifth channel 790 adjacent to each of the fifth and sixth division patterns 493 and 498 may be less than a width (e.g., length in the second direction D2) of a portion of the fifth channel 790 adjacent to the second division pattern 440. The fourth sacrificial layer 760 may remain at an area adjacent to the convex portion of the fifth channel 790. For example, the fourth sacrificial layer 760 including, silicon nitride, etc., may partially remain between the first and second portions of the horizontal gate electrode. Therefore, a nitride layer may be disposed between the first and second portions of the horizontal gate electrode.

Figure 50:
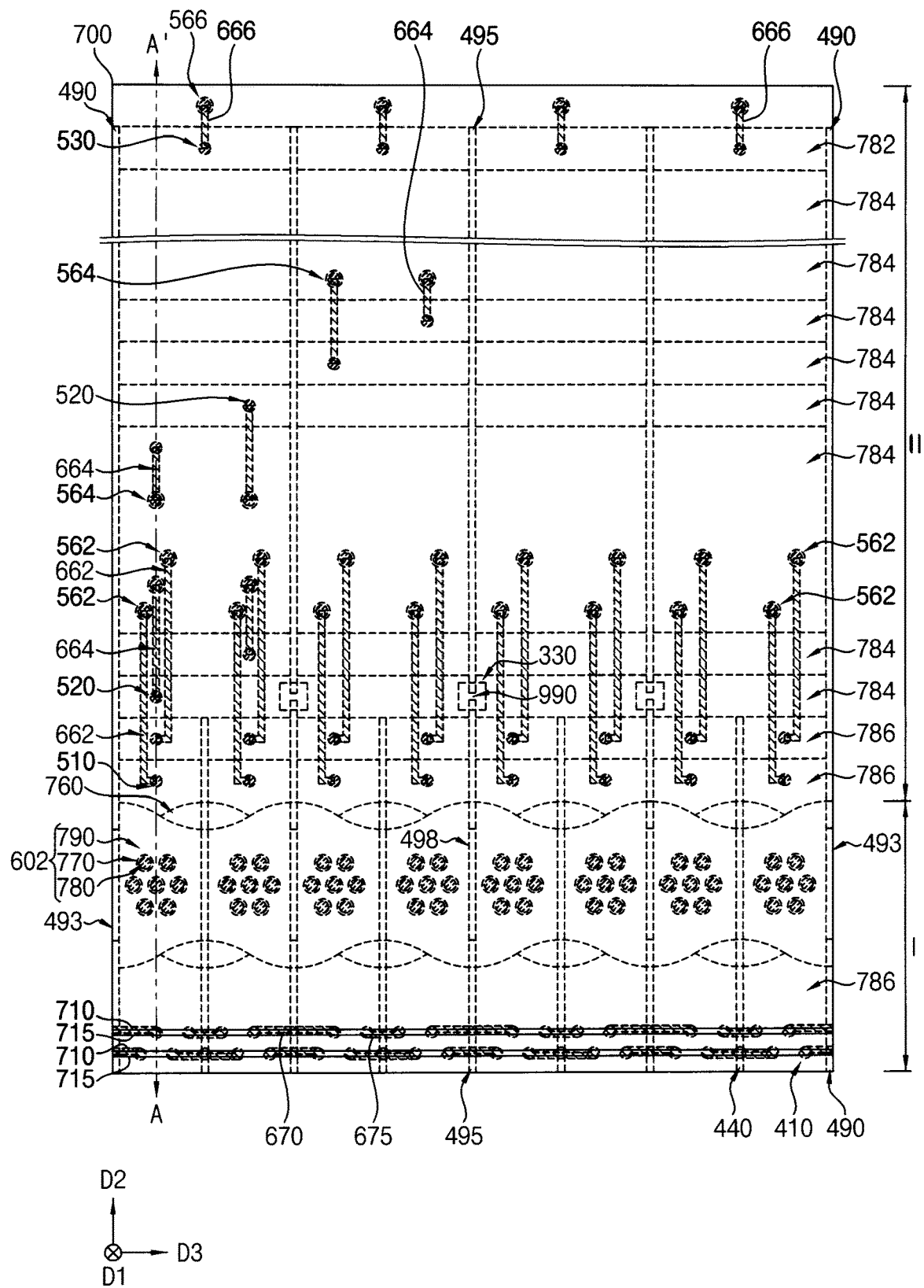
FIG. 50 is a plan view illustrating a vertical memory device in accordance with an exemplary embodiment of the present inventive concepts.

FIG. 50 is a plan view illustrating a vertical memory device in accordance with an exemplary embodiment of the present inventive concepts. This vertical memory device may be similar to the vertical memory device of the exemplary embodiments of FIGS. 39 to 49, and thus repeated descriptions are omitted herein for convenience of explanation.

Referring to the exemplary embodiment of FIG. 50, in a plan view (e.g., in a plane defined by the second and third directions D2 and D3), each of opposite lateral ends in the second direction D2 of the fifth channel 790 may be convex at an area adjacent to each of the fifth and sixth division patterns 493 and 498, and may be concave at an area adjacent to each of the second division pattern 440. Therefore, a width (e.g., length in the second direction D2) of a portion of the fifth channel 790 adjacent to each of the fifth and sixth division patterns 493 and 498 may be greater than a width in the second direction D2 of a portion of the fifth channel 790 adjacent to the second division pattern 440. The fourth sacrificial layer 760 may remain at an area adjacent to the concave portion of the fifth channel 790.

In an exemplary embodiment, the vertical memory device may be implemented by forming the fourth and fifth openings 492 and 497, removing portions of the fourth sacrificial layer 760 exposed by the fourth and fifth openings 492 and 497 to form the fifth channel 790, forming the second and third openings 460 and 465, and removing portions of the fourth sacrificial layer 760 exposed by the second and third openings 460 and 465 to form the first to third gate electrodes 782, 784 and 786.

Figure 52:
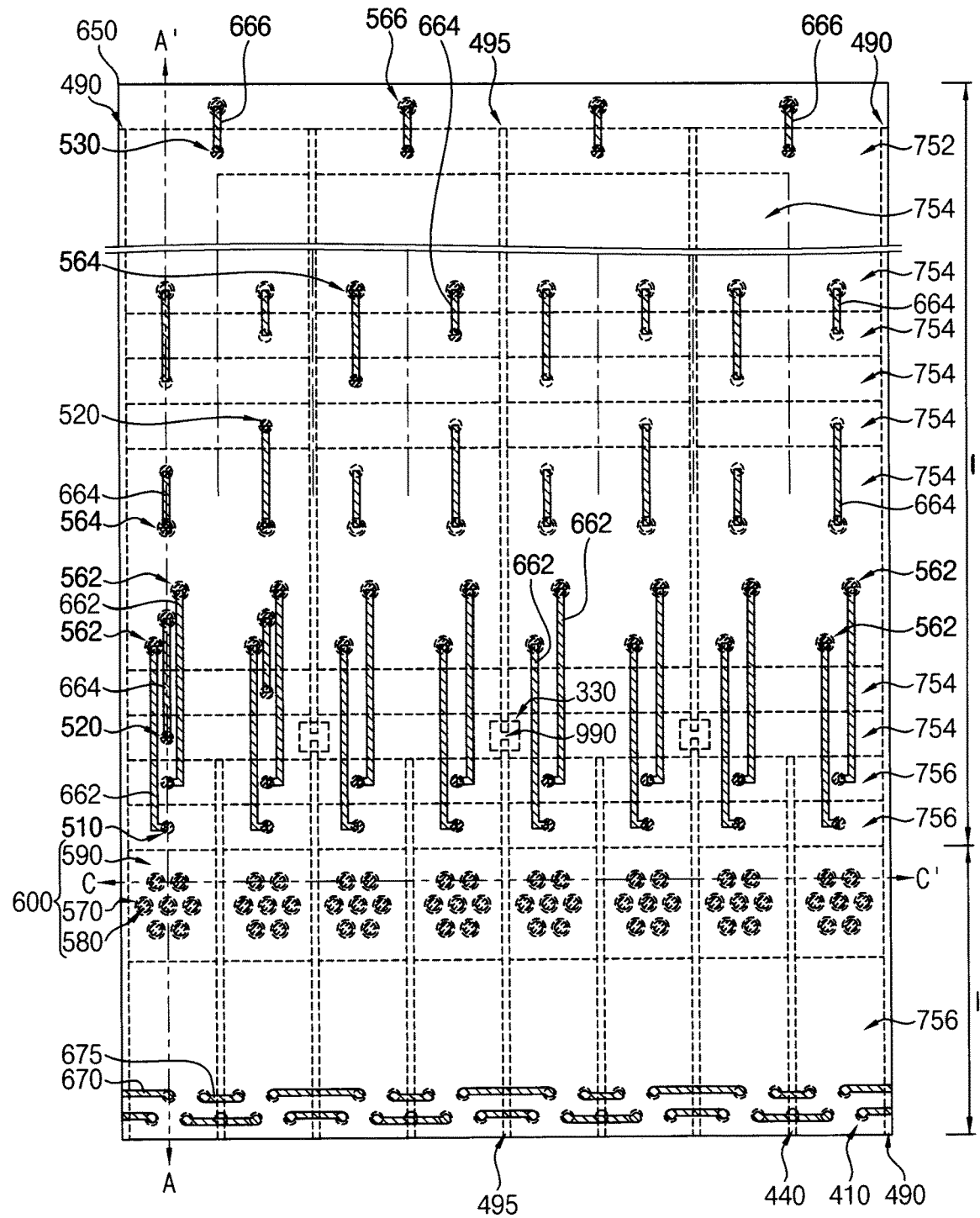
FIGS. 52 to 54 are a plan view and cross-sectional views illustrating a vertical memory device in accordance with exemplary embodiments of the present inventive concepts.
Figure 53:
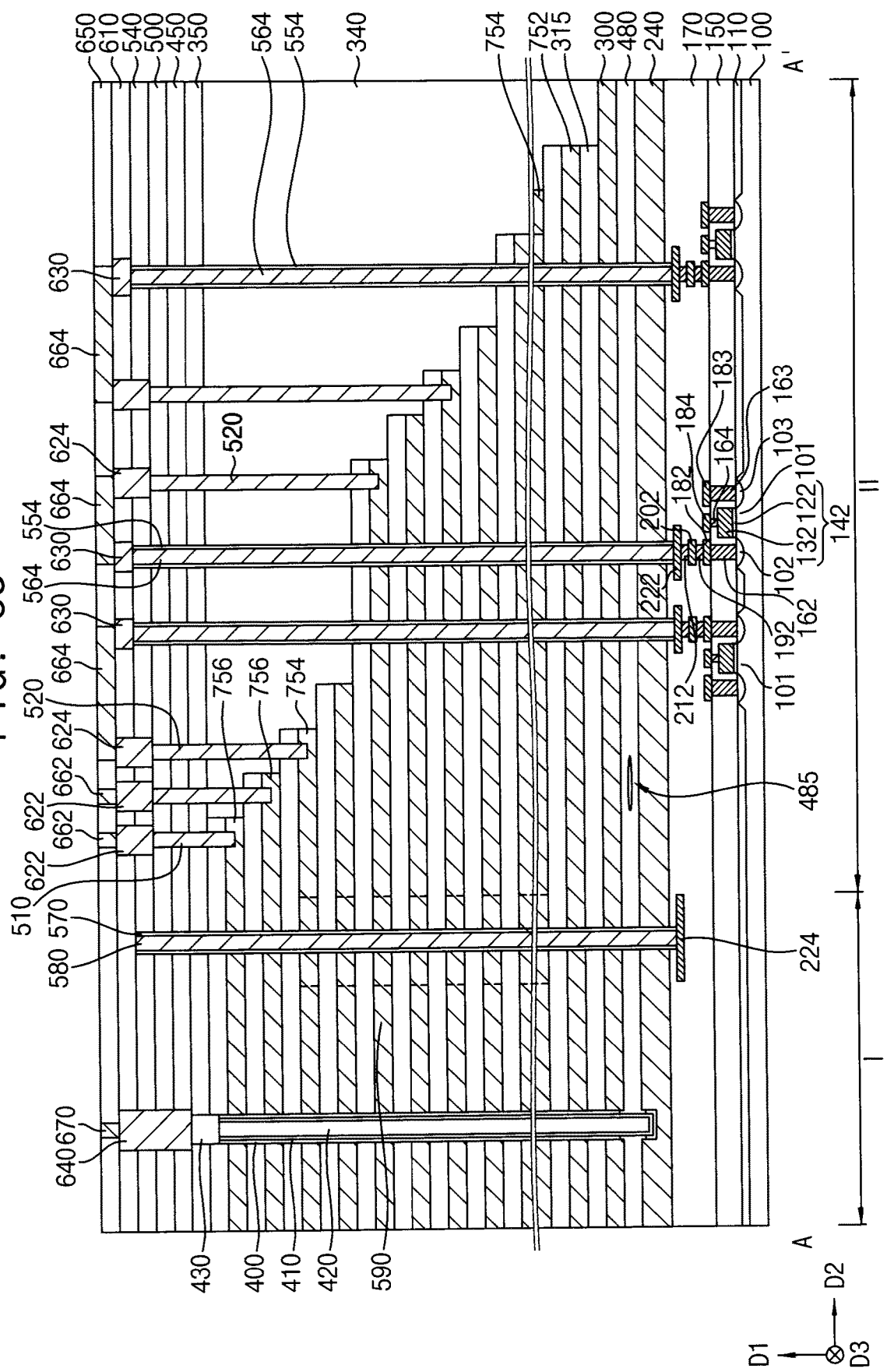
Figure 54:
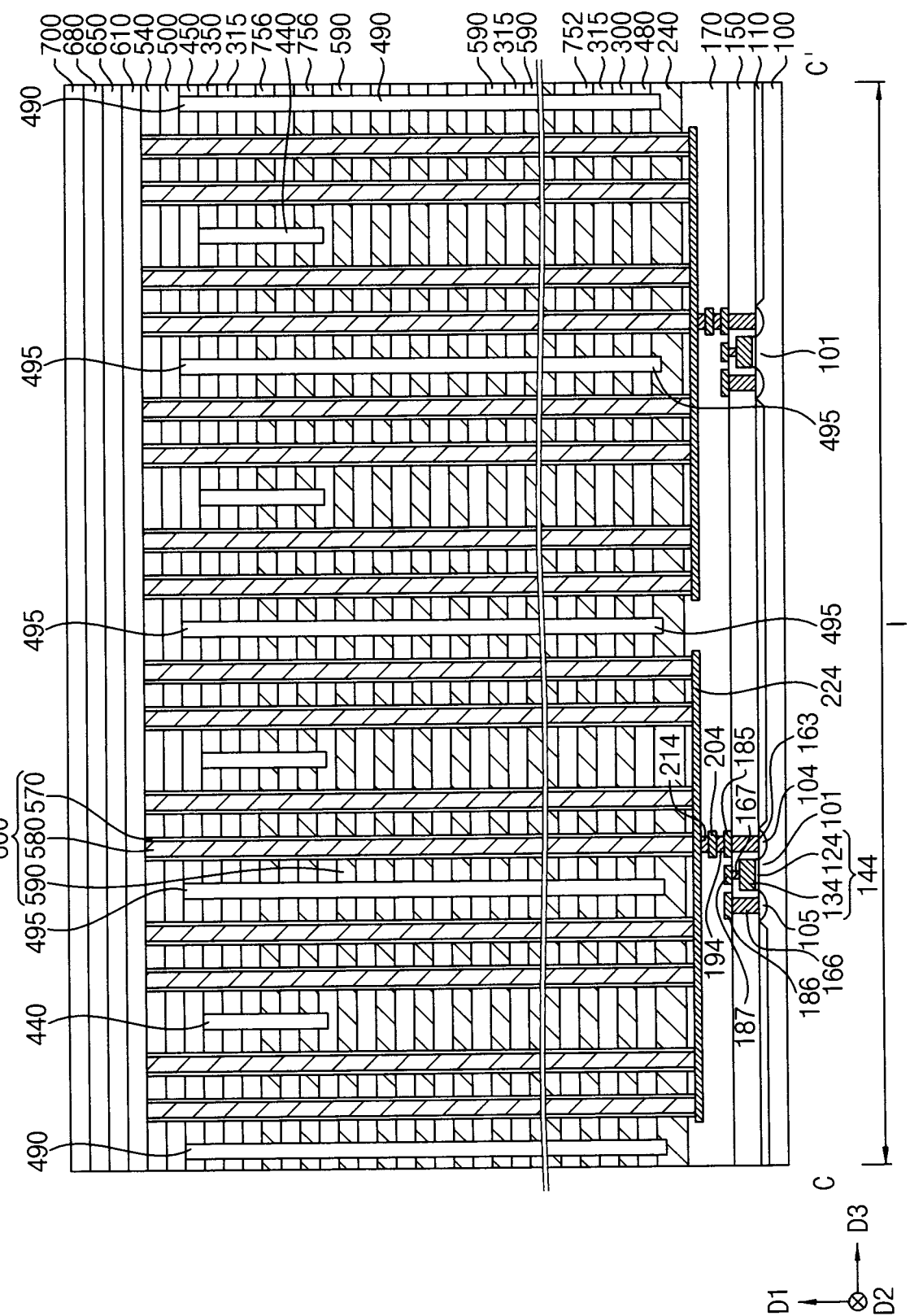

FIG. 51 is a perspective view illustrating a mold in accordance with an exemplary embodiment of the present inventive concepts, and FIGS. 52 to 54 are a plan view and cross-sectional views illustrating a vertical memory device in accordance with exemplary embodiments of the present inventive concepts. FIG. 52 is the plan view, FIG. 53 is a cross-sectional view taken along a line A-A' of FIG. 52, and FIG. 54 is a cross-sectional view taken along a line C-C' of FIG. 52. FIGS. 51 to 54 are illustrations of a region W of FIG. 1.

For convenience of illustration, FIG. 51 does not show the first insulation layer 310, and shows only gate electrode patterns formed by patterning the first gate electrode layer 320. In FIG. 52, boundaries of the steps disposed in the second direction D2 are shown with a dotted line, while boundaries of the steps disposed in the third direction D3 are shown with an alternating long and short dash line.

Referring to the exemplary embodiment of FIG. 51, first to fifth gate electrode patterns 322, 324, 326, 328 and 329 may be formed on the second region II of the substrate 100, which may form a mold together with the first gate electrode layers 320 remaining on the first region I of the substrate 100.

The first gate electrode patterns 322 may be formed at upper levels, respectively, of the mold, and may be stacked in a staircase shape in which lengths of step layers in the second direction D2 may gradually increase from an uppermost level top toward a lowermost level. In the exemplary embodiment of FIG. 51, four first gate electrode patterns 322 are formed at the upper levels. However, exemplary embodiments of the present inventive concepts are not limited thereto.

The second gate electrode patterns 324 may be formed at lower levels, respectively, of the mold, and may be stacked in a staircase shape in which lengths of step layers in each of the second and third directions D2 and D3 may gradually increase from an uppermost level top toward a lowermost level. In the exemplary embodiment of FIG. 51, four second gate electrode patterns 324 are formed at the lower levels. However, exemplary embodiments of the present inventive concepts are not limited thereto.

The third gate electrode patterns 326 may be formed at a plurality of levels, respectively, under the first gate electrode patterns 322 and above the second gate electrode patterns 324 (e.g., in the first direction D1), and a predetermined number of third gate electrode patterns 326 having the same length in the second direction D2 and being stacked in the first direction D1 may form a third gate electrode pattern group. The third gate electrode pattern groups may be stacked in a staircase shape in which lengths of step layers in the second direction D2 may gradually increase from an uppermost level top toward a lowermost level. In an exemplary embodiment, lengths in the second direction D2 of end portions of the third gate electrode pattern groups, respectively, that are not covered by upper third gate electrode pattern groups, such as steps of the respective third gate electrode pattern groups, may be constant. However, steps of some of the third gate electrode pattern groups may have lengths in the second direction D2 that are greater than that of steps of others of the third gate electrode pattern groups.

The fourth gate electrode patterns 328 may be formed at a plurality of levels, respectively, on an uppermost one of the third gate electrode patterns 326 to be spaced apart from the first gate electrode patterns 322 in the second direction D2. The fourth gate electrode patterns 328 may be stacked in a staircase shape in which lengths of step layers in each of the second and third directions D2 and D3 may gradually increase from an uppermost level top toward a lowermost level. The step layers of the fourth gate electrode patterns 328 may extend in the second direction D2 towards the step layers of the first gate electrode patterns 322. Therefore, the lower steps of the fourth gate electrode patterns 328 may be spaced apart the shortest distance from the first gate electrode patterns 322 than the other step layers of the fourth gate electrode patterns 328.

The fifth gate electrode patterns 329 may be formed at upper levels, respectively, on an uppermost one of each third gate electrode pattern group, and may be stacked in a staircase shape in which lengths of step layers in the third direction D3 may gradually increase from an uppermost level top toward a lowermost level.

In a plan view (e.g., in a plane defined in the first and second directions D1 and D2), opposite lateral ends in the third direction D3 of each of the fifth gate electrode patterns 329 may be aligned in the second direction D2 with opposite lateral ends in the third direction D3 of each of the second and fourth gate electrode patterns 324 and 328.

Referring to the exemplary embodiments of FIGS. 52 to 54, a gate electrode structure of the vertical memory device may have a staircase shape shown in the exemplary embodiment of FIG. 51.

For example, the third gate electrodes 756 may be formed at the upper two levels among the first gate electrode patterns 322, the second gate electrodes 754 may be formed at other lower levels of the first gate electrode patterns 322, the third and fifth gate electrode patterns 326 and 329, and the upper three levels among the second gate electrode patterns 324. The first gate electrode 752 may be formed at a lowermost level among the second gate electrode patterns 324. However, exemplary embodiments of the present inventive concepts are not limited thereto.

The third division pattern 490 may be formed at each of opposite lateral ends in the third direction D3 of the region W in the exemplary embodiment of FIG. 51 to extend in the second direction D2. The fourth division pattern 495 may extend in the second direction D2 through a central portion in the third direction D3 of the fourth gate electrode patterns 328. Additionally, the fourth division pattern 495 may extend in the second direction D2 through each of the opposite lateral ends in the third direction D3 of a step at a second highest level of each of the second, fourth and fifth gate electrode patterns 324, 328 and 329. However, the fourth division pattern 495 may be cut at an area where the first connecting portion 990 of the mold is formed.

The exemplary embodiment of FIG. 52 shows two memory blocks disposed in the third direction D3 share word lines at each level through the first connecting portion 990 of the mold to form a shared memory block. However, pads of the word lines except for the upper two word lines in each memory block are disposed from a boundary between the two memory blocks in the third direction D3 to form a staircase shape including four steps. The staircase shapes of the respective memory blocks are symmetrical with respect to the boundary therebetween.

Accordingly, four word line pads disposed in the third direction D3 in each of the two memory blocks may be shared by the shared memory block including the two memory blocks, which may include four word line pads, and correspondingly, four upper circuit patterns and four first transistors may be formed. The first switching transistor 600 and two second transistors may be formed on the first region I of the substrate 100 and the two portions of the shared word line at each level may be operated independently.

Each of the second transistors may be electrically connected to all of the first switching transistors 600 in each memory block to serve as a memory block selection transistor. As a result, eight word lines may be operated independently through the word line pads disposed in the third direction D3 in the shared memory block.

Hereinafter, through comparative embodiment, the decrease of the area by the reduction of the number of the first transistor and the increase of the area by the addition of the second transistor will be particularly explained.

Figure 55:
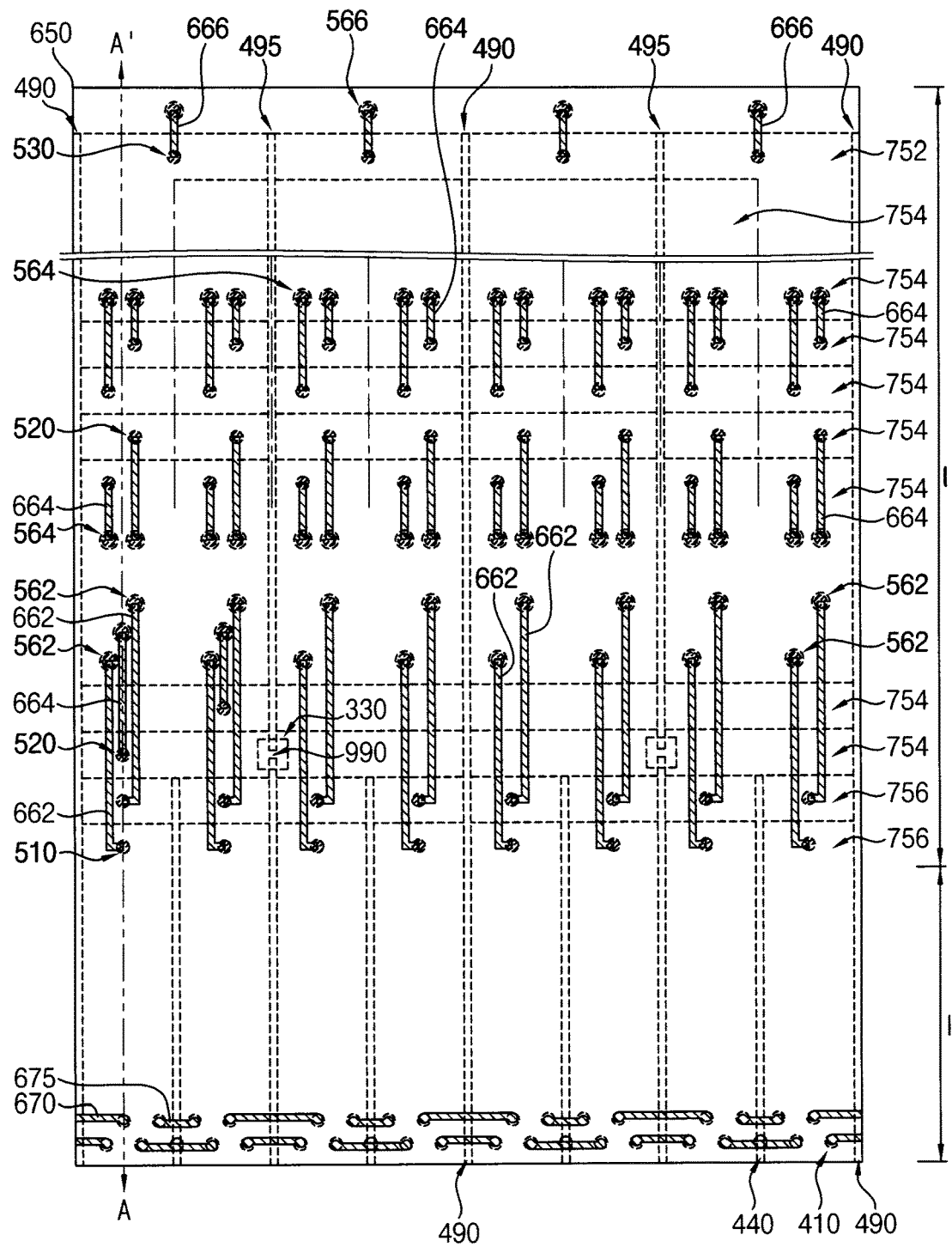
FIG. 55 is a plan view illustrating a vertical memory device in accordance with comparative embodiment, which may correspond to FIG. 52.

FIG. 55 is a plan view illustrating a vertical memory device in accordance with comparative embodiment, which may correspond to FIG. 52.

Referring to FIG. 55, in the vertical memory device in accordance with comparative embodiment, the third division pattern 490 may be formed between the memory blocks, and the word lines of the memory blocks may not be shared.

Accordingly, eight upper circuit patterns may be formed in correspondence with the eight word line pads disposed in the third direction D3, and eight first transistors may be electrically connected thereto. However, the second transistor may not be formed.

If each memory block includes 100 word line pads except for upper two levels, 100 upper circuit patterns may be formed, and 100 first transistors serving as pass transistors, respectively, may be formed thereunder. Therefore, 200 first transistors may be formed on the second region II of the substrate 100 in the two memory blocks.

In the vertical memory device illustrated with reference to the exemplary embodiments of FIGS. 52 to 54, in the two memory blocks, 100 first transistors may be formed on the second region II of the substrate 100 and two second transistors may be formed on the first region I of the substrate 100. Therefore, the total number of transistors needed in the two memory blocks is 102. Accordingly, the vertical memory device in accordance with exemplary embodiments may provide a same function as the vertical memory device in accordance with comparative embodiment, but with a significantly less number of transistors and an improved integration degree.

Further, a length in the third direction D3 of each step shown in the exemplary embodiments of FIGS. 52 to 54 may be twice the length in the third direction D3 of each step shown in the comparative embodiment of FIG. 55. Therefore, the vertical memory device shown in the exemplary embodiments of FIGS. 52 to 54 provide an increased freedom of layout of the upper circuit patterns.

Figure 56:
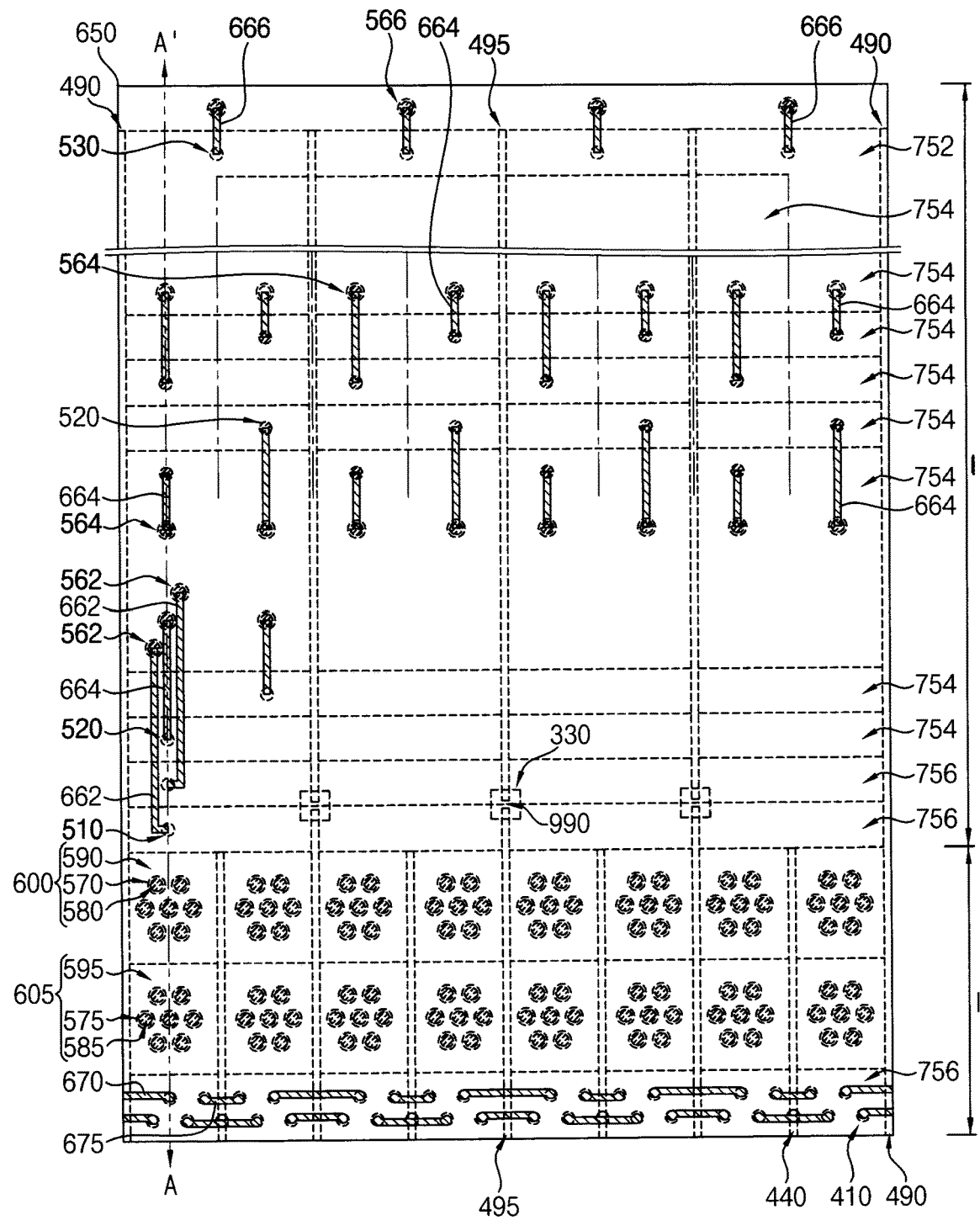
FIGS. 56 and 57 are plan views illustrating vertical memory devices in accordance with exemplary embodiments of the present inventive concepts.
Figure 57:
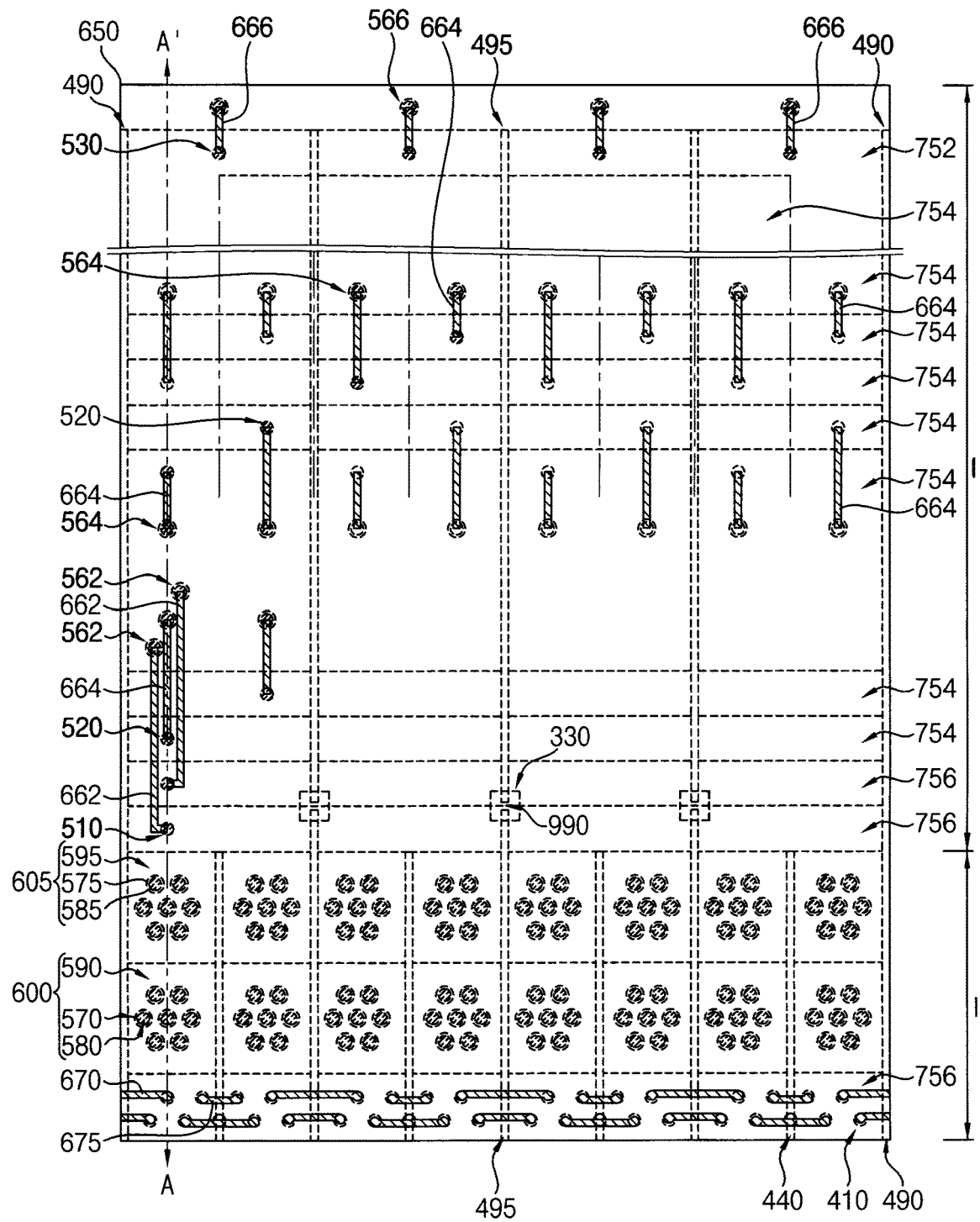

FIGS. 56 and 57 are plan views illustrating vertical memory devices in accordance with exemplary embodiments of the present inventive concepts.

These vertical memory devices may be implemented by adding the second switching transistors 605 illustrated with reference to the exemplary embodiments of FIGS. 27 to 30 to the vertical memory device illustrated with reference to the exemplary embodiments of FIGS. 52 to 54.

As described above, although the present inventive concepts have been described with reference to exemplary embodiments, those skilled in the art will readily appreciate that many modifications are possible in the exemplary embodiments without materially departing from the novel teachings and advantages of the present inventive concepts.

What is claimed is:

1. A vertical memory device, comprising:
    first horizontal gate electrodes disposed on a substrate and spaced apart from each other in a first direction that is substantially perpendicular to an upper surface of the substrate, wherein each of the first horizontal gate electrodes extends in a second direction that is substantially parallel to the upper surface of the substrate;
    a vertical channel extending through the first horizontal gate electrodes in the first direction;

a charge storage structure disposed between the vertical channel and each of the first horizontal gate electrodes;

a first vertical gate electrode extending through the first horizontal gate electrodes in the first direction, the first vertical gate electrode is electrically insulated from the first horizontal gate electrodes; and a first horizontal channel disposed at a portion of each of the first horizontal gate electrodes adjacent, in a horizontal direction substantially parallel to the upper surface of the substrate, to a sidewall of the first vertical gate electrode.

2. The vertical memory device of claim 1, wherein the first horizontal gate electrodes and the first horizontal channel include polysilicon doped with impurities.

3. The vertical memory device of claim 2, wherein:
a width of the first vertical gate electrode varies along the first direction and includes a first portion having a relatively large width and a second portion having a relatively small width, and wherein an impurity doping concentration of the first horizontal gate electrodes at the same level as the first portion of the first vertical gate electrode is greater than an impurity doping concentration of the first horizontal gate electrodes at the same level as the second portion of the first vertical gate electrode.

4. The vertical memory device of claim 3, wherein:
the width of the first vertical gate electrode decreases from a top portion toward a bottom portion thereof; and
impurity doping concentrations of the first horizontal gate electrodes decreases from an uppermost level toward a lowermost level.

5. The vertical memory device of claim 2, wherein a portion of each of the first horizontal gate electrodes where the first horizontal channel is formed has an impurity doping concentration that is lower than an impurity doping concentration of remaining portions of the first horizontal gate electrodes where the first horizontal channel is not formed.

6. The vertical memory device of claim 2, wherein a portion of the first horizontal channel that is proximate to the first horizontal gate electrodes has an impurity doping concentration that is lower than a portion of the first horizontal channel that is distal to the first horizontal gate electrodes.

7. The vertical memory device of claim 1, wherein:
the first vertical gate electrode has a protrusion portion on a sidewall that faces the first horizontal channel; and
the protrusion portion protrudes from the sidewall towards the first horizontal channel in a horizontal direction that is substantially parallel to the upper surface of the substrate.

8. The vertical memory device of claim 1, wherein the vertical memory device includes a plurality of the first vertical gate electrodes, the plurality of the first vertical gate electrodes are spaced apart from each other in a horizontal direction that is substantially parallel to the upper surface of the substrate.

9. The vertical memory device of claim 8, wherein:
in a plan view defined in the second direction and a third direction that is substantially parallel to the upper surface of the substrate and is substantially perpendicular to the second direction, each of the first vertical gate electrodes has a bar shape extending in the third direction, wherein the first vertical gate electrodes are arranged in a zigzag pattern along the second direction.

10. The vertical memory device of claim 1, further comprising:

a gate insulation pattern disposed between the first vertical gate electrode and the first horizontal channel, the gate insulation pattern covering a sidewall of the first vertical gate electrode, wherein the first vertical gate electrode, the gate insulation pattern and the first horizontal channel form a switching transistor that is configured to control electrical signals applied to the first horizontal gate electrodes.

11. The vertical memory device of claim 1, wherein:
the substrate includes a first region and a second region at least partially surrounding the first region;
the first horizontal gate electrodes are formed on the first and second regions of the substrate;
lateral end portions in the second direction of the first horizontal gate electrodes, respectively, form pads of the first horizontal gate electrodes, wherein the pads of the first horizontal gate electrodes are stacked in a staircase shape on the second region of the substrate;
the vertical channel is disposed on the first region of the substrate; and
the first vertical gate electrode and the first horizontal channel are disposed on a portion of the first region adjacent to the second region of the substrate in the second direction.

12. The vertical memory device of claim 11, further comprising:
first contact plugs disposed on the pads of the first horizontal gate electrodes, respectively, the first contact plugs are electrically connected to the respective pads of the first horizontal gate electrodes;
through vias extending through the first horizontal gate electrodes in the first direction and are electrically insulated therefrom, wherein the through vias are formed at positions corresponding to the first contact plugs, respectively, on the second region of the substrate; and
first pass transistors disposed on the second region of the substrate, the first pass transistors are electrically connected to the through vias, respectively.

13. The vertical memory device of claim 12, further comprising:
a common source plate (CSP) disposed on the substrate,
wherein the first horizontal gate electrodes and the vertical channel are disposed on the CSP, and the first vertical gate electrode and the through vias extend through the CSP in the first direction and are electrically insulated therefrom, and
wherein the first pass transistors are disposed under the through vias.

14. The vertical memory device of claim 13, further comprising:
a second pass transistor disposed under the first vertical gate electrode on the first region of the substrate, the second pass transistor is electrically connected to the first vertical gate electrode.

15. The vertical memory device of claim 14, wherein:
the vertical memory device includes a channel array comprising a plurality of the vertical channels arranged in the second direction and a third direction that is substantially parallel to the upper surface of the substrate and substantially perpendicular to the second direction;
the channel array includes a plurality of channel blocks arranged in the third direction, each of the plurality of channel blocks including vertical channels of the plurality of vertical channels; and a plurality of memory blocks is defined to correspond with the plurality of channel blocks, respectively, each of the plurality of memory blocks including the vertical channels of the plurality of vertical channels included in each of the plurality of channel blocks, a plurality of charge storage structures on sidewalls thereof, and first horizontal gate electrodes surrounding the vertical channels of the plurality of vertical channels included in each of the plurality of channel blocks, wherein each memory block of the plurality of memory blocks is configured to perform an erase operation of the vertical memory device, and wherein each of the plurality of memory blocks includes one second pass transistor.

* * * * *